US008247325B2

(12) United States Patent
Sun

(10) Patent No.: US 8,247,325 B2
(45) Date of Patent: Aug. 21, 2012

(54) DIRECT GROWTH OF METAL NANOPLATES ON SEMICONDUCTOR SUBSTRATES

(75) Inventor: Yugang Sun, Naperville, IL (US)

(73) Assignee: Uchicago Argonne, LLC, Chicago, IL (US)

( * ) Notice: Subject to any disclaimer, the term of this patent is extended or adjusted under 35 U.S.C. 154(b) by 163 days.

(21) Appl. No.: 12/574,552

(22) Filed: Oct. 6, 2009

(65) Prior Publication Data
US 2010/0090345 A1 Apr. 15, 2010

Related U.S. Application Data

(60) Provisional application No. 61/104,591, filed on Oct. 10, 2008.

(51) Int. Cl.
*H01L 21/44* (2006.01)
(52) U.S. Cl. .................. 438/686; 257/E21.002
(58) Field of Classification Search .................. 438/686; 257/E21.002
See application file for complete search history.

(56) References Cited

U.S. PATENT DOCUMENTS

| 7,776,760 | B2* | 8/2010 | Taylor ........................... 438/758 |
| 2005/0029678 | A1* | 2/2005 | Hanrath et al. ............... 257/784 |
| 2005/0056118 | A1 | 3/2005 | Xia et al. |
| 2005/0157445 | A1* | 7/2005 | Bradley et al. ................ 361/226 |
| 2006/0141268 | A1* | 6/2006 | Kalkan et al. ................. 428/446 |
| 2006/0273328 | A1* | 12/2006 | Niu et al. ........................ 257/79 |
| 2006/0286785 | A1 | 12/2006 | Rogers et al. |
| 2007/0032089 | A1 | 2/2007 | Nuzzo et al. |
| 2007/0141114 | A1* | 6/2007 | Muisener et al. ............. 424/427 |
| 2007/0289409 | A1* | 12/2007 | Xia et al. ........................ 75/370 |
| 2008/0081388 | A1* | 4/2008 | Yasseri et al. .................. 438/22 |
| 2008/0191317 | A1* | 8/2008 | Cohen et al. .................. 257/618 |
| 2008/0204048 | A1* | 8/2008 | Stasiak et al. ................. 324/679 |
| 2008/0206555 | A1* | 8/2008 | Choi et al. ..................... 428/332 |
| 2008/0241512 | A1* | 10/2008 | Boris et al. .................... 428/328 |
| 2008/0248263 | A1* | 10/2008 | Kobrin ....................... 428/195.1 |
| 2009/0014062 | A1* | 1/2009 | Kayama et al. ............... 136/256 |
| 2009/0020431 | A1* | 1/2009 | Voccia et al. .................. 205/77 |
| 2009/0297388 | A1* | 12/2009 | Xia et al. ...................... 420/463 |

(Continued)

FOREIGN PATENT DOCUMENTS
WO WO 2005/122285 A2 12/2005
(Continued)

OTHER PUBLICATIONS

Sun et al., "Surfactantless Synthesis of Silver Nanoplates and Their Application in SERS", *Small*, Nov. 2007, pp. 1964-1975, vol. 3, No. 11, Wiley-VCH Verlag GmbH & co. KGaA, Weinheim.

(Continued)

*Primary Examiner* — Kiesha Bryant
*Assistant Examiner* — Igwe U Anya
(74) *Attorney, Agent, or Firm* — Foley & Lardner LLP

(57) ABSTRACT

Metal nanoplates are grown on n-type and p-type semiconductor wafer substrates through galvanic reactions between substantially pure aqueous metal solutions and the substrates. The morphology of the resulting metal nanoplates that protrude from the substrate can be tuned by controlling the concentration of the metal solution and the reaction time of the solution with the semiconductor wafer. Nanoplate size gradually increases with prolonged growth time and the nanoplate thicknesses increases in a unique stepwise fashion due to polymerization and fusion of adjacent nanoplates. Further, the roughness of the nanoplates can also be controlled. In a particular embodiment, Ag nanoplates are grown on a GaAs substrate through reaction with a solution of $AgNO_3$ with the substrate.

20 Claims, 37 Drawing Sheets

U.S. PATENT DOCUMENTS

| | | | |
|---|---|---|---|
| 2011/0024718 A1* | 2/2011 | Gradecak et al. | 257/9 |
| 2011/0024723 A1* | 2/2011 | Gradecak et al. | 257/14 |
| 2011/0077172 A1* | 3/2011 | Aizenberg et al. | 506/16 |
| 2011/0114145 A1* | 5/2011 | Yang et al. | 136/203 |

FOREIGN PATENT DOCUMENTS

| | | |
|---|---|---|
| WO | WO 2006/130721 A2 | 12/2006 |

OTHER PUBLICATIONS

Sun et al., "Formation of Oxides and Their Role in the Growth of Ag Nanoplates and GaAs Substrates", *Langmuir*, (2008), pp. 11928-11934, vol. 24, No. 20, American Chemical Society.

Sun et al., "Facile Tuning of Superhydrophobic States with Ag Nanoplates", *Nano Res*, (2008), pp. 1-13, Tsinghua Press and Springer-Verlag.

Sun, Yugang, "Direct Growth of Anisotropic Metal Nanostructures on Semiconductor Substrates", *Highlight for Journal of Materials Chemistry*, pp. 1-36.

Sun et al., "Effects of visible and synchrotron x-ray radiation on the growth of silver nanoplates on n-GaAs wafers: A comparative study", *Applied Physics Letters*, (2008), 3 pages, vol. 92, American Institute of Physics.

Sun, Yugang, "Direct Growth of Dense, Pristine Metal Nanoplates with Well-Controlled dimensions on Semiconductor Substrates", *Chem Mater—Communications*, (2007), pp. 5845-5848, vol. 19, No. 24, American Chemical Society.

Sun et al., "Comparative Study on the Growth of Silver Nanoplates on GaAs Substrates by Electron Microscopy, Synchrotron X-ray Diffraction, Optical Spectroscopy", *J. Phys. Chem. C*, (2008), pp. 8928-8938, vol. 112, American Chemical Society.

Xiong et al., "Synthesis of silver nanoplates at high yields by slowing down the polyol reduction of silver nitrate with polyacrylamide", *Communication*, (2007), pp. 2600-2602, vol. 17, The Royal Society of Chemistry.

Sun, Yugang, "Synthesis of Ag Nanoplates on GaAs Wafers: Evidence for Growth Mechanism", *J. Phys. Chem. C.*, (2010), pp. 857-863, vol. 114, American Chemical Society.

Sun et al., "Laser-Driven Growth of Silver Nanoplates on p-type GaAs Substrates and Their Surface-Enhanced Raman Scattering Activity", *J. Phys. Chem. C*, (2009), pp. 6061-6067, vol. 113, American Chemical Society.

Sun et al., "Synthesis of Out-of-Substrate Au-Ag Nanoplates with Enhanced Stability for Catalysis", *Angew Chem. Int. Ed.*, (2009), pp. 6824-6827, vol. 48, Wiley-VCH Verlag GmbH & co. KGaA, Weinheim.

* cited by examiner

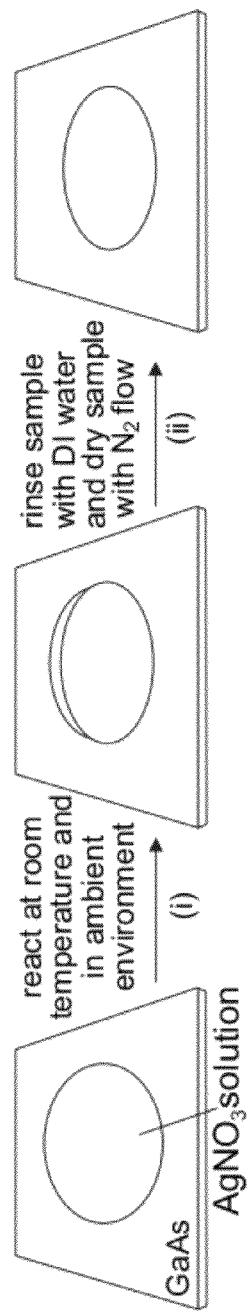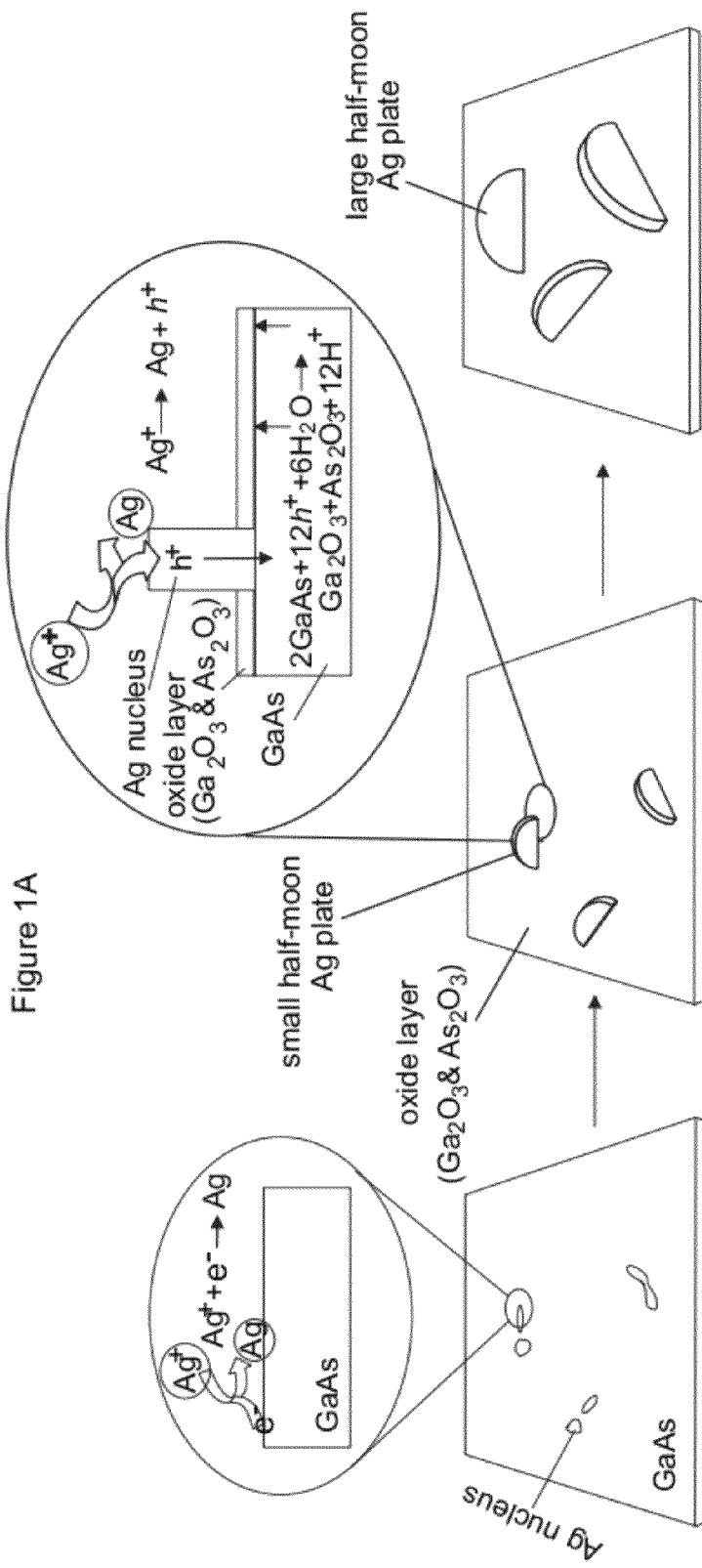

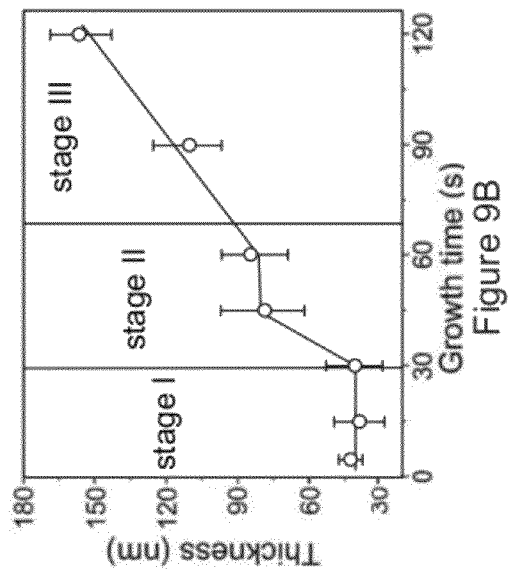
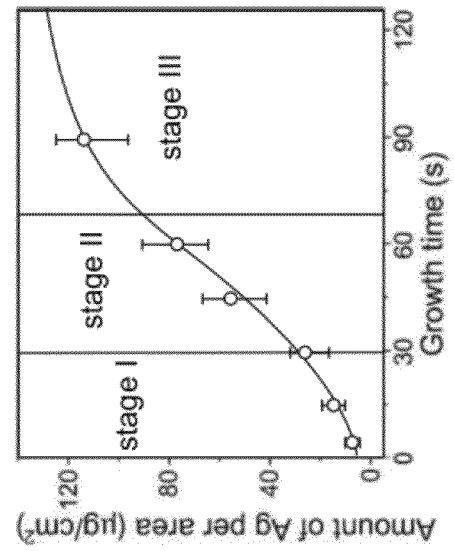
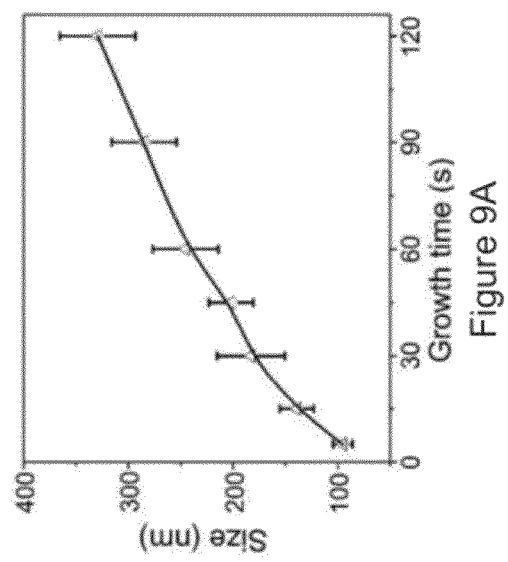
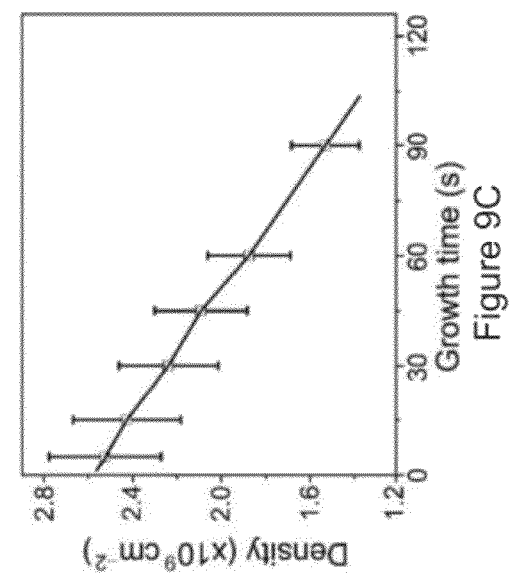
Figure 9A
Figure 9B
Figure 9C
Figure 9D

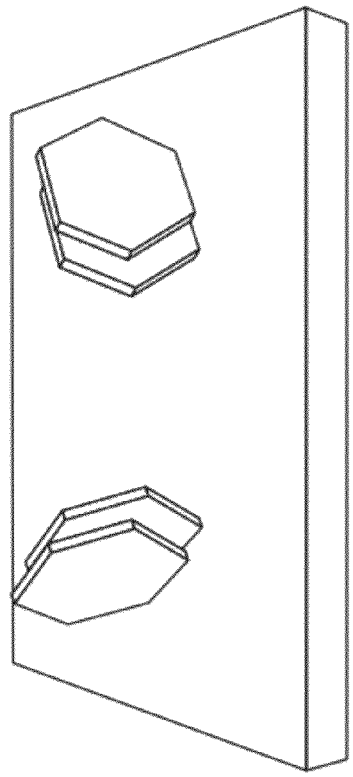
Figure 10A
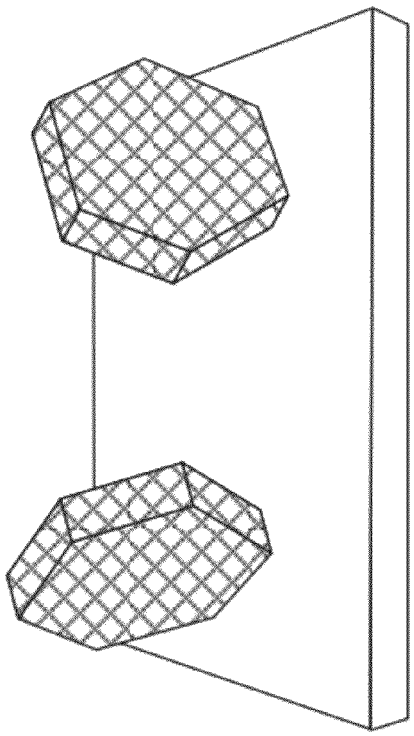
Figure 10B
Figure 10C
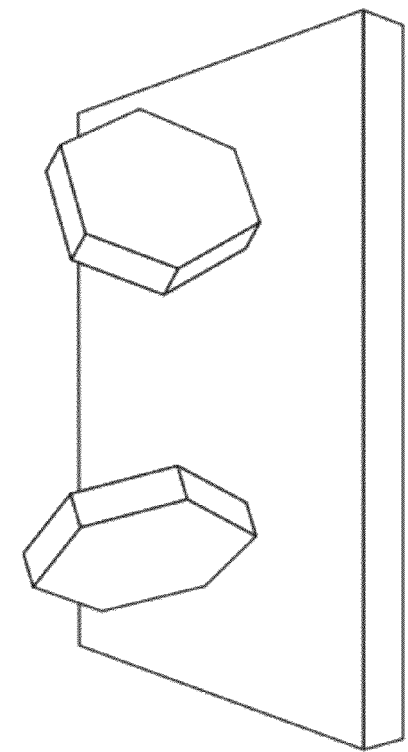
Figure 10D

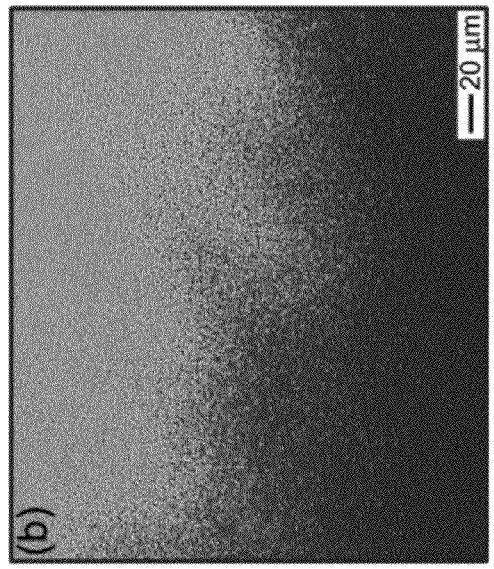
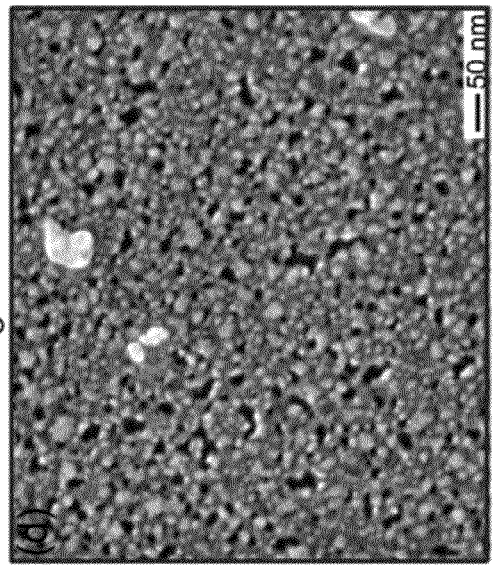
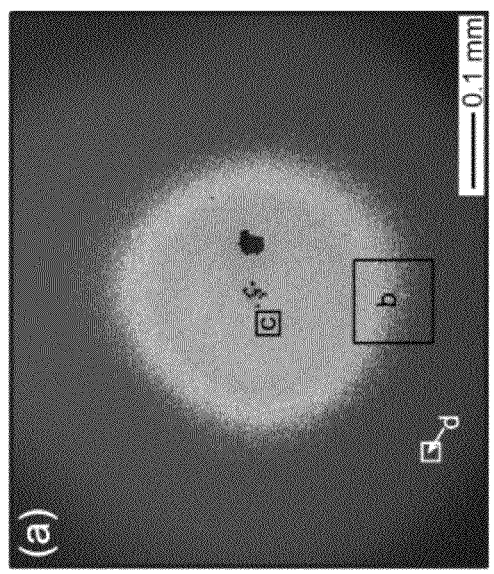
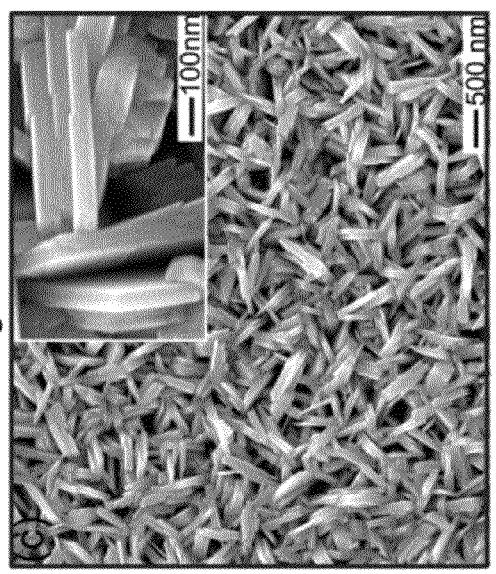
Figure 29A
Figure 29B
Figure 29C
Figure 29D

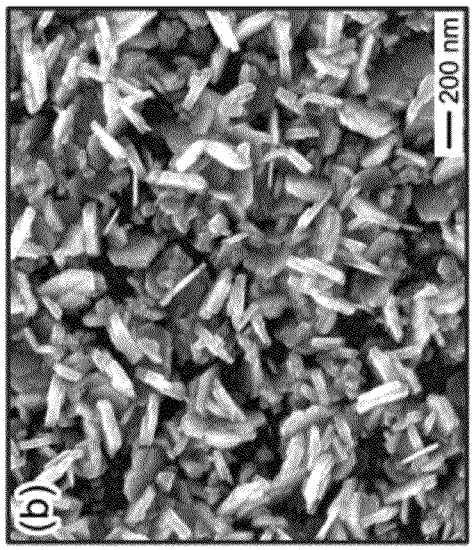
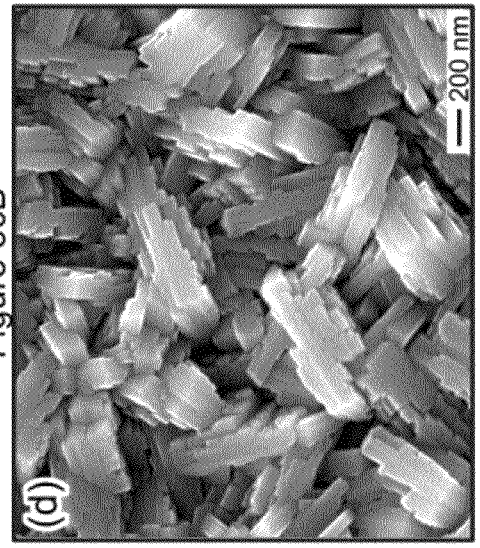
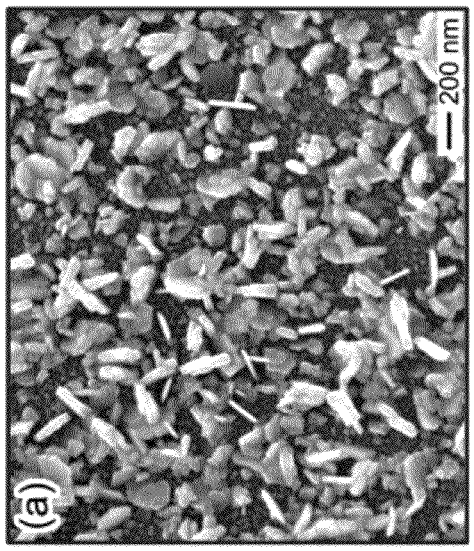
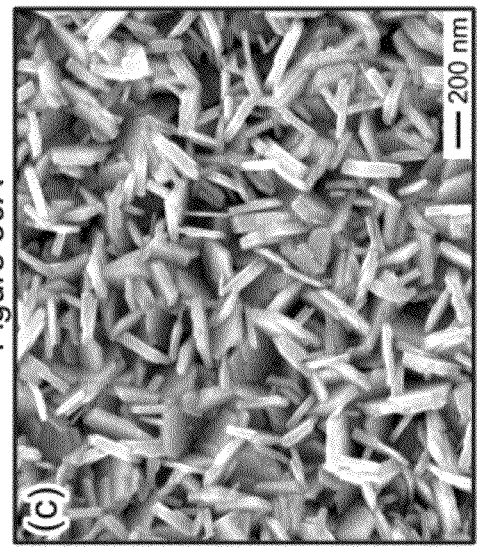
Figure 30A
Figure 30B
Figure 30C
Figure 30D

DIRECT GROWTH OF METAL NANOPLATES ON SEMICONDUCTOR SUBSTRATES

CROSS REFERENCE TO RELATED PATENT APPLICATIONS

The present application claims priority to U.S. Provisional Patent Application No. 61/104,591, filed Oct. 10, 2008, incorporated herein by reference in its entirety.

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

The present invention relates generally to the field of nanostructures formed on substrates. More particularly, the invention relates to methods for growing metal nanostructures, such as Ag, Ag/Au, Ag/Pt, and Ag/Pd from solutions of metal precursors on semiconductor substrates through galvanic reactions.

BACKGROUND OF THE INVENTION

This section is intended to provide a background or context to the invention that is, inter alia, recited in the claims. Unless otherwise indicated herein, what is described in this section is not prior art to the description and claims in this application and is not admitted to be prior art by inclusion in this section.

Semiconducting materials, in particular, wafers made of Si and other III-V materials that are widely used in the semiconductor industry, can strongly interact with electromagnetic fields in the ultraviolet (UV)-visible-infrared (IR) regimes due to their unique band structures. Nanostructures made of noble metals, such as gold and silver, also exhibit strong responses to electromagnetic fields in specific spectral region because of surface plasmon resonance (SPR) that is induced by the resonant oscillation of surface conduction electrons in the surfaces of the illuminated metal nanostructures. Therefore, metal nanostructure/semiconductor composites generated through directly depositing metal nanostructures on semiconductor substrates represent a promising class of functional materials.

Such materials have unique optical, electronic, optoelectronic, magnetic, and catalytic properties. Accordingly, the materials have applications in energy related areas, for instance, photovoltaic cells, photoelectrochemical splitting of water, for generating hydrogen, photocatalysis, and others. For example, single-crystalline semiconductor wafers covered discontinuously with nanostructures of noble metals are applicable to serve as photoelectrodes of high-performance photoelectrochemical cells (PECs) that are efficient for solar energy conversion into electricity and to storing chemical fuels, such as hydrogen. PECs have a number of advantages in comparison with traditional solid-state photovoltaic devices; for instance, PECs do not require high purity and precisely controlled doping levels (in terms of dopant type, concentration, and junctions) of the semiconductor wafers, which mainly determine the fabrication cost of solid-state photovoltaic cells. In addition, PECs built with single-crystalline semiconductor wafers exhibit fast charge transportation, resulting in the elimination of electron-hole recombination and an enhancement in performance, due to high charge mobilities in single-crystalline semiconductors.

However, a long-term challenge in assembling high-performance, stable PECs with semiconductor wafers is to prevent corrosion of the semiconductor photoelectrodes caused by the holes generated in the photon-induced charge separation processes. For instance, n-type Si wafers modified with Pt nanoparticles have shown to increase the performance (e.g., increase of open circuit voltage and output current) of PECs cells fabricated with the Pt/Si composite electrodes as well as enhance the stability of the photoelectrodes. Although greater coverage of the substrate with Pt nanoparticles enables higher stability, the light absorption efficiency decreases due to the blockage of light. Deposition of a sub-monolayer of well-separated nanoclusters made of noble metals on the surface of a semiconductor wafer could also significantly increase the stability of the PEC fabricated with the metal/semiconductor hybrid photoelectrode. The ideal morphology of each metal nanocluster is a "mushroom" shape, which has a thin root with a diameter of less than about 10 nm bonding to the semiconductor substrate and a large cap with suitable geometry and size for exposing the semiconductor surface as much as possible in order to harvest sunlight.

Metal nanostructure/semiconductor composites are also applicable in controlling quantum yields of semiconductor quantum dots. For example, quantum dots can be tuned in either quenching or enhancing mode by locating metal nanoparticles in the vicinity of the quantum dots with various spacings. Titanium dioxide ($TiO_2$) nanoparticles (a class of strong absorbers of UV irradiation) decorated with Au nanoparticles exhibit enhanced efficiency to convert solar energy into electricity because the SPR states of Au nanoparticles in the visible region can be strongly excited by solar irradiation and the excited electrons can be injected into the conduction band of $TiO_2$. The charge flow drives the hybrid system to behave as a photovoltaic device similar to a dye-sensitized solar cell.

Still further, controlling the hydrophobicity of solid surfaces has a wide range of applications, including anti-sticking, anti-contamination, self-cleaning, and oil/water separation. In particular, it is desirable to create superhydrophobic surfaces that exhibit apparent contact angles larger than 150°. Various techniques are known to enhance the hydrophobicity of a surface by coating the surface with thin layers of low surface energy materials (for example long-chain alkyl thiol molecules for precious metals, or fluoroalkylsilane molecules for Si). However, achieving superhydrophobicity through this strategy can often be difficult. Various physical approaches including lithographic patterning and etching, molding, and imprinting have also been used to create roughness on surfaces to achieve superhydrophobicity. Still other approaches induce surface roughness by direct deposition of micro/nano-structures of different materials (e.g., metals, polymers, polyelectrolytes, oxides, or carbon nanotubes) on substrates through chemical reactions and/or assembly processes have been shown to lead to superhydrophobicity. Nevertheless, producing composite surfaces with a range of superhydrophobic behavior through relatively simple approaches remains difficult.

Properties and performance of metal nanostructure/semiconductor hybrids are strongly dependent on the properties of the metal nanostructures, which are sensitive to their morphologies. A number of solution-phase synthetic approaches have been demonstrated to be capable of producing nanostructures with various well-defined shapes. These approaches have been developed to successfully synthesize metal nanostructures with a large number of well-defined shapes such as spheres, cubes, tetrahedra, octahedra, rings/frames, rods/wires/beams, stars, plates, boxes, and cages. However, synthesis of these structures requires uses of surfactants. Some of these approaches have been extended to grow metal nanostructures with well-defined shapes on solid substrates. For example, seed mediated synthetic processes with assistance of surfactants can grow gold nanorods on silicon or glass substrates and gold nanoplates on conductive indium tin oxide substrates. The as-synthesized shaped metal nanostructures can be deposited on appropriate semiconductor surfaces by controlling surface chemistries and assembly strategies. In particular, the solution-phase chemical reactions have also achieved success in preparing metal nanoplates with the assistance of specific surfactant molecules, for instance, polymeric chains (e.g., poly(vinyl pyrrolidone) or PVP, polyamine), micellar assemblies (e.g., cetyltrimethylammonium bromide or CTAB, di(2-ethyl-hexyl) sulfosuccinate or AOT), coordinating ligands, biological reagents, etc.

The various conventional methods typically use surfactant molecules that are usually employed in the solution-phase reactions to assist the anisotropic or isotropic growth of metal nanoparticles as well as prevent the nanoparticles from aggregation and sintering. However, the surfactants can deleteriously influence the metal/semiconductor interfaces for applications. The use of surfactant molecules also complicates the reactions and contaminates the surfaces of the resultant metal nanostructures, leading to degradation of their performance in certain applications. For instance, a thick layer of organic surfactant molecules on the surfaces of metal nanoparticles can block charge transfer at metal/semiconductor interfaces involved in applications such as photovoltaic cells, resulting in a significant decrease of the performance of devices fabricated with the surfactant coated metal nanoparticles. The surfactant molecules can also decrease the catalytic efficiency of the metal nanoparticles used for catalyzing chemical reactions because the surfactant coating can block the interaction between precursor molecules and the metal surfaces.

Other techniques such as the combination of templates on wafer substrates and physical deposition (e.g., thermal evaporation, electron-beam evaporation, sputtering, atomic-layer deposition) can avoid the use of surfactant molecules to produce metal nanostructures with various nonspherical shapes defined by the templates. For example, "nanosphere lithography" provides a versatile approach to fabricate metal nanoparticles with a number of morphologies (e.g., triangular plates, rings, overlaps of double triangles, and chains of triangles). However, the preparation of nanosphere templates and the use of vacuum deposition tools in their fabrication can be a complicated and inefficient and costly process.

SUMMARY OF THE INVENTION

Metal precursors, for example, metal ions and organometallic compounds, may be used to deposit metal atoms directly onto the surfaces of semiconductors without the involvement of surfactant molecules. This technique can produce metal/semiconductor composite materials with clean metal/semiconductor interfaces. Additionally, the process is a more straightforward and efficient method to directly grow metal nanostructures on semiconductor substrates through a relatively simple reduction reaction of aqueous solutions of substantially pure metal precursors, for example, $AgNO_3$ for Ag atoms and adding $NaAuCl_4$ to form Ag/Au nanostructures, with a semiconductor substrate (serving as reducing agent). Further, the morphology of the deposited metal nanostructures can be finely tuned to desired parameters by controlling reaction parameters. By tuning the morphology of the nanostructures, a number of useful metal/semiconductor materials may be fabricated having applications in, for example, photovoltaic cells, photocatalysis, chemical detection, chemical separation, and self-cleaning surfaces and heat management of electronics.

Various embodiments of the present invention are directed to an efficient surfactant-free approach to quickly grow pristine metal nanoplates with well-controlled thicknesses, edge lengths, and roughness as well as metal nanostructures with other morphologies (formed as hierarchical structures made of nanoplates) on semiconductor wafers through galvanic reactions between substantially pure aqueous solutions of metal salts and n-type and p-type semiconductor substrates. The length and thickness, as well as the roughness of the metal nanoplates, can be finely tuned by simultaneously varying the concentration of the metal solutions and the reaction time with the substrate. By further varying these parameters, metal nanoplates can also polymerize into oligomers and fuse into thicker nanoplates. In addition, light illumination can be used to modulate the growth process, leading to the variation of density of nanoplates. Metal nanostructures with other morphologies can be synthesized by tuning the dopant type and concentration of the semiconductor substrates and/or power intensity of light illumination. Desired structures can be fabricated efficiently—a typical synthesis can be completed within 0.5-10 minutes.

The growth of each metal nanoplate initiates with the formation of a very small metal crystal (i.e., nucleus) at a defect site on the semiconductor surface. Growth begins here because the defect site has higher surface energy, and thus higher reactivity, than adjacent flat areas of the substrate. Defects usually exist on the surfaces of semiconductor wafers after their native oxide layers are removed with acids (e.g., hydrofluoric acid) in an ambient environment. The existence of defects typically results from the surface roughness and crystalline defects of the semiconductor wafer substrate itself.

Once the metal nuclei are formed through fast reduction of metal ions with surface electrons of the semiconductor substrate, the subsequent growth process is dominated by a so-called "hole injection process" because the reduction potential of the metal ion/metal pair ($M^{n+}/M$) is higher than the valence band of the semiconductor wafer under the reaction conditions. The hole injection process induces reactions between the metal ions and the semiconductor substrate to directly grow the metal particles onto the surfaces of the semiconductor substrates without assistance of external electrical fields, which is different from electrochemical deposition of metals. Ohmic contacts (for electrochemical deposition), surfactant molecules, and additional reductants are not required. Therefore, this process is applicable to deposit nanostructures of noble metals, whose corresponding equilibrium potentials of $M^{n+}/M$ are usually high enough to overlap with the valence bands of conventional semiconductor wafers (e.g., GaAs, Si, Ge, InP, and GaP), to form clean metal/semiconductor interfaces that have beneficial applications. The present process is further capable of anisotropically growing metal nanoparticles with well-defined shapes, for example, nanoplates.

In situ generation of oxides on the surfaces of the semiconductor substrates and the slow interdiffusion between the metal and semiconductor is critical to well separate the nucleation, dominated by fast reduction of metal ions with surface electrons, and the growth steps, dominated by the hole injection process. The separation enables the anisotropic growth of metal nanostructures with well-defined shapes. Nanoplates of various metals, for example, Ag on GaAs and Si and Pd on GaAs, have been demonstrated using this approach.

The as-grown metal nanoplates can be conventionally converted into nanoplates made of other metals (or alloys) through reacting the metal nanoplates with precursors of other more noble metals. For example, Ag nanoplates can be transformed into Au/Ag alloy nanoplates when the Ag nanoplates react with chloroauric acid ($HAuCl_4$).

In a particular embodiment, substantially pure Ag nanoplates are directly grown on n-type GaAs wafers at room temperature through galvanic reactions between aqueous solutions of $AgNO_3$ and the GaAs substrates. Varying the concentration of the $AgNO_3$ solutions and the reaction time with the substrate provides the capability to tune the dimensions (thickness and length) and the surface morphologies (smooth versus rough) of the Ag nanoplates disposed on the semiconductor substrate. In general, rough nanoplates are generated when the $AgNO_3$ concentration is low (e.g., less than or equal to about 0.1 M). When the concentration of $AgNO_3$ becomes higher (e.g., greater than about 0.3 M), the surfaces of the nanoplates become flat and their thicknesses increase with an increase in the concentration. In addition, the sizes of Ag nanoplates increase with growth time, while their thicknesses increase in a stepwise fashion through polymerization and fusion of adjacent nanoplates.

In another embodiment, substantially pure Pd nanoplates are directly grown on a semiconductor substrate by reacting a GaAs wafer with $Na_2PdCl_4$ solution. The resulting reaction yields Pd nanoplates on the surface of the substrate.

In yet another embodiment, the semiconductor substrates can be decorated with metal nanoplates through direct galvanic reaction between aqueous metal ion solutions and semiconductor wafers. The hydrophobocity of the resulting metal nanoplate/semiconductor composite surfaces can be varied after the metal nanoplates are coated with self-assembled monolayers of low surface energy organic molecules such as alkyl thiol. By controlling the reaction conditions, such as growth time and concentration of the $AgNO_3$ solution, the size, thickness, and surface roughness of the individual nanoplates can be tuned to produce different topographic structures and roughness of the composite surfaces, thereby modifying the hydrophobicity of the surfaces. The resulting composite surfaces exhibit various levels of hydrophobicity and different wetting states such as the Wenzel wetting state, Cassie impregnating wetting state, and Cassie nonwetting state.

In yet another embodiment, growth of metal nanoplates on p-type semiconductor substrates is performed with assistance of light illumination. Light illumination over partial reaction area(s) of the p-type semiconductor substrates selectively increases the concentration of surface electrons in these bright areas, thus leading to boost the nucleation process. This spatial selectivity allows patterning the surfaces of the semiconductor substrates with metal nanoplates in desired layouts.

In one embodiment, the techniques of the present invention further represent a "green" approach to fabricating complex functional materials because there are no surfactants, organic solvents, or catalysts involved in the synthesis. In a typical synthesis, the necessary materials only include metal precursor, semiconductor substrate, and water. The present technique eliminates the dissolution of oxide layers of semiconductors that provide confinement to assist the growth of highly anisotropic metal nanoplates. Additionally, the formation of "mushroom" morphologies of the metal nanoplates can be applicable to the fabrication of robust PECs with nanoplate/semiconductor hybrid materials. Furthermore, the nanoplates have rough and clean surfaces and large facial areas that enable them to function as a new class of structures for plasmonic catalyzed chemical reactions, for the plasmonic-enhanced absorption of solar energy in photovoltaic applications, for surface-enhanced photoluminescence, and for surface-enhanced Raman scattering (SERS) in detection of chemical and biological species.

These and other advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIGS. 1A and 1B illustrate the general technique of the present invention and resulting galvanic reaction between an aqueous metal solution and a semiconductor substrate for deposition of metal nanostructures on the substrate and more particularly for an embodiment using a $AgNO_3$ solution to grow Ag nanoplates on a GaAs substrate;

FIG. 9A is a graph showing the size of Ag nanoplates in response to growth time; FIG. 9B is a graph showing the thickness of Ag nanoplates in response to growth time; FIG. 9C is a graph showing the density (number of nanoplates per unit area) of Ag nanoplates in response to growth time; FIG. 9D is a graph showing the mass per unit area of Ag in response to growth time;

FIGS. 10A-10D show schematic illustrations of the polymerization and fusion process of adjacent nanoplates on a substrate;

FIG. 20A, 5 seconds; FIG. 20B, 15 seconds; FIG. 20C, 30 seconds; FIG. 20D, 45 seconds; FIG. 20E, 60 seconds; FIG. 20F, 90 seconds;

FIG. 21A, 120 seconds; FIG. 21B, 180 seconds;

FIGS. 29A-29D show a series SEM images of Ag nanoplates grown on p-GaAs wafers with a Zn dopant of concentration of about $1 \times 10^{19}$ cm$^{-3}$ through a 2 minute reaction of a 2 M $AgNO_3$ with the substrate with the assistance of 650 nm laser irradiation (with power density of 54 mW/cm$^2$) of the substrate; FIG. 29B shows an enlarged view of the sample of FIG. 29A at box b; FIG. 29C shows an enlarged view of the sample of FIG. 29A at box c; FIG. 29D shows an enlarged view of the sample of FIG. 29A at box d;

FIGS. 30A-30D shows a series of SEM images of for Ag nanoplates grown on p-GaAs substrates with a 2 M $AgNO_3$ solution under the same conditions of FIG. 29A for various reaction times: FIG. 30A, 30 seconds; FIG. 30B, 45 seconds; FIG. 30C, 60 seconds; FIG. 30D, 240 seconds;

FIG. 31A, 31.2 mW/cm$^2$; FIG. 31B, 16.4 mW/cm$^2$; FIG. 31C, 12.6 mW/cm$^2$; FIG. 31D, 8.2 mW/cm$^2$;

FIG. 37A is for 30 s; FIG. 37B for 60 s; and FIG. 37C for 90 s;

DETAILED DESCRIPTION OF VARIOUS EMBODIMENTS

Figure 2A:
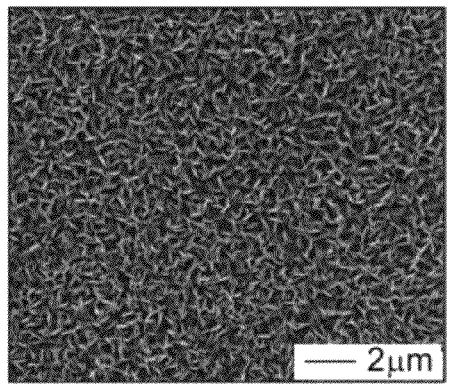
FIG. 2A shows a low magnification scanning electron microscopy (SEM) image of a sample formed after a 2 minute reaction of 1M $AgNO_3$ on a GaAs substrate with a silicon dopant concentration of $1.5\times10^{18}$ $cm^{-3}$.

Metal nanoplates are grown on n-type and p-type semiconductor wafer substrates through simple galvanic reactions between substantially pure aqueous metal precursor solutions that can be carried out at room temperature. FIGS. 1A and 1B illustrate the general process for a particular embodiment using AgNO$_3$ to grow Ag nanoplates on a GaAs substrate. The morphology of the resulting metal nanoplates can be controlled by the concentration of the metal ion solution and the reaction time. The results show that the sizes of the nanoplates gradually increase with prolonged growth times and the thicknesses increase in a unique stepwise fashion because of polymerization of adjacent nanoplates into oligomers. The technique provides a simple approach to grow metal nanoplates with controlled sizes and thicknesses on semiconductor substrates. By choosing appropriate metal salt precursors and semiconductor wafers, this method can be easily extended to grow nanoplates made of other metals on desired semiconductor substrates.

The as-grown nanoplates protrude out of the surfaces of the semiconductor substrates with random orientations. Regardless of orientation, each nanoplate has one edge contacting the substrate surface, and this edge is defined as the "contact edge." Each nanoplate grows from a small nucleus initially formed at a defect site of the substrate and expands its dimension laterally into a substantially two-dimensional plate. Meanwhile, an oxide layer simultaneously grows between the nanoplate and the substrate. Thus, the nanoplates have a necked geometry with a small region of contact between the nanoplate and the semiconductor lattices as well as large planar basal surfaces. The direct contact between the metal nanoplates and the semiconductor lattices supports the hole injection process to grow the metal nanoplates into different sizes and, for example, to provide charge transfer pathways in PECs. Further, the morphology may beneficially prevent the corrosion of the substrate wafer when it is used as a photoelectrode in a PEC. Additionally, the coverage of a thin transparent layer of oxides on the substrate can further protect the substrate from corrosion but does not substantially affect the harvesting of sunlight.

A typical synthesis of high-quality metal nanoplates, for example, Ag nanoplates, starts with cleaning a semiconductor substrate. In an embodiment, a single crystal n-GaAs substrate is cleaned by dipping the substrate in a 2% hydrofluoric acid solution for about 5 minutes. The reaction with hydrofluoric acid removes the native oxide layer from the substrate and exposes fresh lattices to the reactants. The cleaned substrate is rinsed with deionized water and dried with a flow of N$_2$ gas. The cleaned substrate should generally be used within 1 hour to avoid regeneration of the native oxide layer on semiconductor surface. A droplet of aqueous metal ion solution is placed on the cleaned surface of the substrate. In a particular embodiment, the aqueous metal solution comprises AgNO$_3$. Contact of the substrate with the aqueous metal ion solution initiates the growth of metal nanoplates, nanostructures, and microstructures on the substrate surface through galvanic reduction-oxidation (redox) reaction. Where the reaction comprises, for example, a solution of AgNO$_3$ and a substrate of n-GaAs, the reaction is characterized by:

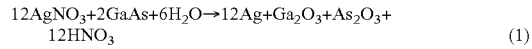

$$12AgNO_3 + 2GaAs + 6H_2O \rightarrow 12Ag + Ga_2O_3 + As_2O_3 + 12HNO_3 \quad (1)$$

The reaction of the particular embodiment, proceeds because the standard reduction potential of the Ag$^+$/Ag pair (0.799 V versus a normal hydrogen electrode (NHE)) is higher than those of the Ga$_2$O$_3$/Ga pair (about 0.56 V versus NHE) and the As$_2$O$_3$/As pair (0.234 V versus NHE). A continuous reaction generates a substantially dense layer of metal structures on the surface of the substrate. The difference in standard reduction potentials between the redox pairs of Ag$^+$/Ag and Ga$_2$O$_3$/Ga and As$_2$O$_3$/As indicates that the reaction shown in Equation (1) is thermodynamically spontaneous regardless of the dopant type in the GaAs wafers.

Figure 2B:
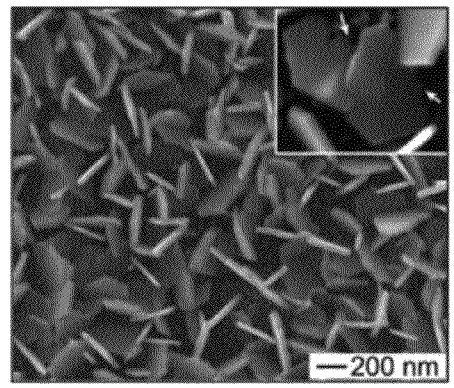
FIG. 2B shows a high magnification SEM image of the sample of FIG. 2A.

The reaction can be stopped by rinsing the sample with copious amounts of deionized water and drying with a gentle N$_2$ flow, completing the synthesis. Continuous growth results in the formation of nanoplates of varying sizes by controlling the growth time. FIGS. 2A and 2B show low- and high-magnification scanning electron microscopy (SEM) images, of a sample formed after a 2 minute reaction of 1 M AgNO$_3$ on a GaAs substrate with a silicon dopant concentration of 1.5×10$^{18}$ cm$^{-3}$. The images show the formation of substantially uniform nanoplates with a high density (wherein density is defined as the number of plates per unit of area) of $2.82 \times 10^9$ plates/cm$^2$ over the reaction area. The nanoplates have smooth surfaces and a thickness of about $28\pm5$ nm and edge lengths from about 400 to about 450 nm. The nanoplates protrude from the surface plane of the substrate and have random orientations.

The technique is also applicable to growing nanoplatess of other noble metals on semiconductors, including Pd nanoplates on n-type GaAs wafers because of a standard reduction potential of 0.623 V for a PdCl$_4^{2-}$/Pd couple. The technique can further be applied to grow metal nanoplates on other semiconductor substrates, such as n-type Si and p-type semiconductors.

Similarly, FIGS. 3A-3F show SEM images of a sample formed after a 10 minute reaction with 0.1 M AgNO$_3$ solution on an n-GaAs substrate. The reaction achieves substantially uniform and relatively dense ($3.12 \times 10^8$ plates/cm$^2$) coverage of the substrate with nanoplates. A high-magnification SEM image of an individual structure (inset, FIG. 3A) shows that the plate has half-moon (i.e., fan-shaped) morphology and rough surfaces. The surface roughness indicates that each structure is comprises an assembly of Ag grains. Each plate sticks to the GaAs substrate through a straight edge and stands out from the surface of the wafer to expose an arc edge. The interaction between the Ag plates and the GaAs wafer is strong enough to withstand rinsing and drying processes in the synthesis. The thicknesses of the nanoplates typically range from about 50 to about 70 nm and the lengths of the straight edges are about 1 µm. The as-grown Ag nanoplates can be easily released from the GaAs wafer through various techniques, such as either scratching the surface of the sample with a blade or immersing the sample in an aqueous etchant of GaAs. In the particular embodiment where the substrate comprises GaAs covered with Ag nanoplates, a solution of hydrogen peroxide (H$_2$O$_2$) and phosphoric acid (H$_3$PO$_4$) can be used followed by centrifuging and rinsing to isolate the plates from the substrate. After collection of the nanoplates, the wafer can be re-used to for a subsequent synthesis cycle. In this fashion, the fabrication cost can be significantly decreased.

Figure 3C:
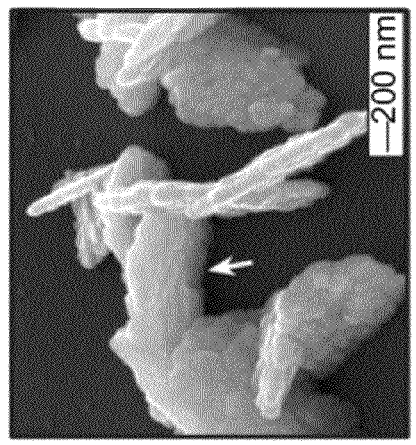
FIGS. 3A-3E show SEM images of a sample formed after a 10 minute reaction of 0.1 M $AgNO_3$ on a GaAs substrate with a silicon dopant concentration of $1\times10^{18}$ $cm^{-3}$.
Figure 3F:
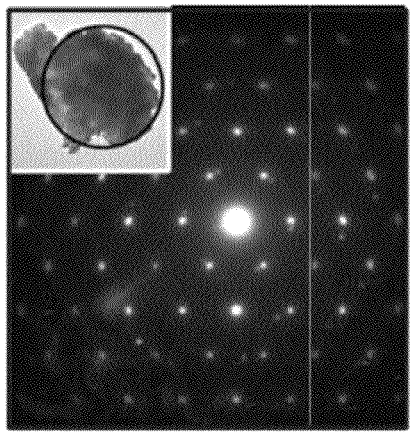
FIG. 3F shows a selected area diffraction pattern of an individual Ag plate with an electron beam normal to the basal plane.
Figure 3B:
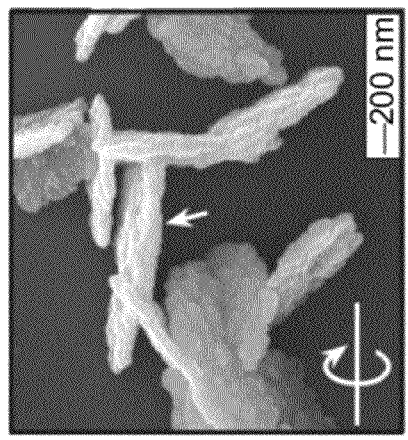
Figure 3E:
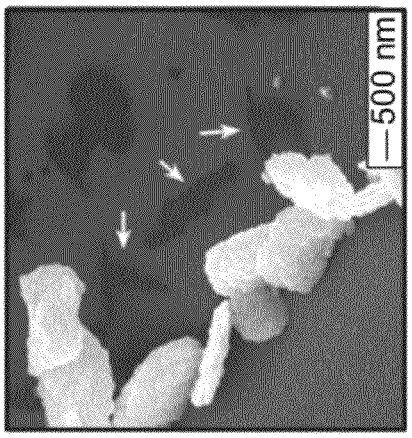
Figure 3A:
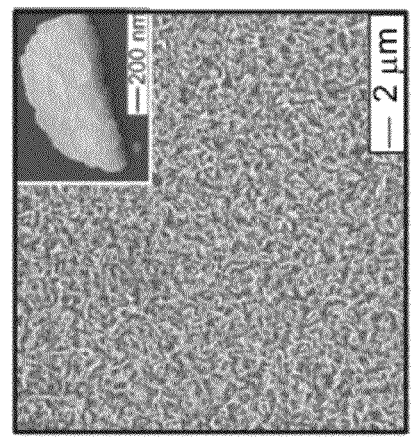
Figure 3D:
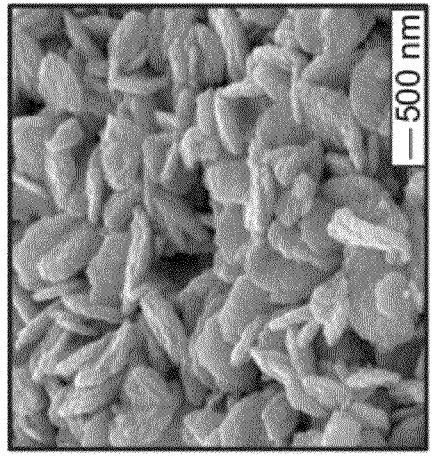

FIG. 3D shows an SEM image of a plurality of freestanding Ag plates collected from a sample through blade scratching of the substrate. A transmission electron microscopy (TEM) image (inset of FIG. 3F) also reveals the plate-like geometry of the as-grown structures. A selected-area diffraction pattern of the Ag plate (FIG. 3F) obtained by focusing the electron beam in the circled area shown in the inset. The intense hexagon pattern indicates that the Ag grains of the plate orient in the same crystallographic direction. The basal planes of the plate are along the {111} direction. The results are consistent with the fact that the {111} facets of face-centered cubic (fcc) metals have lower surface energy than other low-index facets, such as {110} and {100}. As the reaction continues, the reaction deposits more metal atoms onto the anisotropic nuclei rather than forming new nuclei due to the Ostwald ripening effect. At the same time, the reduction of metal ions induces the formation of a thin oxide layer on the substrate surface, for example, Ga$_2$O$_3$ and As$_2$O$_3$ in the case of a GaAs substrate. The oxide layers prevent the growing metal structures from spreading in the surface plane of the substrate because the weak adhesion between the metal, for example, Ag, and oxides such as Ga$_2$O$_3$ and As$_2$O$_3$ may repel the metal structures. This effect leads to the formation of enlarged metal structures out of the surfaces of the wafers.

Figure 4A:
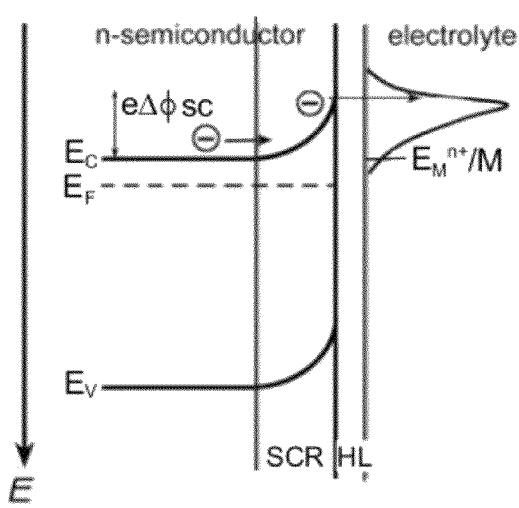
FIGS. 4A-4C show energy level diagrams for various reactions may occur between metal ions and a semiconductor.
Figure 4B:
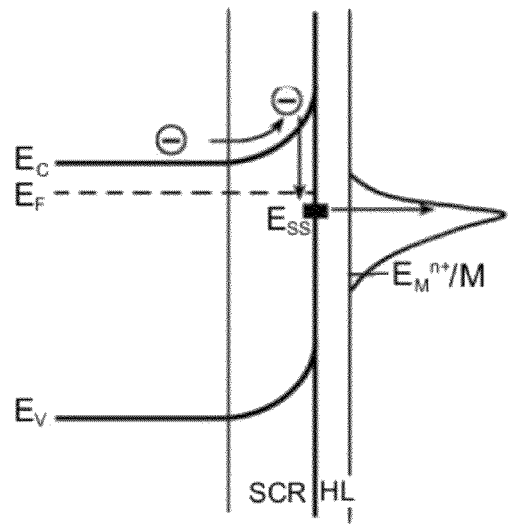
Figure 4C:
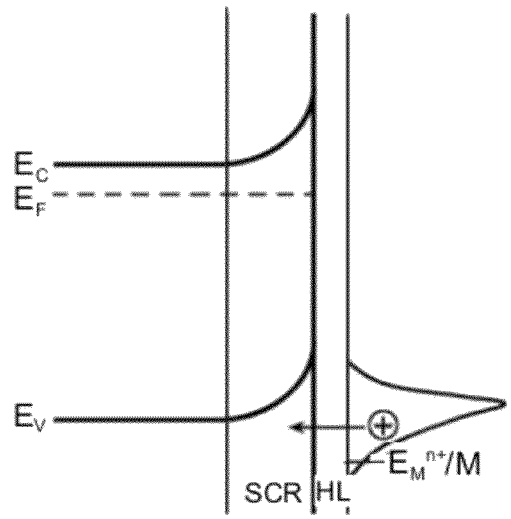

Metal ions can be reduced through different reactions as depicted in FIGS. 4A-4C based on relative energy positions between the semiconductor and the metal ions. A hole injection process as shown in FIG. 4C occurs on the semiconductor surface with small metal clusters in contact with a solution of the corresponding metal ions when the equilibrium potential of the M$^{n+}$/M couple overlaps the valence band of the semiconductor. However, the hole injection process may be difficult to initiate on the surface of a bare semiconductor substrate because forming the new metal/semiconductor interface and new metal phase requires extra free energies to overcome a high energy barrier. In general, formation of small metal clusters, i.e., the nuclei, is driven by reducing metal ions with reductants having very high free energies, such as free electrons, sodium boron hydride (NaBH$_4$), etc. In an n-type semiconductor wafer, its surface is occupied with surface electrons (more reactive than bulk electrons) with concentration, $n_s$, determined by $n_s = n_0 \exp(e\Delta\phi_{SC}/kT)$, where $n_0$ is the bulk electron concentration ($n_0 = n_D$, i.e., the donor density for completely ionized donors), e is the charge of an electron, $\Delta\phi_{SC}$ represents the band bending, k is the Boltzmann constant, and T is the temperature (in Kelvin scale). If surface electrons of semiconductors are responsible for quickly reducing metal ions into small metal clusters (i.e., the nucleation step), the reaction between a given n-type semiconductor and a solution of metal ions at a constant temperature can generate a metal cluster with densities strongly dependent on the dopant concentrations. As a result of sequential hole injection process, more metal nanoparticles in a unit area can be grown on semiconductor substrates with higher dopant concentrations. The separation of growth step (dominated by hole injection process) from nucleation step (dominated by fast reduction with surface electrons) is beneficial for the formation of anisotropic metal structures.

For example, in the hole injection process, Ag$^+$ ions rarely interact with the surface GaAs lattices. Instead, Ag$^+$ ions mainly diffuse to the surfaces of the Ag nuclei to release holes. As a result, the resulting Ag nanostructures usually grow out of the surface of the GaAs substrate rather than spreading over the substrate surface. The separation between nucleation and growth steps enables the anisotropic growth of the metal nanostructures with well-defined shapes. This approach is different from the traditional Volmer-Webber growth mode, through which most metal nanoparticles grow into semi-spherical morphologies on semiconductor substrates. When the crystalline structure of the Ag nuclei and kinetics of the hole injection process are appropriate, Ag nanostructures with well-defined shapes, for example, nanoplates, can be obtained.

Figure 5C:
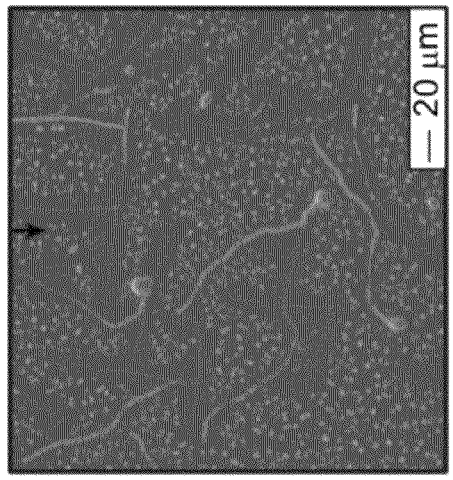
FIGS. 5A-5C show SEM images of Ag structures formed on a semi-insulating GaAs (SI-GaAs) substrate with a (100) surface orientation grown through reaction with a 0.1 M $AgNO_3$ solution.
Figure 5F:
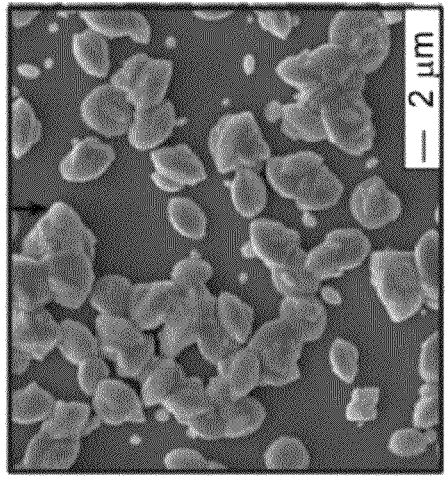
FIGS. 5D-5F show SEM images of Ag structures formed on a p-GaAs (100) substrate with a zinc concentration of $1\times10^{19}$ $cm^{-3}$ grown through reaction with a 0.1 M $AgNO_3$ solution.
Figure 5B:
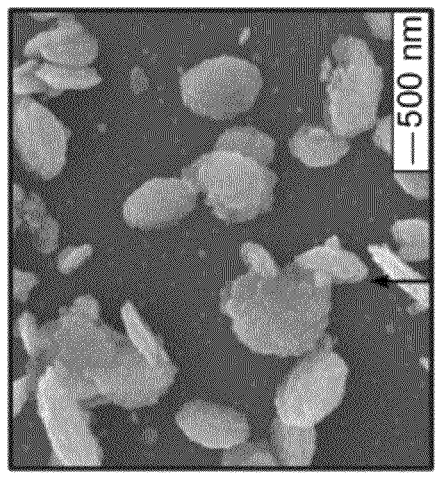
Figure 5E:
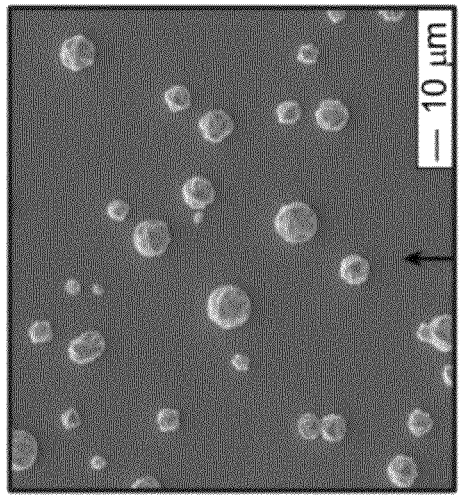
Figure 5A:
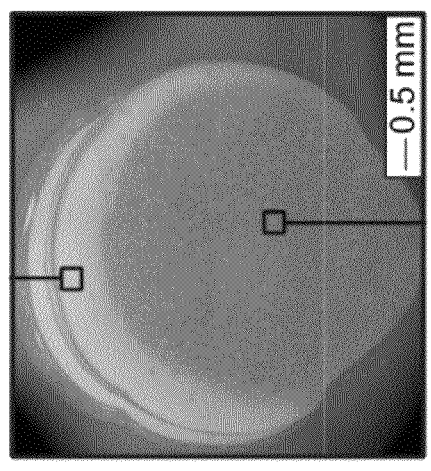
Figure 5D:
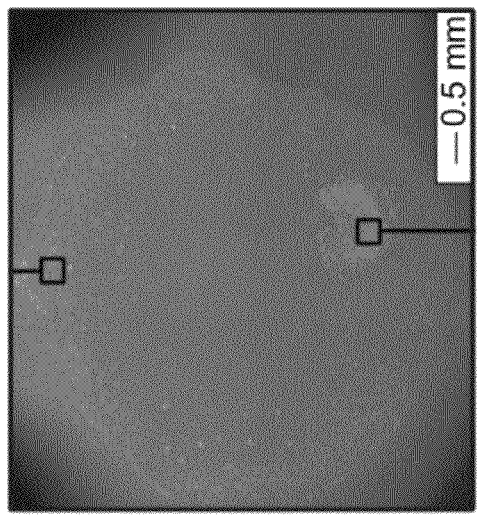
Figure 6:
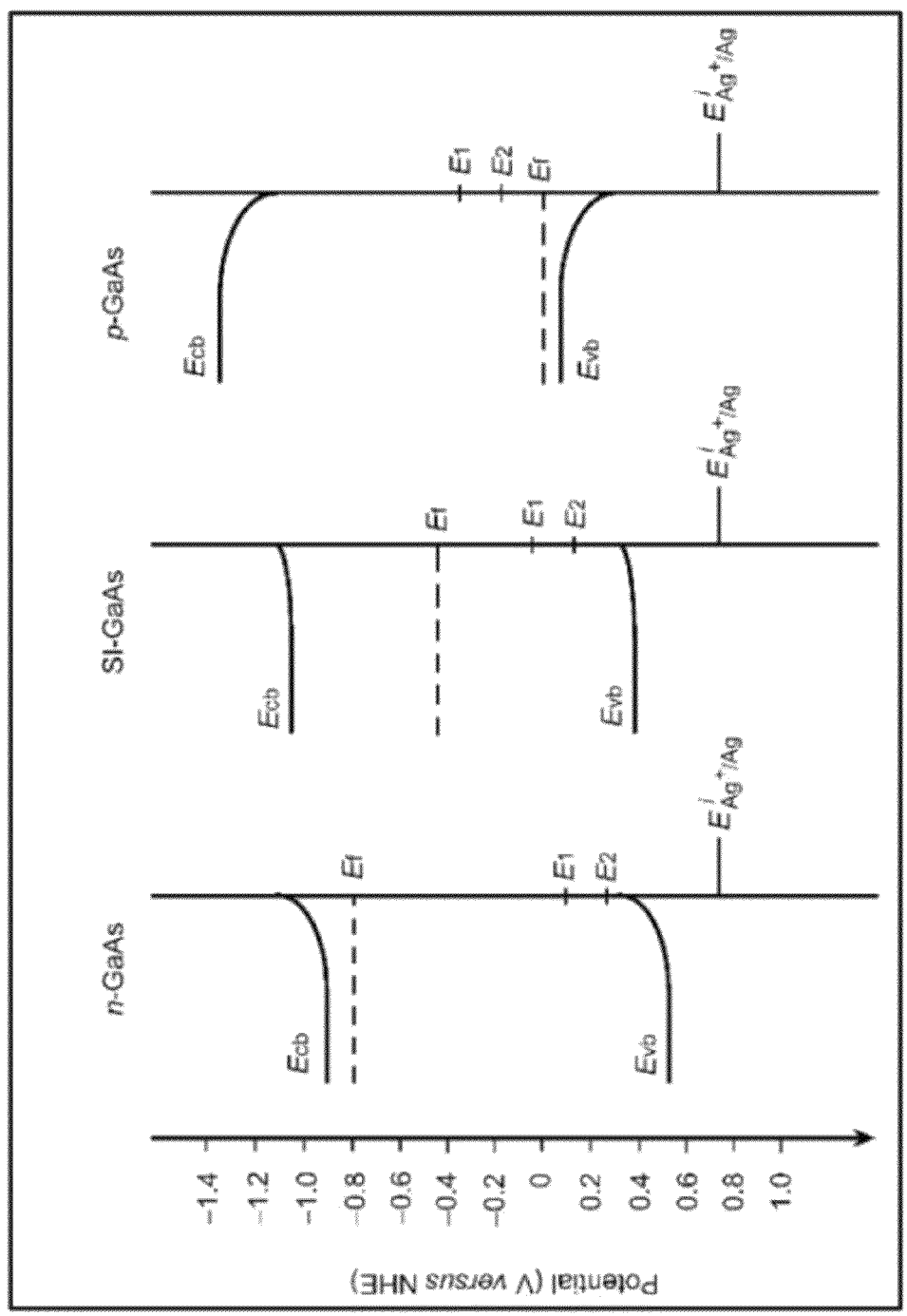
FIG. 6 shows a diagram depicting various energy levels for different types of GaAs substrates upon exposure to aqueous solution of $AgNO_3$.

FIGS. 5A-5F demonstrate that silver ions react with different types of GaAs wafers including both semi-insulating and p-type wafers in different ways, implying that the reaction between Ag$^+$ and GaAs is significantly different from the galvanic displacement reactions between Ag$^+$ and metals (e.g., Cu, Fe, Ni, Co). FIGS. 5A-5C show SEM images of Ag structures formed on a semi-insulating (SI-GaAs) (100) substrate. FIGS. 5D-5F show SEM images of Ag structures formed on a p-GaAs (100) substrate. The systems of FIGS. 5A-5F are discussed in detail in Example 11 below. The discrepancy between metals and semiconductors is ascribed to the fact that the conduction band and valence band of a semiconductor bend at the interface with an electrolyte. FIG. 6 presents a diagram of energy levels of GaAs with different dopants upon contact with an aqueous solution of AgNO$_3$ (concentration of 0.1 M). Regardless of the type of dopant, GaAs wafers have the same valence band and conduction band energies at their surfaces when they are exposed to the same electrolyte at the same temperature. The surface valence band of GaAs in neutral electrolyte (i.e., of about pH 7) is located at about 0.32V versus NHE. In addition to the effect of pH on the dissolution of the oxides formed from GaAs, the pH value of the electrolyte also leads to changes in the band energies of GaAs in a linear relationship, that is, its valence-band energy decreases with the increase of pH value. Because the bandgap energy of GaAs is 1.42 eV, the surface conduction band of the GaAs wafers, which are exposed to the aqueous 0.1 M $AgNO_3$ solution, lies at −1.10 V versus NHE.

As shown in FIG. 6, the conduction and valence bands of n-type GaAs bend upward in the space charge region upon contact with aqueous $AgNO_3$ solution. The bending of the conduction band in this way leads to the generation of concentrated electrons on the surface of the n-GaAs substrate, which is beneficial to the fast reduction of $Ag^+$ ions needed to generate nucleic Ag nanoparticles on the surface of an n-GaAs wafer. In addition, the surface states (i.e., $E_1=E_{cb}-0.98$ eV for As sites and $E_2=E_{cb}-1.15$ eV for Ga sites) exist on the surface of GaAs wafers due to, for example, crystalline defects. Although the reducing ability of the surface states is lower than that of electrons, they can also quickly reduce $Ag^+$ to form Ag clusters at the initial stage of reaction. The reduction of $Ag^+$ ions by surface electrons and surface states at different rates may account for the formation of nucleic Ag particles with different sizes at the early stage of reaction. The conduction and valence bands of SI-GaAs exhibit similar bending behavior to that of n-GaAs except that the bending degree is smaller. The shallow bending induces a lower concentration of electrons on the surface of a SI-GaAs wafer, thus decreasing the number of Ag nuclei formed at the early stage of the reaction. In addition, the number of nuclei determines the density of final Ag structures in the as-prepared samples. The conduction and valence bands of p-GaAs bend downward in the space charge region when it is in contact with electrolyte. The downward bending causes the surface of a p-type GaAs wafer to be filled with concentrated holes (i.e., positive charges). As a result, the Ag nuclei formed on the p-GaAs wafers are mainly generated through the reaction between $Ag^+$ ions and surface states. The deficiency of surface electrons causes a very low number of nuclei to form on the p-GaAs wafers, and thus a low density of Ag structures in the final samples (FIGS. 5D-5F).

The nucleation reaction process for n-GaAs is illustrated in FIG. 1B. Once the surface electrons and surface states of a GaAs wafer are completely consumed, continuous deposition of Ag atoms for further growth of the Ag nuclei into large structures is mainly dominated by the hole-injection process. Each $Ag^+$ ion injects a hole into the lattice of the GaAs wafer through the Ag nuclei, because of the reduction potential of $Ag^+/Ag$ ($E_{Ag^+/Ag}$) being higher than the surface valence band of the GaAs at the concentration of the $AgNO_3$ solution. FIG. 1B illustrates the hole-injection process occurring during the growth of Ag plates. When a Ag ion reaches the surface of a Ag nucleus on the surface of the GaAs wafer, it releases a hole ($h^+$), converting the ion to a Ag atom, which deposits on the Ag nucleus. The hole travels through the Ag nucleus and injects into the lattice of the GaAs wafer. Then the hole diffuses to the surface region of the GaAs substrate, where it is not covered with Ag, to react GaAs with the assistance of water (from the $AgNO_3$ solution), resulting in the formation of oxides, namely, $Ga_2O_3$ and $As_2O_3$. As the hole-injection-induced reaction continues, more Ag atoms deposit on the nucleic Ag particle to expand its dimensions, while more oxide species from GaAs are generated to thicken the oxide layer. The formation of an oxide layer prevents the GaAs lattice from directly reacting with $Ag^+$ in solution. As a result, the $Ag^+$ ions are reduced on the surface of the Ag particle to enlarge their size rather than on the surface of the oxide layer to form new Ag nuclei. The adhesion between the oxide layer and Ag is weak and the oxide layer repels the Ag structure, forcing it to lay on the surface of the GaAs wafer—resulting in the growth of Ag structures out of the surface of the GaAs substrate as indicated in FIG. 1B. These effects lead to the formation of Ag structures with half-moon, platelike morphologies.

Formation of nanoplates with (111) basal surfaces, as shown in FIGS. 2A and 3A, lowers the surface energy of the resulting particles because the (111) facet planes represent the ones with the lowest surface energy. The independence of the morphologies of as-synthesized Ag structures of the growth time implies that the crystalline structures of the nuclei may also provide an additional driving force to grow the Ag structures into platelike morphologies. As the concentration of $AgNO_3$ decreases, the value of $E_{Ag^+/Ag}$ moves upward (in the negative direction) during the reaction. Once the concentration of the $AgNO_3$ solution is below a critical value, the hole-injection process will automatically cease because the value of $E_{Ag^+/Ag}$ is lower than the valence-band level of the GaAs. Accordingly, growth of the Ag structures is terminated.

A substantially continuous amorphous layer with a thickness of about 2 nm substantially covers the substrate surface except at the specific contact points with the nanoplates. The amorphous layer comprises oxides formed from semiconductor substrates, such as oxides of Ga and As in the case of a GaAs substrate. The oxide layer stops only at the contact point at which a nanoplate attaches to the semiconductor lattice at the defect site through a relatively tiny protruded post with size less than about 10 nm. On the other hand, the oxide layer is still continuous at other contact points associated with the same Ag nanoplate; that is, the oxide layer separates the Ag nanoplate and the GaAs lattices at these contact points. The Ag nanoplate grows from a small nucleus initially formed at the defect site and expands its dimension laterally into a two-dimensional plate. The necked morphology of the nanoplates with small contacts between the nanoplates and the semiconductor lattices as well as their large planar basal surfaces could be beneficial in preventing the corrosion of the substrate covered with metal nanoplates as used as a photoelectrode in a PEC. The direct contact between the metal nanoplates and the semiconductor lattices is important to support the hole injection process to grow the Ag nanoplates into different sizes and to provide charge transfer pathways in PECs.

Figure 7A:
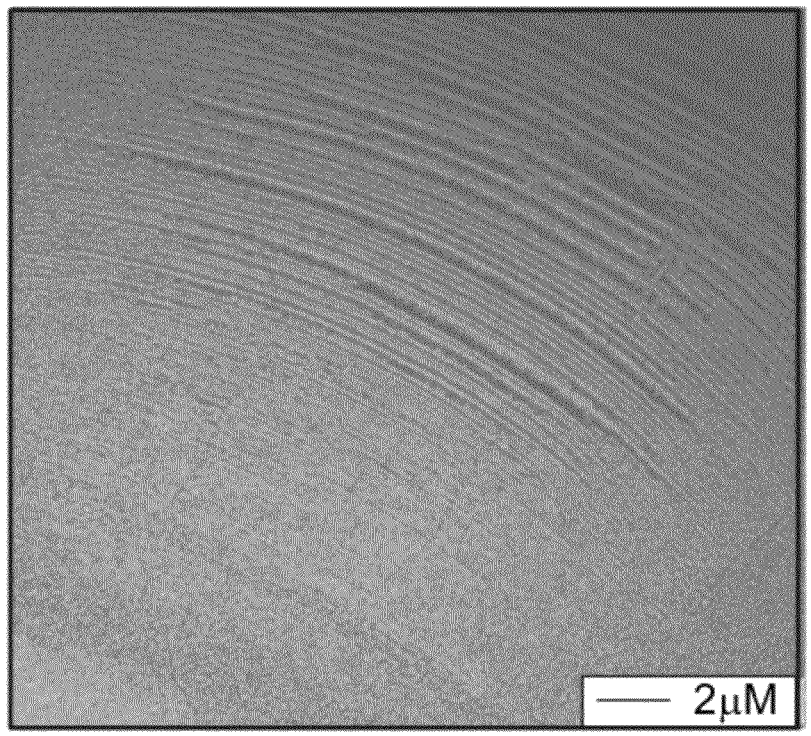
FIG. 7A shows a low-magnification SEM image of a typical sample showing the organization of the as-grown concentrically orientated Ag plates on a GaAs substrate.
Figure 7B:
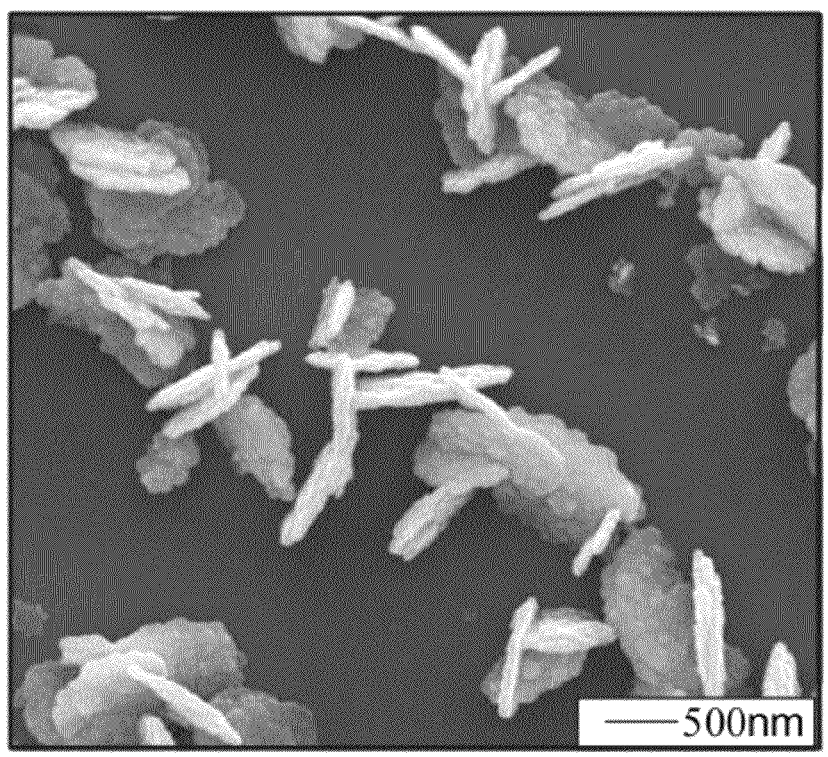
FIG. 7B is a high-magnification SEM image of the sample of FIG. 7A.

In at least the case of $AgNO_3$, the metal nanoplates formed through this approach can be assembled into concentric circles in the outmost region of the droplet of solution by controlling the evaporation of water from the solution. The evaporation moves the front line of the droplet to form series of circles through the so-called "coffee ring" effect. In a typical growth process in ambient environments, where the humidity is lower than the saturated pressure of water vapor, water in the solution evaporates continuously. The loss of water leads the solution droplet to shrink in volume, resulting in the movement of its front edge towards the central direction. As a result, plates are assembled in concentric circular arcs around the edge of the solution droplet. FIGS. 7A and 7B present low- and high-magnification SEM images of a typical sample showing the organization of the as-grown concentrically orientated Ag plates.

Figure 2C:
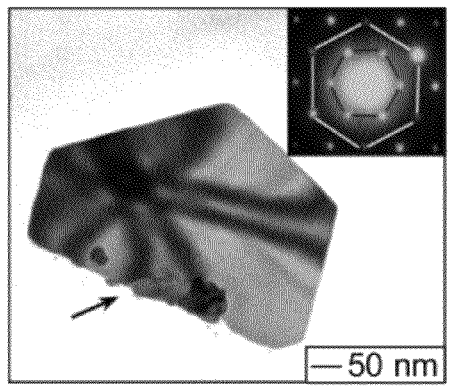
FIG. 2C shows a transmission electron microscopy (TEM) image of an individual Ag plate from the sample of FIG. 2A.
Figure 2D:
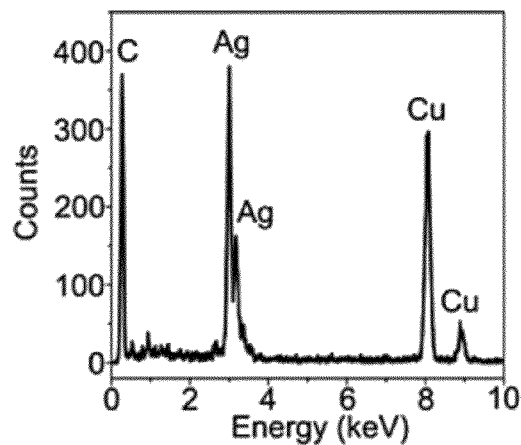
FIG. 2D shows an energy-dispersive X-ray spectroscopy (EDS) curve of the plate of FIG. 2C.

FIG. 2C shows a transmission electron microscopy (TEM) image of an individual Ag plate sitting on a TEM grid against one of its flat surfaces. The edge (indicated by the arrow) that sticks to the GaAs substrate is rough, whereas the edges out of the wafer surface are straight and sharp. The profile of the edges of the nanoplates is also confirmed by the SEM observations (inset of FIG. 2B). FIG. 2D shows an energy-dispersive X-ray spectroscopy (EDS) curve of the plate of FIG. 2C and exhibits strong peaks of Ag as well as C and Cu (from the TEM grid). The absence of both Ga and As demonstrates that the GaAs substrate does not contaminate the as-grown Ag nanoplates.

Figure 2E:
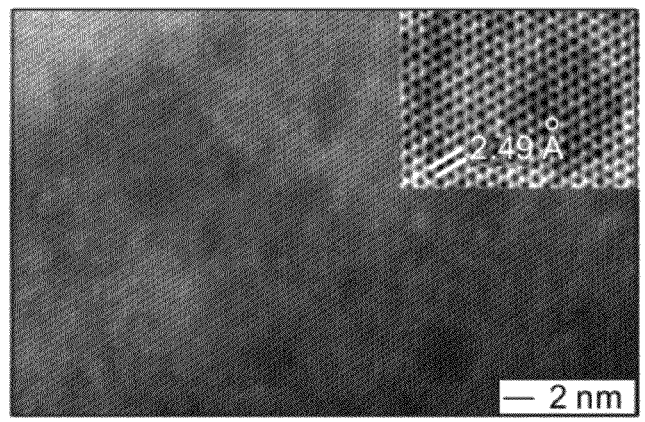
FIG. 2E shows lattice fringes of a high-resolution TEM (HRTEM) image of the plate of FIG. 2C.

Selected-area electron diffraction pattern obtained by focusing the electron beam perpendicular to the flat surfaces of the plate shown in FIG. 2C is presented in the inset of FIG. 2C. The formation of a hexagonal pattern indicates that the Ag nanoplates are crystallized in a face-centered cubic (fcc) lattice with the (111) flat surfaces. The outer set of diffracted spots marked with white lines corresponds to a lattice spacing of 1.44 Å and can be indexed to the {220} reflection of fcc silver. The inner set (marked with black lines) with a lattice spacing of 2.49 Å is believed to originate from the (⅓){422} reflection that is normally forbidden by an fcc lattice. The lattice fringes of high-resolution TEM (HRTEM) image of FIG. 2E of the nanoplates also exhibit a periodicity of 2.49 Å. The uniformity and continuity of the lattice fringes indicate the high level of crystallinity of the Ag nanoplates.

Figure 8A:
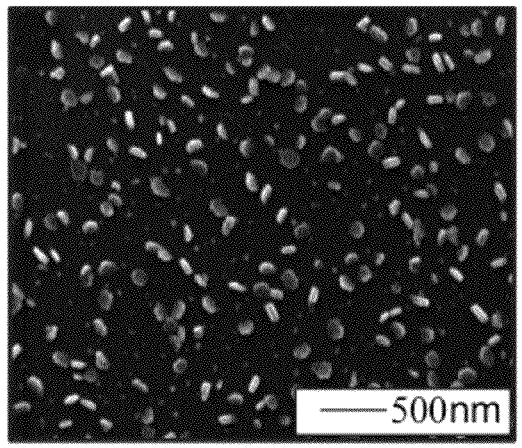
FIGS. 8A-8D show a series of SEM images of Ag structures formed on a n-GaAs substrate with a silicon concentration of $1.5\times10^{18}$ $cm^{-3}$ and terminating the reactions at different times, 5 seconds (FIG. 8A), 15 seconds (FIG. 8B), 30 seconds (FIG. 8C), and one minute (FIG. 8D)
Figure 8B:
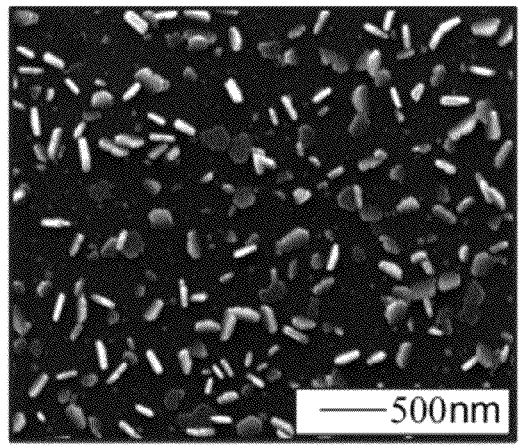
Figure 8C:
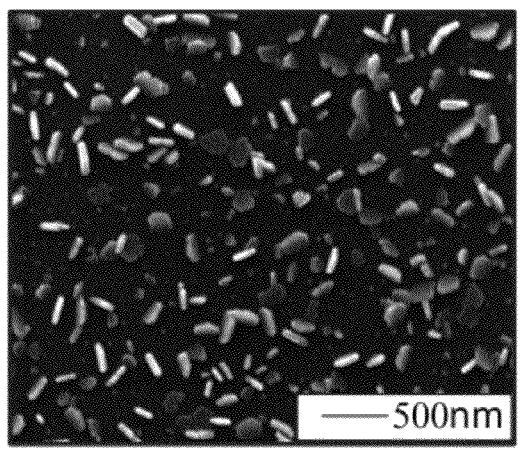
Figure 8D:
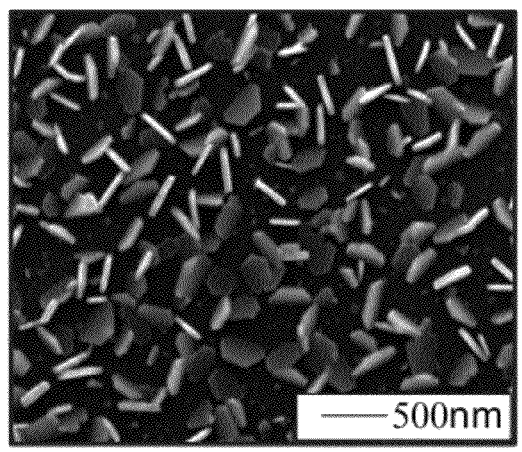

The growth of nanoplates can be tuned by controlling the reaction time. FIGS. 8A-8D show a series of SEM images of Ag structures formed on an n-GaAs substrate through reaction with a 1 M $AgNO_3$ and terminating the reactions at different times: (A) 5 seconds, (B) 15 seconds, (C) 30 seconds, and (D) one minute. Nanoplates with edge lengths of about 85 nm are formed at an early stage, a reaction time of 5 seconds (FIG. 8A). With increasing reaction time, the edge lengths of Ag nanoplates increase accordingly, whereas the thicknesses remain essentially constant. As a result, the sizes of the nanoplates grown via this approach are easily tuned by controlling the reaction time. The thicknesses of the plates are determined by the lateral dimensions of the nuclei formed at a very short reaction time.

The size as well of the thickness of the metal nanoplates on semiconductor substrates can be tuned. As shown in FIGS. 9A and 9B, the sizes of the metal nanoplates gradually increase with the growth time while the thicknesses increase stepwise at a certain stage. In this particular example, the plotted results reflect the samples of the Ag nanoplates grown on n-GaAs substrates through reaction with an 8 M $AgNO_3$ solution for varying times. The schematic illustration of FIGS. 10A-10D shows the major steps involved in the growth process of, for example, Ag nanoplates. Plate-like nanoparticles with very small sizes are formed on a semiconductor substrate, in this case, n-type GaAs, after the reaction between $AgNO_3$ and GaAs is initiated (i.e., growth time of several seconds). The crystalline structure of the clusters is believed to be important for the formation of the plates. Once the plates are derived, further reaction produces more Ag atoms to deposit on the peripheral edges of the plates due to their higher surface energies in comparison to the basal (111) surfaces, which are the most stable crystalline facets for fcc Ag crystals. This anisotropic growth results in an increase in the size of the nanoplates and substantially no change in their thickness. Because of a certain level of short-range textural relationship between the Ag nanoplates and the GaAs substrates, adjacent nanoplates with the same crystalline orientation start to polymerize into dimers when they become large enough (FIG. 10B). The partial contact between the two nanoplates of each dimer speeds up the deposition of Ag atoms to fuse the nanoplates together, resulting in the formation of a nanoplate with thickness twice that of the original nanoplates of the dimer (FIG. 10C). When the growth is allowed to continue, the concentration of $AgNO_3$ drops below a level to support the continuous anisotropic growth of nanoplates and only the most thermodynamically stable Ag grains with very small sizes are generated and deposited on both basal and edge surfaces of the nanoplates. This decoration results in the formation of nanoplates with larger thicknesses and rough surfaces as shown in FIG. 10D.

The growth of the nanoplates can further be controlled through illumination of the semiconductor substrate with electromagnetic radiation. For example, irradiation of a portion of the reaction area of the n-type GaAs substrate with a green laser or a synchrotron x-ray source inhibits the growth of Ag nanoplates in the illuminated regions and the nearby regions. On the other hand, the density of the Ag nanoplates in the dark regions is increased compared with samples formed in complete darkness. This is ascribed to the enhancement of the concentration of surface electrons in the dark regions generated though photoinduced charge separation and migration. The comparable effects of the green laser and x-ray irradiation on the growth of Ag nanoplates also implies that the interaction between x-rays and n-type GaAs wafers also generates accumulated holes in the valence bands of GaAs in the illuminated areas. In general, x-ray irradiation excites deep core levels of elements followed by relaxation through Auger processes or secondary photon emission, which creates a cascade of secondary electrons, holes, and photons. These secondary electrons and holes eventually thermalize to the band edges (i.e., electrons in the conduction bands and holes in the valence bands). The electrons and holes tend to migrate in the GaAs lattices and react with GaAs and $AgNO_3$. Because x-rays can penetrate the GaAs lattices deeply (i.e., greater than about 50 μm), the holes generated in the valence band in the bulk lattices take a relatively long time to isotropically diffuse along all directions to the surface of the substrate to oxidize GaAs with assistance of water. As a result, a relatively broad region around the x-ray beam is influenced by the holes generated in the illuminated area, resulting in the absence of Ag nanoplates.

Figure 18A:
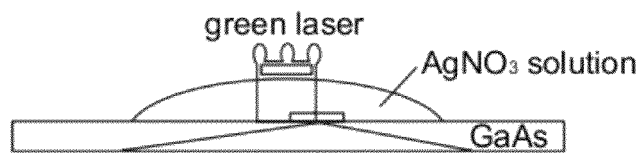
FIG. 18A shows a schematic for preparing samples with Ag nanoplates on an n-GaAs substrate partially irradiated by a green laser beam.
Figure 18B:
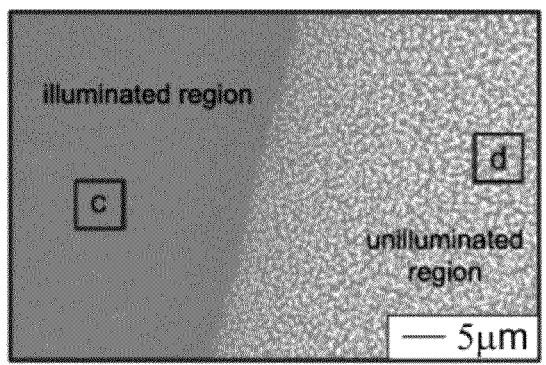
FIG. 18B shows an SEM image of a sample prepared after 10 minutes of reaction with a 0.1 M $AgNO_3$ solution using the setup of FIG. 18A.
Figure 18C:
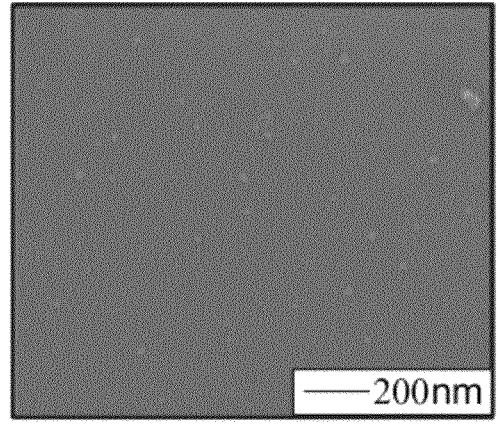
FIG. 18C shows an enlarged view of the sample of FIG. 18B at box c.
Figure 18D:
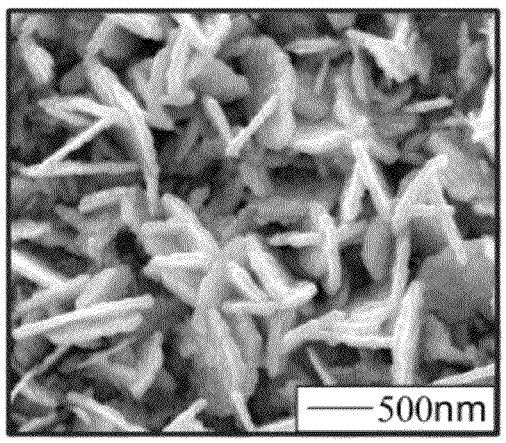
FIG. 18D shows an enlarged view of the sample of FIG. 18B at box d.
Figure 18E:
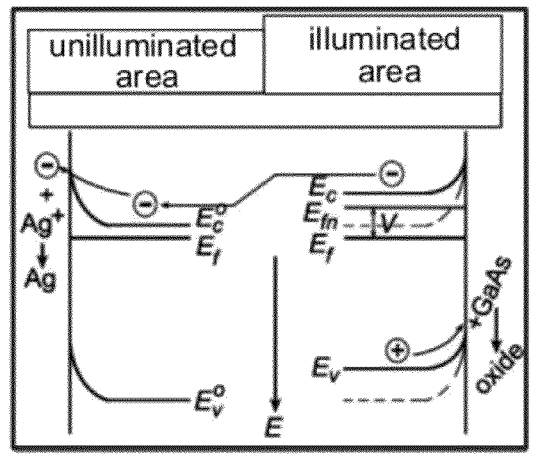
FIG. 18E shows the respective energy levels for the illuminated portion and dark portion of the GaAs substrate.

The technique is also applicable to direct growth of, for example, Ag nanoplates on p-GaAs substrates, with the assistance of illumination of the substrate. Reactions between the pristine n-GaAs wafers with $AgNO_3$, reveal that surface electrons of the n-GaAs wafers account for the nucleation process, while the growth of nuclei into Ag nanoplates is dominated by the hole injection process, FIGS. 1B and 12. The failure of this method to grow Ag nanoplates on p-GaAs substrates, as shown in FIGS. 5D-5F, is ascribed to the lack of surface electrons for the formation of enough nuclei. On the other hand, concentration of surface electrons can be tuned through illumination of a semiconductor substrate with a light having photon energy higher than the bandgap of the semiconductor. For example, illuminating an n-GaAs wafer decreases the density of its surface electrons, as shown in FIG. 18E, while illuminating a p-GaAs wafer increases the density of its surface electrons. As a result, a light source, for example, a red laser beam with wavelength of ~650 nm (i.e., 1.9 eV), can be used to increase the density of surface electrons of p-GaAs substrates (with bandgap of 1.42 eV) and to trigger the growth of Ag nanoplates on the illuminated surfaces.

The noble metal nanoplates may also be tuned to exhibit enhanced extinction peaks in the UV-visible-near infrared (NIR) regimes due to strong SPR. The coupling between the optical properties of nanoplates and the optical and electronic properties of semiconductor wafers may induce unique optical and electronic properties in the metal/semiconductor hybrid systems to enable them to find potential applications in photochemistry, photoelectrochemistry, photocatalysis, photovoltaic cells, photosplitting of water, etc. Nanostructures made of precious metals and semiconductor wafers have interesting optical properties because of their SPR and unique band structure, respectively. For example, the Ag nanoplates exhibit strong excitation peaks which are tunable from the visible to the NIR regime by controlling their dimensions. Ag nanostructures are usually a class of promising substrates for surface enhanced Raman scattering (SERS), in particular, when they have sharp edges and/or rough surfaces. Rough Ag nanoplates synthesized on GaAs substrates can efficiently enhance Raman signals of the in situ deposited oxides of GaAs. Similarly, the Ag nanoplates can also significantly increase Raman signals of interesting molecules attached to their surfaces.

Figure 11:
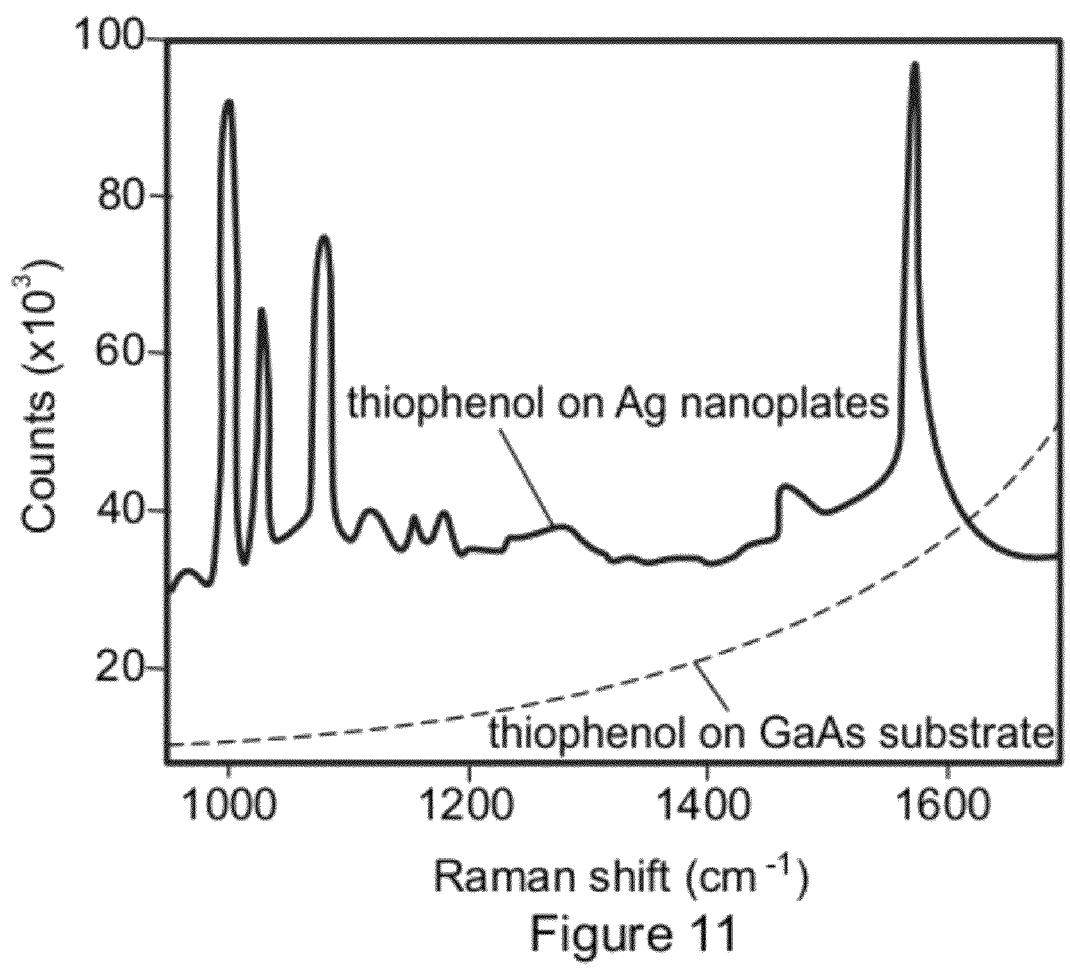
FIG. 11 is a graph of the Raman spectra of thiophenol molecules self-assembled on rough Ag nanoplates compared to a bare GaAs substrate.

For example, FIG. 11 compares the Raman spectra of thiophenol molecules on the surfaces of the Ag nanoplates with rough surfaces formed through a 10 minute reaction with 0.1 M AgNO$_3$ on a GaAs surface as shown in FIG. 3A. Thiophenol molecules spontaneously form self-assembled monolayers (SAMs) on the surfaces of the Ag nanoplates as well as the surface of clean GaAs substrate when the samples are dipped into an ethanol solution of thiophenol at room temperature. Focusing a laser beam on a selected area (with diameter of about 2.5 µm) of the Ag nanoplates covered with a SAM of thiophenol excites strong Raman signal of thiophenol molecules as depicted by the solid curve of FIG. 11. All the peaks are consistent with the fingerprint features of thiophenol molecules. On the other hand, it is difficult to record apparent Raman peaks (dashed curve, FIG. 11) for thiophenol molecules assembled on the GaAs surface. The tailing effect is ascribed to the strong fluorescence of the GaAs substrate. The significant difference between the two spectral curves of FIG. 11 confirms the capability of the rough Ag nanoplates for enhancing Raman signals of molecules adjacent to their surfaces. As indicated in the dashed curve in FIG. 11, GaAs wafers exhibit strong fluorescence in the NIR regime, overlapping the SPR spectra of the Ag nanoplates. Therefore, coupling between GaAs and Ag nanoplates can provide novel optical properties for various applications.

Additionally, the samples of semiconductor substrates covered with nanoplates that protrude out of the surfaces of the GaAs substrates allow high percentage of light to pass through to interact with the semiconductor substrate. The large surface areas of the nanoplates can also significantly enhance the dissipation efficiency of accumulated holes into electrolyte. Therefore, for example, Ag nanoplate/GaAs wafer composite structures, may serve as stable photoelectrodes for fabricating robust, highly efficient PEC cells for solar energy conversion. In addition to solar energy conversion, the holes accumulated in the metal nanoplates coupled with catalytic capabilities of the nanoplates may enable to catalyze specific useful reactions (for example, oxidation of ethylene to ethylene oxide, oxidation of pollutants, etc.) in electrolytes driven by the received solar energy.

The following non-limiting examples illustrate various aspects of preferred embodiments of the invention.

Example 1

Figure 12A:
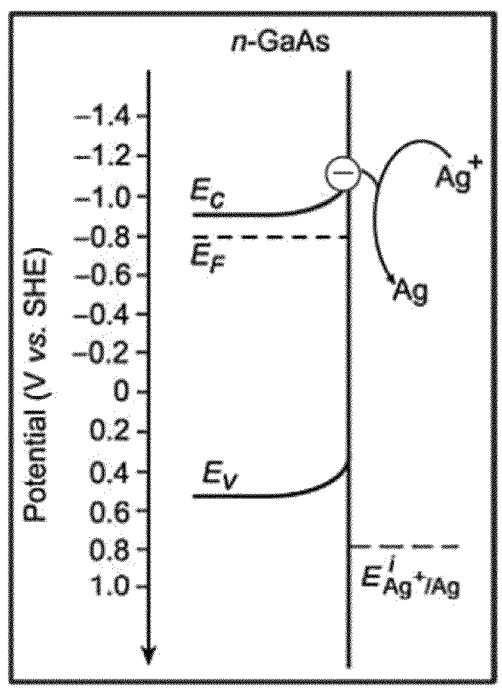
FIG. 12A shows a diagram of the energy levels of a n-GaAs substrate in contacts with a solution of $AgNO_3$ prior to coverage with Ag nuclei.
Figure 12B:
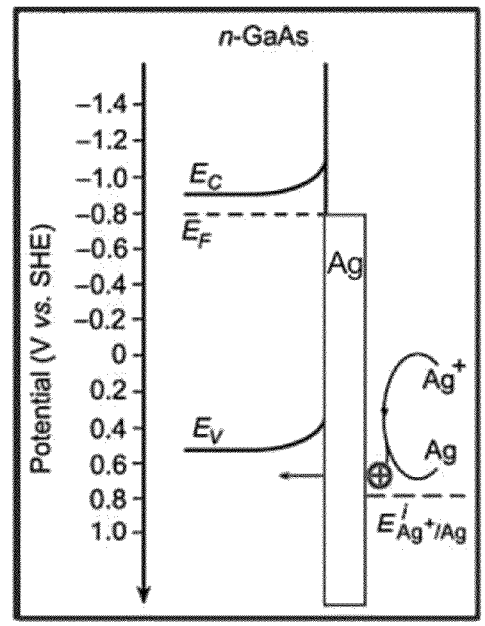
FIG. 12B shows a diagram of the energy levels of FIG. 12A after coverage with Ag nuclei.
Figure 12C:
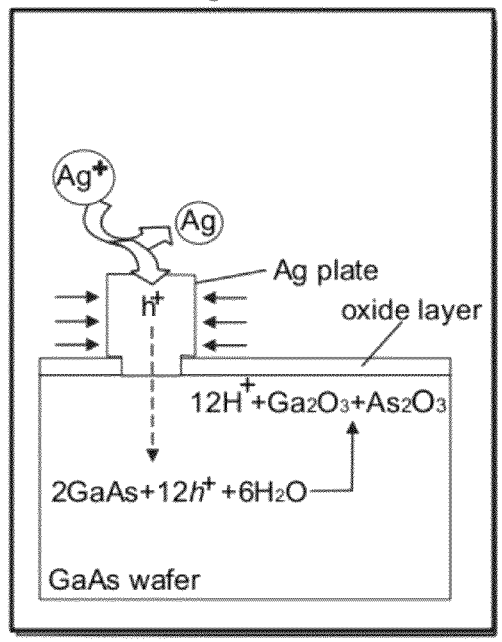
FIG. 12C shows a schematic of the hole injection process in formation of Ag nanoplates on a GaAs substrate.

With reference to FIGS. 12A-12C, the nucleation and growth of Ag nanoplates on an n-type single crystal GaAs substrate through reaction with a substantially pure aqueous solution of AgNO$_3$ is illustrated. In a typical synthesis, a droplet of aqueous solution of AgNO$_3$ with appropriate concentration, from about 0.1 M to about 10 M, is delivered to the surface of a piece of n-type GaAs wafer that has been cleaned by soaking in a dilute 2% hydrofluoric acid (HF) solution for 5 minutes. Contacting the GaAs wafer with AgNO$_3$ solution immediately leads to quick reduction of Ag$^+$ by the surface electrons (as shown in FIG. 12A), resulting in the formation of small Ag clusters (i.e., nuclei) on the nucleation sites (usually surface defects) on the GaAs surface. Once the nuclei are formed, hole injection process dominates the growth of the nuclei into larger Ag particles because the equilibrium potential (greater than or equal to 0.74 V versus NHE for AgNO$_3$ solutions with concentrations higher than 0.1 M) of Ag$^+$/Ag couple overlaps the valence band (with band edge of 0.32 V versus NHE) of GaAs in solution with pH=7 (as illustrated in FIG. 12B). The small Ag clusters, i.e., nuclei, mediate the hole transfer from the Ag$^+$ ions to the GaAs lattice and the deposition of newly formed Ag atoms.

As shown in FIG. 12C, when a Ag$^+$ ion reaches the surface of a Ag nucleus, it releases a hole (i.e., h$^+$) and transforms itself into an Ag atom. The Ag atom moves over the surface of the nucleus and condenses at a specific site with a locally maximum surface energy. The released hole travels through the Ag nucleus to reach the Ag/GaAs interface. Due to the overlap between the valence band of GaAs and the energy band of Ag, the hole can be injected into the lattice of the GaAs wafer. This hole continues to diffuse in the GaAs lattice to reach the surface area (due to band bending) uncovered with Ag nuclei to react with GaAs lattice with assistance of water, which is from the aqueous solution of AgNO$_3$. This reaction leads to formation of oxides (i.e., Ga$_2$O$_3$, As$_2$O$_3$ and their corresponding hydrates) of GaAs over the surface of the GaAs wafer. The overall chemical change involved in the hole injection process can be summarized as:

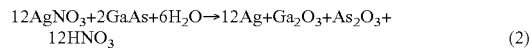

$$12AgNO_3 + 2GaAs + 6H_2O \rightarrow 12Ag + Ga_2O_3 + As_2O_3 + 12HNO_3 \quad (2)$$

According to equation (2), the AgNO$_3$ solution becomes acidic during the growth of the Ag nanostructures due to the generation of HNO$_3$. The strong acid HNO$_3$ is able to dissolve the oxides through

$$Ga_2O_3 + 6H^+ \rightarrow 2Ga^{3+} + 3H_2O \quad (3)$$

and

$$As_2O_3 + 3H_2O \rightarrow 2H_2AsO_3^- + 2H^+ \quad (4)$$

When the concentration of AgNO$_3$ solution is high enough, the growth rate of oxides becomes higher than the dissolution rate of oxides, resulting in deposition of an oxide layer on the GaAs surface. Transmission electron microscopy (TEM) (FIG. 13B), X-ray photoelectron spectroscopy (XPS) and Raman spectroscopy confirms the existence of oxides in the samples obtained through reacting n-GaAs wafers with AgNO$_3$ solutions with concentrations higher than 0.3 M.

The in situ formation of the oxide layer can eliminate progressive nucleation process to facilitate the anisotropic growth of the existing nuclei into larger particles. As the reaction continues, the band edge position of the valence band of the GaAs shifts downward towards a more positive value because of the decreasing pH value of the surrounding solution. In addition, the equilibrium potential of the Ag$^+$/Ag couple moves upward to a less positive value due to the decrease of the concentration of Ag$^+$. As a result, the hole injection process can automatically cease when the reaction time is long enough. The hole injection process (i.e., the growth of the Ag nanocrystals) can also be stopped by rinsing away the AgNO$_3$ solution at any time during the reaction.

Figure 13A:
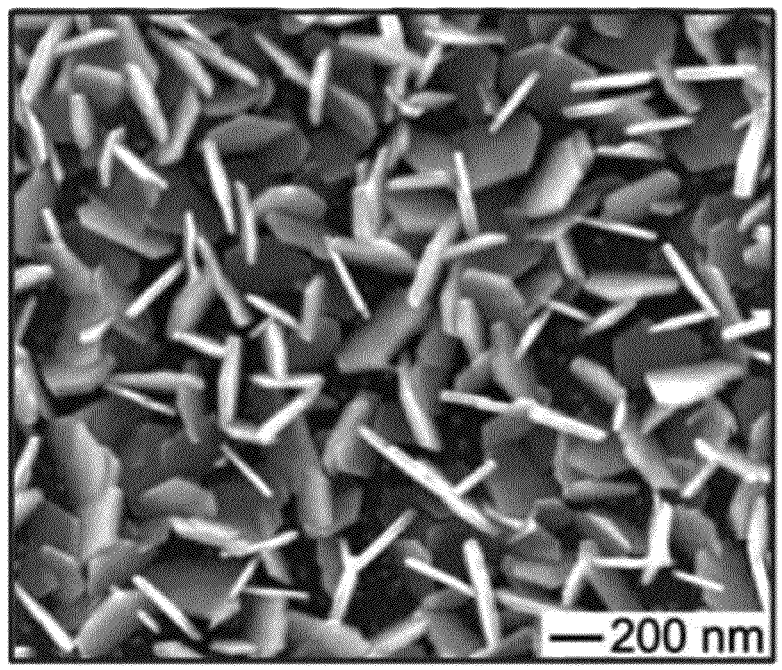
FIG. 13A shows an SEM image of a sample of a typical GaAs substrate with a doping concentration of $1.5 \times 10^{18}$ cm$^{-3}$ reacted with 1M $AgNO_3$.
Figure 13B:
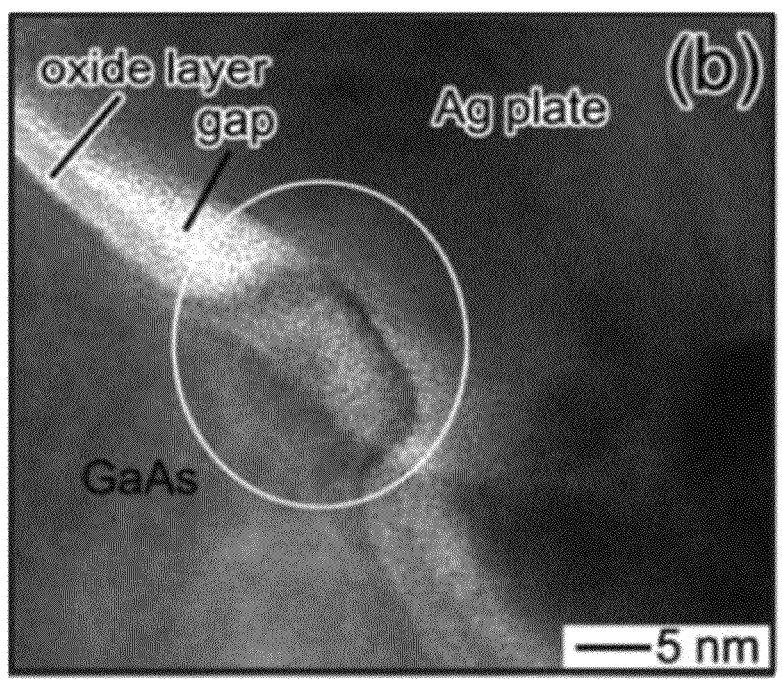
FIG. 13B shows a transmission electron microscopy (TEM) image of the cross section of a Ag nanoplate of the sample of FIG. 13A.

FIG. 13A shows an SEM image of a typical GaAs substrate with a doping concentration of $1.5 \times 10^{18}$ cm$^{-3}$ reacted with 1 M AgNO$_3$. The substrate is substantially covered with an assembly of Ag nanoplates protruding from the surface. The Ag nanoplates have substantially smooth surfaces and an average thickness of about 28±5 nm. The edge lengths of the Ag nanoplates vary in length from about 400 nm to about 500 nm.

Example 2

Figure 14A:
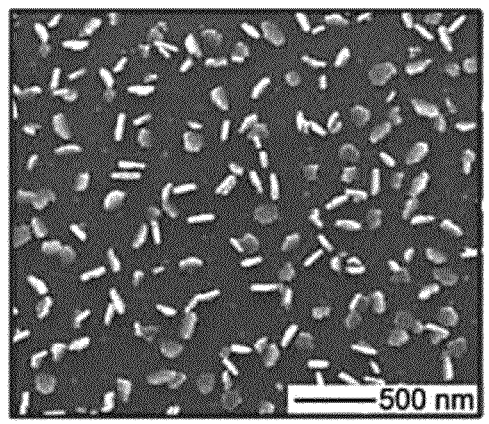
FIG. 14A shows an SEM image of a sample of the Ag nanoplates obtained by reacting an n-GaAs wafer with dopant (Si) concentration of $1 \times 10^{18}$ cm$^{-3}$ with a 2 M $AgNO_3$ solution for a growth time of 30 seconds.
Figure 14B:
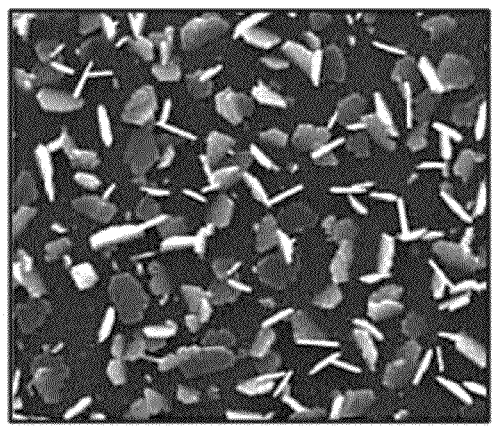
FIG. 14B shows an SEM image of a sample under conditions of FIG. 14A and a growth time of 60 seconds.
Figure 14C:
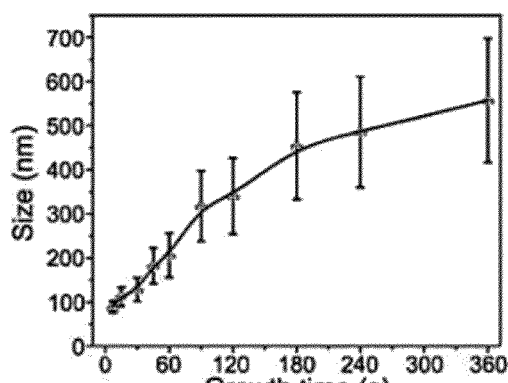
FIG. 14C shows a graph of the size of the Ag nanoplates formed under conditions of FIG. 14A in relation to growth time.

The size of the nanoplates can be tuned by controlling the growth time. FIGS. 14A and 14B compare the Ag nanoplates obtained by reacting n-GaAs wafers (with dopant concentration of $1\times10^{18}$ cm$^{-3}$) with a 2 M AgNO$_3$ solution for 30 seconds and 60 seconds, respectively. The nanoplate sizes, which are determined by measuring the lengths of the orthographic projections of individual nanoplates along their longitudinal axes in the surface of the substrate, increase from about 125 nm to about 210 nm with increasing growth time from 30 seconds to 60 seconds. On the other hand, the thicknesses of the nanoplates remain substantially constant at about 22 nm. The dimensional evolution of the Ag nanoplates upon growth time indicates that growing a Ag nanoplate may start with the formation of a Ag nucleus at a defect site of the GaAs surface because the defect site has higher surface energy, thus higher reactivity, than adjacent flat areas. The lateral dimension of the Ag nucleus may be consistent with the thickness of the resulting nanoplate and the nucleus may have many (111) twin planes. As a result, more Ag atoms derived from the hole injection process are deposited on the lateral surfaces of the nucleus to anisotropically enlarge the nucleus into a nanoplate with crystalline confinement of the multiple (111) twin planes. The preferable deposition of Ag atoms on the lateral surfaces is attributed to their surface energy higher than the basal (111) surfaces, which represent the most stable surfaces with the lowest surface energy for face-centered cubic (fcc) crystals. With increasing growth time, the sizes of the Ag nanoplates gradually increase as shown in FIG. 14C from about 100 nm to more than 500 nm. However, adjacent nanoplates can polymerize into oligomers (typically dimers and trimers) followed by fusion into thicker nanoplates when the growth time is sufficiently long enough.

Example 3

Figure 14D:
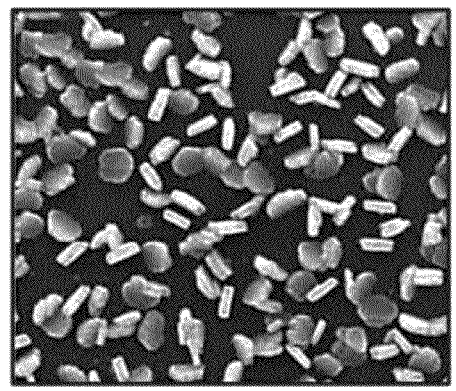
FIG. 14D shows an SEM image of a sample prepared through reactions with a 6 M $AgNO_3$ solutions for 60 seconds.
Figure 14E:
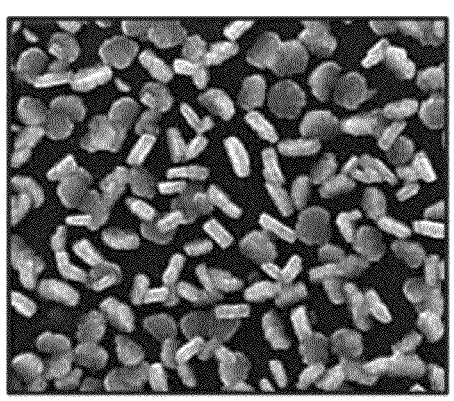
FIG. 14E shows an SEM image of a sample prepared through reactions with a 8 M $AgNO_3$ solution for 60 seconds.
Figure 14F:
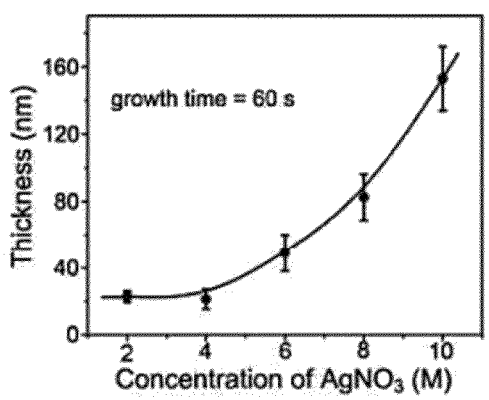
FIG. 14F shows a graph of the thickness of the Ag nanoplates obtained under sample conditions of FIG. 14B in relation concentration of $AgNO_3$.

The thicknesses of Ag nanoplates can also be finely tuned by controlling the concentration of AgNO$_3$ solution. Silver nanoplates with smooth surfaces can be achieved on the n-GaAs wafers by reacting with AgNO$_3$ solutions with concentrations ranging from 1 M to saturation concentration, about 10 M. FIGS. 14D and 14E show typical SEM images of the samples prepared through reactions with 6 M and 8 M AgNO$_3$ solutions for 60 seconds, respectively. The comparison between the samples grown with different concentrations of AgNO$_3$ solutions for the same time, 60 seconds, indicates that the thicknesses of nanoplates increase with concentrations of the AgNO$_3$ solutions but their sizes remain substantially constant. The independence of the sizes of the Ag nanoplates on the concentrations of AgNO$_3$ solutions implies that the rate for adding Ag atoms to the peripheral edge surfaces of the nanoplates is determined by the kinetics of the hole injection process rather than the diffusion of Ag$^+$ ions. In all the reaction systems, the sizes of the as-grown nanoplates increase with the growth time regardless of the concentration of AgNO$_3$. However, the as-grown nanoplates exhibit relatively large differences in thickness between the samples grown from AgNO$_3$ solutions with different concentrations. FIG. 14F plots the dependence of thickness on the AgNO$_3$ concentration, showing that the thicknesses of the Ag nanoplates increase with the AgNO$_3$ concentration higher than 4 M and is substantially constant, about 25 nm, when the concentration of AgNO$_3$ is between about 1 and about 4 M. Accordingly, adjusting the concentration of the AgNO$_3$ solution and the growth time together enables the capability to tune the thicknesses of Ag nanoplates in a continuous range from about 25 to about 160 nm.

Example 4

Figure 15:
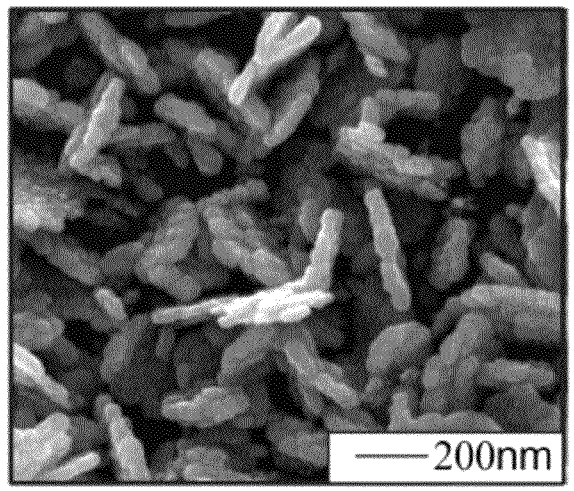
FIG. 15 shows an SEM image of the formation of Ag nanoplates with rough surfaces deposited on an n-GaAs substrate through reaction with a 0.1 M $AgNO_3$ for 10 minutes.

When the concentration of AgNO$_3$ is low, for example, less than about 0.3 M, the kinetics of the hole injection process do not support the anisotropic growth of Ag nanoplates with continuous lattices. Instead, rough Ag nanoplates constructed with an assembly of nanosize grains are generated. FIG. 15 is an SEM image of Ag nanoplates deposited on an n-GaAs substrate through reaction with 0.1 M AgNO$_3$ for 10 min, showing the formation of nanoplates with rough surfaces and thickness of about 50 nm. The increased surface roughness of the nanoplates increases their surface areas, which is beneficial to certain applications, such as catalysis and surface-enhanced Raman scattering.

Example 5

Figure 16:
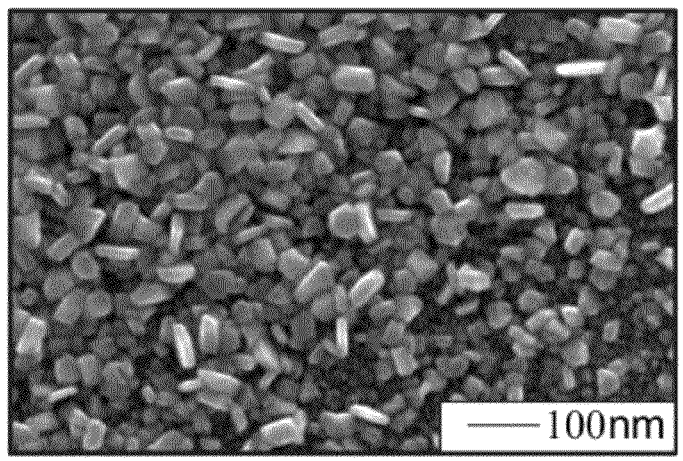
FIG. 16 shows an SEM image of the Pd nanoplates obtained by reacting an n-GaAs wafer with a 0.01 M $Na_2PdCl_4$ solution for 10 minutes at room temperature.

FIG. 16 shows an SEM image of the product obtained by reacting an n-GaAs wafer with a 0.01 M Na$_2$PdCl$_4$ solution for 10 minutes at room temperature. Pd nanoplates with thicknesses of about 20 nm and sizes of about 85 nm are deposited on the GaAs substrate. Particles with other morphologies are also generated during the growth. Many tiny nanoparticles, with sizes of less than about 10 nm, substantially cover the entire surface area of the GaAs substrate between the large nanoplates and the larger particles. The Pd sample is different from the samples of Ag nanoplates, of which the surface areas of the GaAs substrate between the Ag nanoplates are essentially clean. The formation of small Pd nanoparticles indicates that PdCl$_4^{2-}$ ions can continue to interact with the GaAs surface lattices during the hole injection process. The direct interaction between PdCl$_4^{2-}$ ions and the GaAs lattices induces the formation of new Pd nuclei, resulting in the progressive nucleation process. The difference between the samples of Ag and Pd may be attributed to the interdiffusion coefficient between Pd and GaAs being much higher than that of Ag and GaAs at room temperature. The fast interdiffusion (i.e., alloying) between Pd and GaAs can compensate for the energy barrier required for the formation of Pd nuclei including the generation of new Pd/GaAs interfaces and new Pd phase.

A low interdiffusion coefficient between metals and GaAs lattices is another criterion to well separate the nucleation and growth steps for growing anisotropic metal nanostructures. If a metal alloys with GaAs at a high rate, it is difficult to deposit metal nanostructures with anisotropic morphologies and controlled dimensions. For example, reactions between n-type GaAs and NaAuCl$_4$ solutions generate densely packed small Au nanoparticles with sizes of less than about 10 nm because Au and GaAs can easily form alloys, for example, $\gamma$-Au$_9$Ga$_4$ and AuGa, at room temperature.

Example 6

Figure 17:
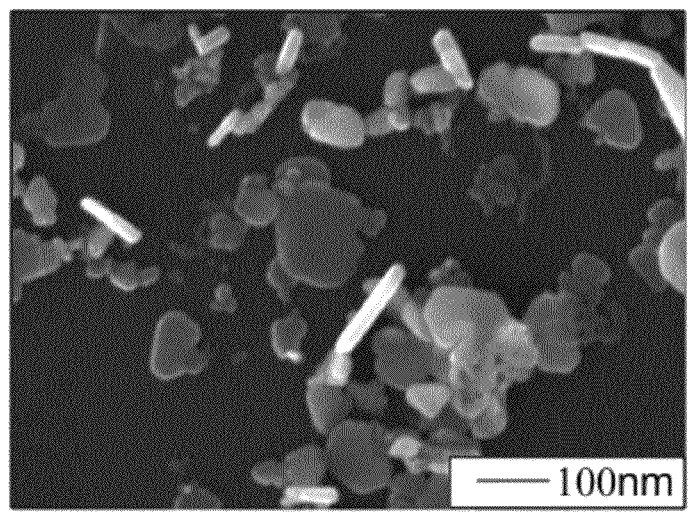
FIG. 17 shows an SEM image of the Ag nanostructures grown on an n-Si substrate produced through reaction between a (100) Si wafer (doped with P/Boron and wafer resistivity of 0-100 Ω·m) with a 1 M $AgNO_3$ solution for 30 minutes.

FIG. 17 shows an SEM image of the Ag nanostructures grown on an n-Si substrate produced through reaction between a (100) Si wafer, doped with P/Boron and a wafer resistivity of 0-100 Ω-m, with a 1 M AgNO$_3$ solution for 30 minutes. Most of the particles exhibit plate-like morphologies. Although some of the Ag plates stand out of the substrate surface, others lie on the substrate against their basal surfaces.

The clean surfaces between the nanoplates indicate that Ag is difficult to alloy with Si under the reaction conditions to induce progressive nucleation. The non-uniform distribution of the Ag nanoplates over the substrate surface is ascribed to that some Ag nanoplates moving on the substrate surface or flowing away into rinsing water when the sample is rinsed and dried. The fluctuation of the positions of the Ag nanoplates is due to the weak adhesion between Ag and Si.

Example 7

A droplet, about 15 μL, of an aqueous solution of $AgNO_3$ with concentration of 0.1M was delivered to the surface of a piece of n-type GaAs wafer with a Si dopant concentration of about $1.0 \times 10^{18}$ $cm^{-3}$ and a surface orientation of (100), cleaned by soaking in a 2% hydrofluoric acid (HF) solution for 5 minutes. With reference to FIG. 18A, once the $AgNO_3$ solution contacted the GaAs substrate, a green laser having a wavelength of 532 nm, with a flux of about $10^{18}$ photons/s, (Coherent® Verdi-V10 laser source) is immediately turned on to illuminate a portion of the reaction area. FIG. 18B shows an SEM image of a region boxed by the black rectangle in FIG. 18A, including both illuminated and dark surfaces, after 10 minutes of reaction time at room temperature. FIG. 18B shows a stark contrast around the edge of the laser beam, i.e., only sparse small nanoparticles with sizes of 20-40 nm are formed in the center of the illuminated region, as seen in FIG. 18C. On the other hand, FIG. 18D is an SEM image of the unilluminated region that is covered with dense nanoplates that protrude out of the surface of the GaAs substrate.

By considering the Gaussian distribution of power density of the laser beam, the existence of the sharp contrast in the image of FIG. 18B indicates that completely inhibiting the growth of Ag nanoplates requires illumination with power higher than a critical value. When illumination with power density is less than the critical value at the edge of the laser beam, the illumination does not completely depress the growth of the Ag nanoplates. Instead, only a decrease in the density and size of the as-grown Ag nanoplates, indicated by the contrast gradient at the left side of the bright region in FIG. 18B is observed. The nanoplates of the present example are of substantially pure Ag without contamination from the GaAs substrate. Similar to the structures obtained through reactions under dark conditions, the nanoplates shown in FIG. 18D also exhibit rough surfaces and a thickness of about 50 nm to about 70 nm and edge lengths of about 1 μm. However, the density of the Ag nanoplates of FIG. 18D is higher than that of the Ag nanoplates obtained under dark conditions. The increased density of the nanoplates is ascribed to the enhanced density of surface electrons in the dark area of the GaAs substrate when the reaction area is partially exposed to the laser beam, as depicted in FIG. 18E. Additional surface electrons facilitate the formation of more nuclei and thus produce more nanoplates with respect to the dark condition. The result is consistent with the Ag nanoplates grown on n-type GaAs wafers with various doping levels under dark conditions. That is, the density of the Ag nanoplates increases with the dopant concentration of n-type GaAs wafers, which determines the concentration of surface electrons.

Charge separation and migration induced by the illumination are illustrated in FIG. 18E. When an n-type GaAs wafer is in contact with an electrolyte, for example, aqueous $AgNO_3$ solution, the valence and conduction bands of the GaAs wafer bend upward in the space-charge region. Illuminating the electrolyte-wetted area of the GaAs wafer with a green laser reduces the bending degree of the valence and the conduction bands due to the photovoltage V. FIG. 18E shows, the electron quasi-Fermi level $E_{fn}$ under illumination is displaced from the equilibrium Fermi level $E_f$. The shift of energy levels in the illuminated area forces the photoinduced electrons in the conduction band of the illuminated GaAs to flow to the conduction band of the dark GaAs region though the bulk GaAs lattices, due to the energy difference of the conduction bands in different regions. The enriched electrons in the dark region diffuse to the surface and subsequently reduce the $Ag^+$ to elemental Ag, which may contribute to the formation of nuclei. Although the surface electrons can reduce $Ag^+$ to grow the nuclei into larger particles, further growth into nanoplates is dominated by a hole injection process. Each $Ag^+$ injects a hole into the lattice of GaAs though the Ag nuclei, resulting in the reduction of the $Ag^+$ into Ag and oxidation of GaAs into oxides.

The leftover holes in the valence band in the illuminated area cannot flow to the dark area because of the energy barrier. Accordingly, the holes diffuse to the illuminated surface to oxidize GaAs to form oxides, preventing the deposition of Ag in the illuminated area.

Example 8

Figure 19A:
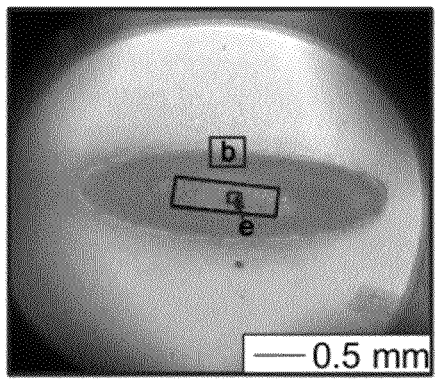
FIG. 19A shows an SEM image of Ag nanostructures grown on an n-GaAs wafer when a partial reaction area designated by the black rectangle is illuminated by an x-ray beam in the rectangle.

Illuminating an n-type GaAs wafer with high-energy photons, for example, synchrotron x-rays, that deeply penetrate GaAs lattices with a depth greater than about 50 μm, alters the growth of Ag nanostructures relative to samples that are not illuminated. FIG. 19A shows an SEM image of Ag nanostructures grown on an n-GaAs wafer when only a partial reaction area designated by the black rectangle is illuminated with x-rays. The experimental setup is similar to the setup of Example 7, as shown in FIG. 18A, except that x-ray irradiation is applied instead of the laser source. The experiments were conducted at the bending magnet beamline 12-BM-B at the Advanced Photon Source, Argonne National Laboratory. A 12 KeV beam with a flux of $3.8 \times 10^{10}$ photons/second modulated by a Si (111) monochromator is confined to 0.4 mm (vertical)×0.4 mm (horizontal) by slits and impinges on the GaAs wafer that is tilted by about 10° against the horizontal plane. A drop of 0.1 M $AgNO_3$ solution is delivered onto the GaAs wafer followed immediately by an exposure to x-ray irradiation. Once the x-ray beam is blocked, the reaction is terminated after about 30 seconds by rinsing the wafer with water.

Figure 19B:
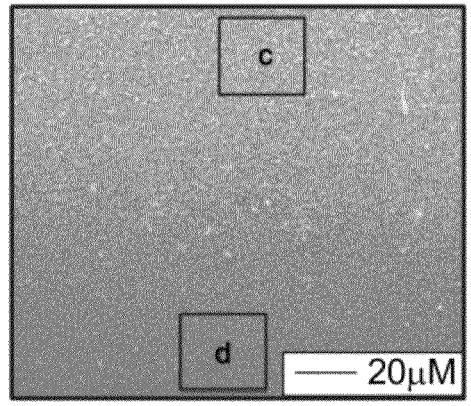
FIG. 19B is an enlarged view of FIG. 19A at box b.
Figure 19C:
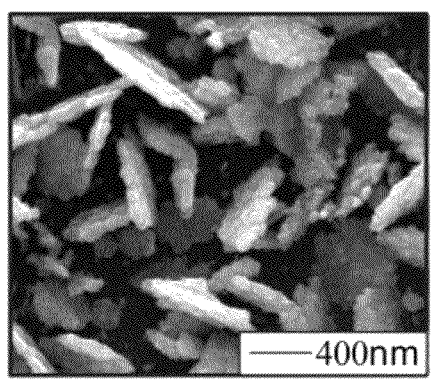
FIG. 19C is an enlarged view of FIG. 19B at box c.
Figure 19D:
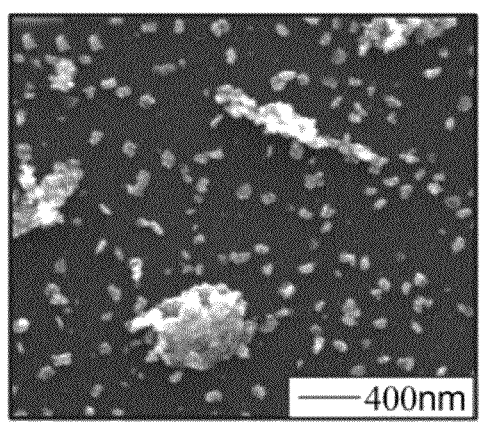
FIG. 19D is an enlarged view of FIG. 19B at box d.
Figure 19E:
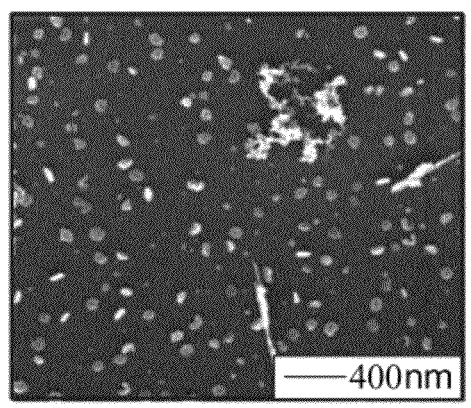
FIG. 19E is an enlarged view of FIG. 19A at box e.
Figure 19F:
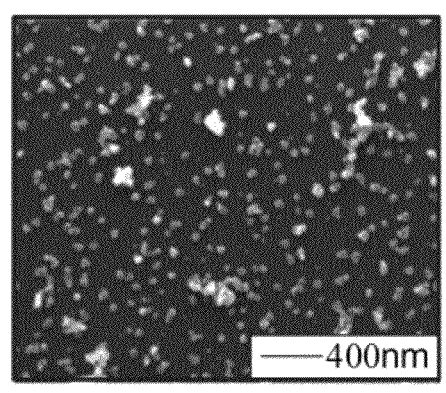
FIG. 19F is an SEM image of the Ag nanoparticles after 30 seconds of reaction time on an n-type GaAs wafer without x-ray illumination.

The SEM images of the resulting structure, FIGS. 19A and 19B show a contrast between the areas outside and inside the dashed ellipse after 11 minutes of reaction time (10.5 minutes with x-ray illumination followed by 0.5 minute reaction without x-ray illumination). Close observation of the bright region marked with box c in FIG. 19B shows the formation of dense Ag nanoplates, further depicted in FIG. 19C, which are similar to the nanoplates formed on GaAs wafers under dark conditions. However, the side that is marked with box d in FIG. 19B and the center of the area inside the dashed ellipse, marked with box e in FIG. 19A, are covered with only small particles, as shown in FIGS. 19D and 19E, and have a similar size of the nanoparticles shown in FIG. 19F formed on a GaAs wafer with a reaction time of 30 seconds and without x-ray illumination. Therefore, the small nanoparticles formed inside the dashed ellipse in FIG. 19A are likely deposited after the x-rays are blocked. The result indicates that the x-rays generate a similar effect of blocking the formation of Ag nanoplates in the illuminated area to the green laser. However, the density of the nanoparticles of FIG. 19E, $1.8 \times 10^9$ $cm^{-2}$, is much lower than the density of the nanoparticles of FIG. 19F, $4.5 \times 10^9$ $cm^{-2}$. The decreased density can be ascribed to the partial coverage of the oxide layer, which is formed upon x-ray irradiation on the illuminated surface of the GaAs substrate.

Example 9

An n-type GaAs wafer with a (100) crystalline surface orientation and Si dopant concentration of about $1\times10^{18}$ cm$^{-3}$ was cut into 36 mm$^2$ square pieces along their cleavage planes (i.e., $0\bar{1}\bar{1}$ and $0\bar{1}1$). The small shards were cleaned by immersing them in a 2% hydrofluoric acid (HF) aqueous solution for 5 minutes to remove the native oxides from their surfaces. The substrates were then rinsed with plenty of deionized water followed by drying with N$_2$ flow. The cleaned substrates were used to react aqueous solutions of AgNO$_3$ within 1 hour in an ambient environment to avoid regeneration of the native oxides. The AgNO$_3$ solutions of varying concentrations were freshly prepared by dissolving appropriate amounts of AgNO$_3$ in deionized water before the reactions were carried out. The reactions were carried out in a similar procedure to those previously described. In a typical reaction, a droplet (about 6 µL) of AgNO$_3$ solution was delivered to the central area of the flat surface of a cleaned GaAs substrate with a micropipet. The substrate was covered with a black cap to eliminate the effect of light illumination and evaporation of water during the reaction. The reaction was terminated by immersing the GaAs wafer in a large volume, about 1 L, of water to remove excess AgNO$_3$. The substrate was rinsed with deionized water and dried with gentle N$_2$ flow.

FIGS. 20A-20F and FIGS. 21A and 21B show a series of SEM images of the Ag nanostructures formed on the GaAs substrates after exposure to 8 M AgNO$_3$ for various times. Plate-like Ag nanoparticles with a uniform thickness of about 42 nm and a density of about $2.5\times10^9$ cm$^{-2}$ are deposited on the wafer even when the reaction time is as short as 5 seconds, FIG. 20A. Most of the nanoplates exhibit rounded hexagonal profiles and a small portion of them exhibit other profiles, such as triangles and pentagons. Substantially all of the nanoplates protrude out of the surface of the substrate although most of the basal surfaces of the nanoplates are not substantially perpendicular to the surface of the substrate. The fluctuation of surface orientations of the nanoplates with regard to the wafer surface may be caused by the actions of rinsing and blowing during sample preparation.

Figure 20A:
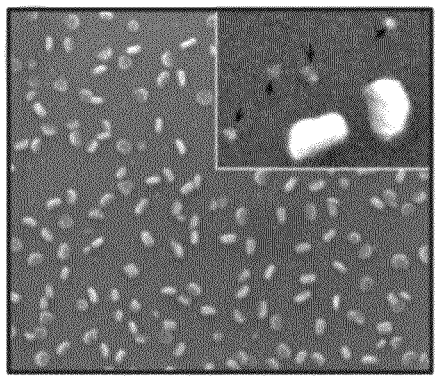
FIGS. 20A-20F show a series SEM images of Ag nanoplates on n-GaAs wafers through reaction with an 8 M $AgNO_3$ solution for various reaction times.
Figure 20B:
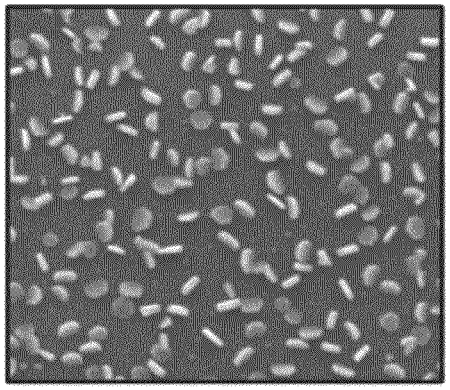

The sizes of the nanoplates are compared by measuring the lengths of the orthographic projections of individual nanoplates along their longitudinal axes in the surface of the substrate. The average size of the nanoplates as shown in FIG. 20A according to this treatment is determined to be about 95 nm and the standard deviation is about 9 nm. In the early growth stage (i.e., growth time of 0-30 seconds), the thicknesses of the nanoplates remain essentially constant and only the sizes increase. For example, the size of the nanoplates increases to about 139±6 nm when the growth time is prolonged to 15 seconds, FIG. 20B. Individual nanoplates shown in FIGS. 20A and 20B are well-separated.

Figure 20C:
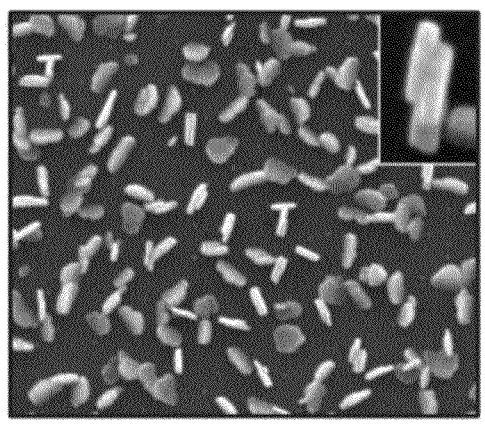

Some adjacent nanoplates tend to polymerize into dimers when they continue to grow in size. As shown in FIG. 20C, many dimers (highlighted by arrows) appear in the sample formed after 30 seconds of reaction time. The polymerization process is ascribed to the fact that both plates of each dimer have the same crystalline orientation on the GaAs substrate. The orientations of the as-grown Ag nanoplates are not completely random on the surface of the single-crystalline GaAs substrate. Some of the nanoplates orient along certain specific crystalline directions in short ranges. As highlighted in the inset of FIG. 20C, the two plates of the dimer do not have the same size and only contact with partial surfaces. Once the polymerization process starts, both plates of each dimer quickly grow in size to match each other, resulting in the formation of an integrated nanoplate with uniform thickness equal to the sum of that of the two original nanoplates.

Figure 20D:
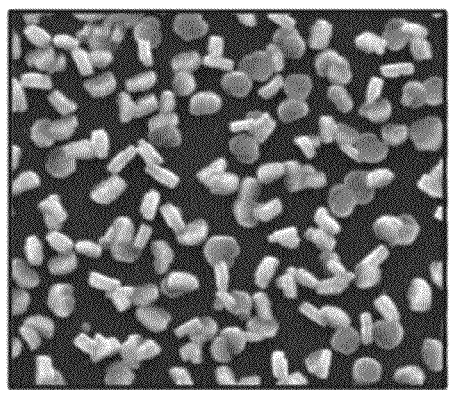
Figure 20E:
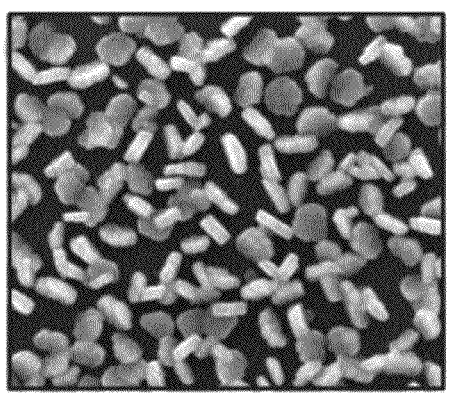
Figure 20F:
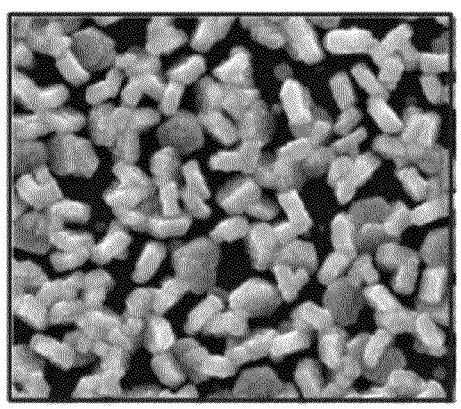
Figure 21A:
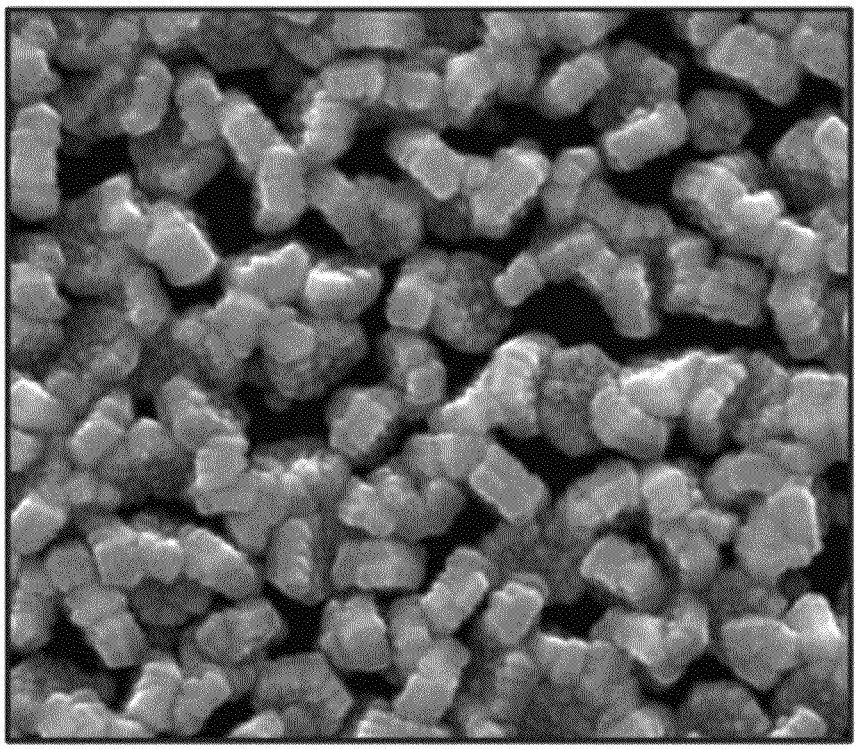
FIGS. 21A and 21B show SEM images of Ag nanoplates on n-GaAs wafers through reaction with an 8 M $AgNO_3$ solution for various reaction times.
Figure 21B:
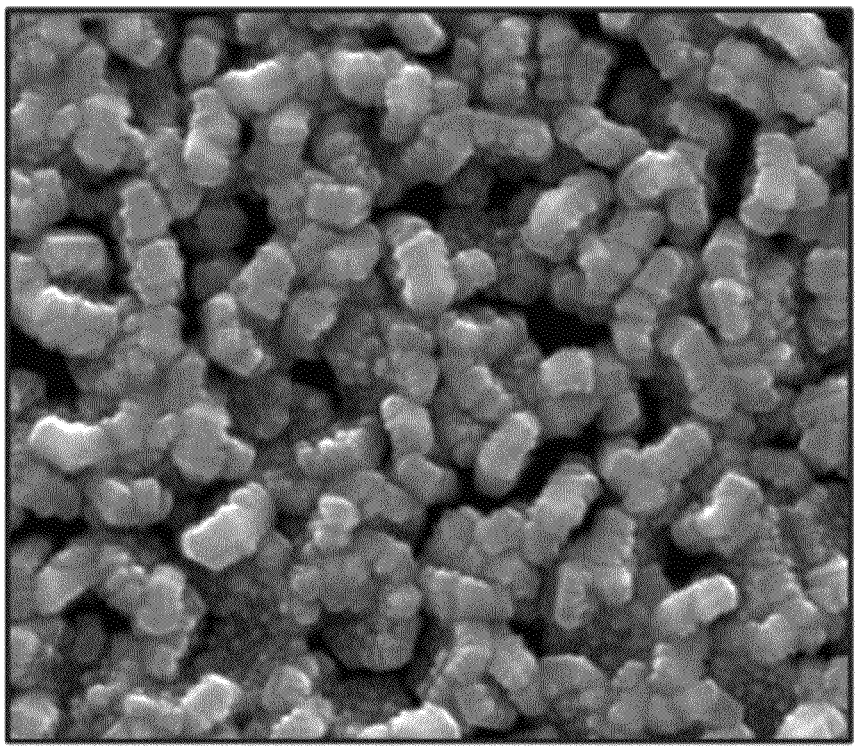

The sample formed at 45 seconds, FIG. 20D, is composed of nanoplates with an average thickness of about 80 nm, which is approximately twice the average thickness of the nanoplates formed before polymerization. The thick nanoplates shown in FIG. 20D continuously grow in size while retaining the same thickness until a growth time of about 60 seconds, shown in FIG. 20E. FIGS. 20F and FIG. 21A show that additional reaction time increases the sizes of the nanoplates as well as their thicknesses. The nanoplates obtained at 90 seconds and longer times exhibit rough surfaces, which are decorated with small nanocrystalline grains. The deposition of small grains on the surfaces of the nanoplates is ascribed to the decrease of concentration of AgNO$_3$ during the reaction. A low concentration of the AgNO$_3$ solution, in general, leads to low chemical potential of the reaction system, resulting in difficulty in continuing the anisotropic growth of smooth Ag nanoplates that may require high chemical potential.

Statistical analyses of the parameters of the Ag nanoplates derived from the SEM images are compared in FIGS. 9A-9D. FIG. 9A shows that the sizes of the Ag nanoplates gradually increase from about 95 nm to about 330 nm with increasing growth time of 5 seconds to 120 seconds before the nanoplates coalesce into the substantially semi-continuous film shown in FIGS. 21A and 21B. Evolution of the thicknesses of the nanoplates during the reaction is given in FIG. 9B, showing the existence of two plateaus followed by a gradual increase. The first plateau corresponds to the nanoplates with thicknesses of about 40 nm formed at short growth time (i.e., 0-30 seconds), where the thicknesses of the original nanoplates of each dimer formed at 30 seconds are used in the statistical evaluation. Polymerization of the nanoplates into dimers followed by fast growth leads to a step increase of the thicknesses of the nanoplates to the second plateau, which corresponds to the samples dominated by the nanoplates with thicknesses of about 80 nm, two times the value for the first plateau. The thicknesses of the nanoplates formed at growth times greater than 60 seconds show a gradual increase with growth time because of deposition of fine Ag nanocrystalline grains on their surfaces in a layer-by-layer fashion as shown in FIGS. 20F and 21A.

Figure 22A:
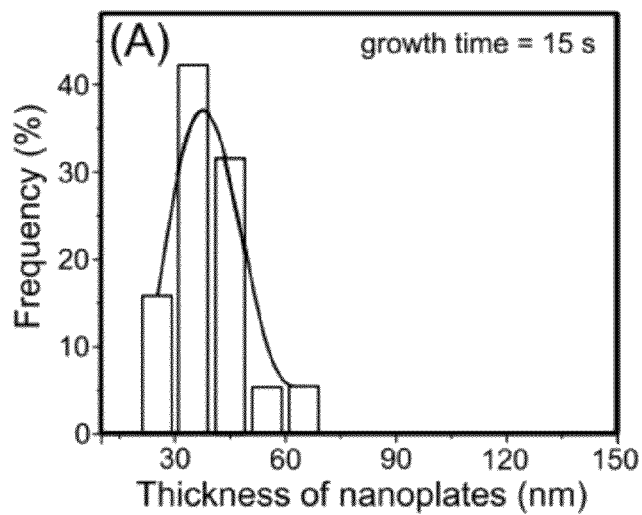
FIG. 22A shows histograms of the thicknesses of Ag nanoplates of FIG. 20B.
Figure 22B:
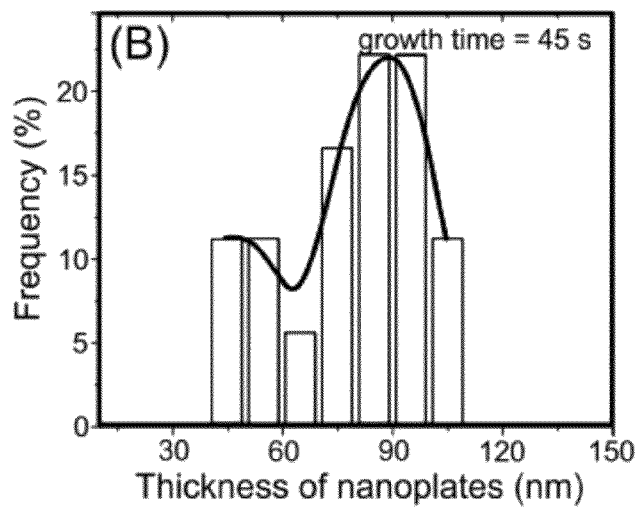
FIG. 22B shows histograms of the thicknesses of Ag nanoplates of FIG. 20D.
Figure 22C:
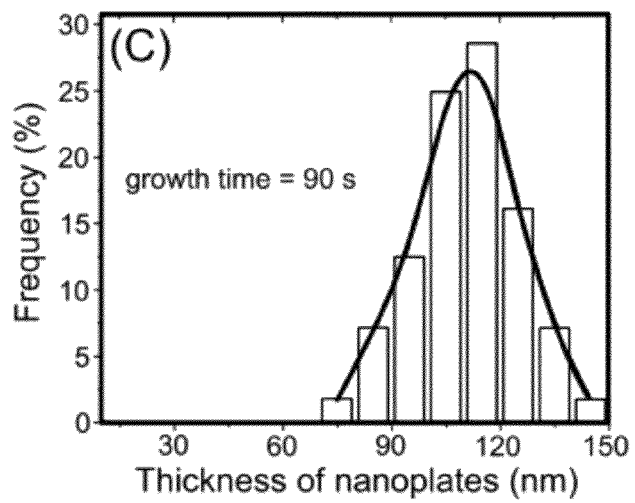
FIG. 22C shows histograms of the thicknesses of Ag nanoplates of FIG. 20F.

The decoration with small Ag grains provides a convenient approach to increase the surface area of the resultant nanoplates, leading to various potential applications including surface-enhanced Raman scattering (SERS), photocatalysis, etc. With reference to FIGS. 22A-22C, the distributions of the thicknesses of the nanoplates obtained at various growth times are plotted in histograms. The results of the statistical analysis based on the measurements of at least 200 nanoplates for each sample show that the majority of the nanoplates in each sample have one or two dominating thicknesses. As shown in FIG. 22A, the thicknesses of the nanoplates formed at 15 seconds of reaction time exhibit a narrow distribution with only one peak at about 40 nm, indicating essentially no polymerization of nanoplates happens at short growth times. Continuous growth of the nanoplates induces the polymerization of adjacent nanoplates with the same crystalline orientation into dimers, which grow and fuse into nanoplates with a thickness twice that of the original nanoplates. When only a portion of the nanoplates polymerize and fuse, the thicknesses of the nanoplates in the resulting sample should exhibit bimodal peaks: one peak corresponds to the thickness of the original, unpolymerized nanoplates and the other peak corresponds to the polymerized and fused nanoplates. For example, FIG. 22B shows that the sample formed at 45 seconds has two peaks located at about 43 nm and at about 88 nm, which is approximately a two-fold relationship. Once the growth time is long enough, all the pairs of adjacent nanoplates polymerize and fuse into thicker nanoplates, leading to a sample consisting of nanoplates with one dominating thickness again. FIG. 22C shows only one peak at about 110 nm for the sample formed at 90 seconds. The shift of the peak position to the right side compared with the right peak in FIG. 22B is ascribed to the deposition of fine Ag grains on the surfaces of the nanoplates.

The polymerization and fusion of adjacent nanoplates can cause a decrease in the density of nanoplates. Variation of the density of the Ag nanoplates formed at different growth times is illustrated in FIG. 9C. It is notable that the density of the sample formed at 60 seconds does not drop to the half-value of the density of the sample formed at 5 seconds although the average thicknesses of the nanoplates in these two samples exhibit a two-fold relationship. This can be attributed to the small particles (indicated by the arrows in the inset of FIG. 20A) existing in the samples formed at the beginning stage that grow into nanoplates at longer times. These small particles are not counted for the sample formed at 5 seconds. When the growth time increases from 60 seconds to 90 seconds, the density of the nanoplates continuously decreases due to further fusion between nanoplates. The existence of nanoplates with thicknesses larger than 120 nm in the sample shown in FIG. 22C may suggest that further polymerization of the nanoplates with thicknesses of about 85 nm and those with thicknesses of about 40 nm happens at growth times longer than 60 seconds.

FIG. 9D shows the approximate mass of deposited Ag for the samples formed at different growth times. This calculation ignores the variation of the profiles of the nanoplates and assumes that all the nanoplates have a circular profile and diameters with the same sizes indicated in FIG. 9A. FIG. 9D shows that the $Ag^+$ ions are continuously reduced with an increase of growth time. The S shape of the fitted curve indicates that the reduction rate of $Ag^+$ ions varies during growth. In the region of stage I, the reduction rate is slow. The reduction rate significantly increases in the region of stage II, which is dominated by polymerization and fusion of adjacent nanoplates. The rate drops again in the region of stage III mainly due to a decrease of concentration of $AgNO_3$. The increased reduction rate in stage II confirms that the formation of dimers of adjacent nanoplates with partial contacts boosts the reaction between $Ag^+$ ions and GaAs.

Example 10

The Ag nanoplates grown on GaAs wafers also exhibit tunable extinction peaks in the ultraviolet (UV)-visible-near infrared (NIR) regimes due to their strong SPR. The coupling between the optical properties of Ag nanoplates and the optical and electronic properties of GaAs wafers may induce unique optical and electronic properties in the metal/semiconductor hybrid systems for applications in photochemistry, photoelectrochemistry, photocatalysis, photovoltaic cells, photosplitting of water, etc. The Ag nanoplates grown on the GaAs wafers according to Example 9 display intense extinction peaks in the UV-visible-NIR spectral regimes.

Figure 23:
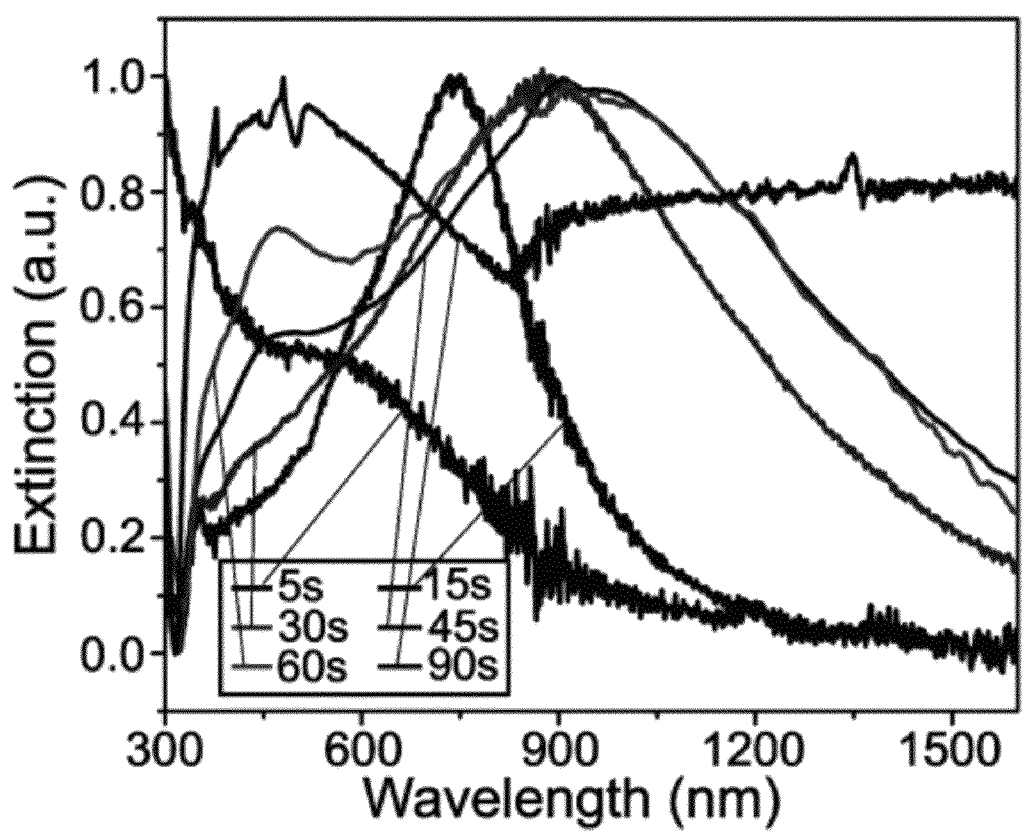
FIG. 23 plots the extinction spectra of the Ag nanoplates formed at various growth times as shown in FIGS. 20A-20F.

FIG. 23 plots the extinction spectra of the Ag nanoplates formed at different growth times. The small nanoplates formed at 5 seconds exhibit a tailed peak at about 554 nm with weak intensity. The peak becomes stronger and relatively symmetric and shifts to the red when the nanoplates grow in size. For example, the extinction peak of the nanoplates formed at 15 seconds appears at 745 nm. This peak is attributed to the in-plane dipole resonance. An additional peak at 355 nm with weak intensity also appears due to the out of-plane quadrupole resonance. Continuous growth in sizes of the nanoplates shifts the in-plane dipole resonance peak further to the red, while the out-of-plane quadrupole resonance peak does not significantly shift, for example, see the trace for the sample formed at 30 seconds.

When the thicknesses of the nanoplates are doubled through the polymerization and fusion process of adjacent nanoplates, a new peak around 475 nm appears due to the strong in-plane quadrupole resonance. The spectra for the samples formed at 45 seconds and 60 seconds show the existence of the in-plane quadrupole resonance peaks in addition to the slightly red-shifted in-plane dipole resonance peaks and the out-of-plane quadrupole resonance shoulder peaks. These fingerprinting peaks disappear when further growth forces the nanoplates to coalesce to form semi-continuous films. Fine features with sharp peaks (see the trace for the sample formed at 90 seconds) appear in the range of 350-550 nm due to strong coupling between the nanoplates.

Figure 24A:
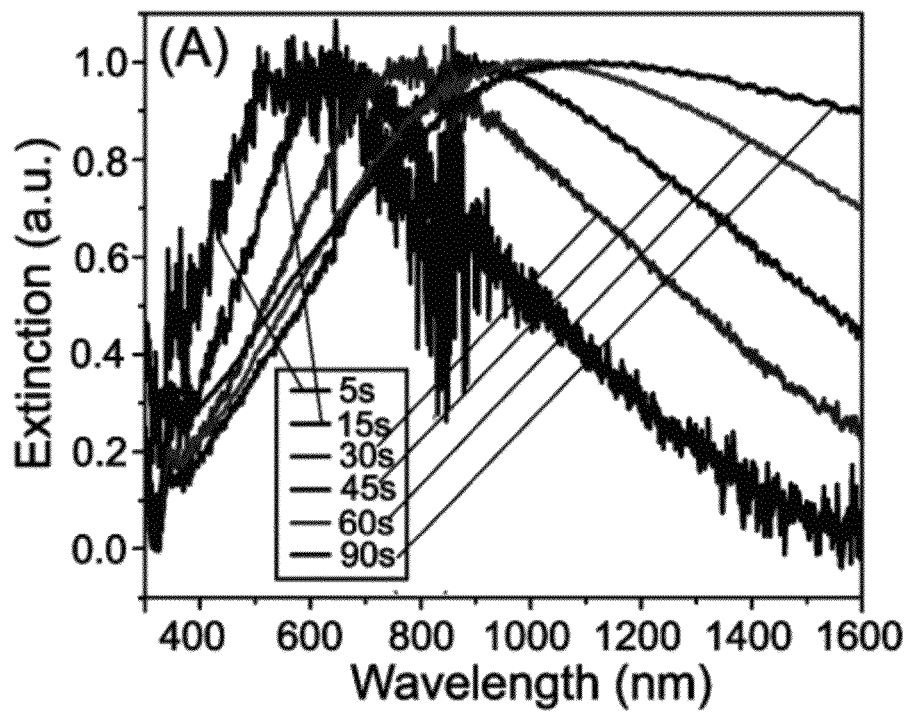
FIG. 24A-24C show comparisons of the extinction spectra of the Ag nanoplates grown through reaction of 2 M $AgNO_3$ solutions on n-GaAs substrates for various reaction times.
Figure 24B:
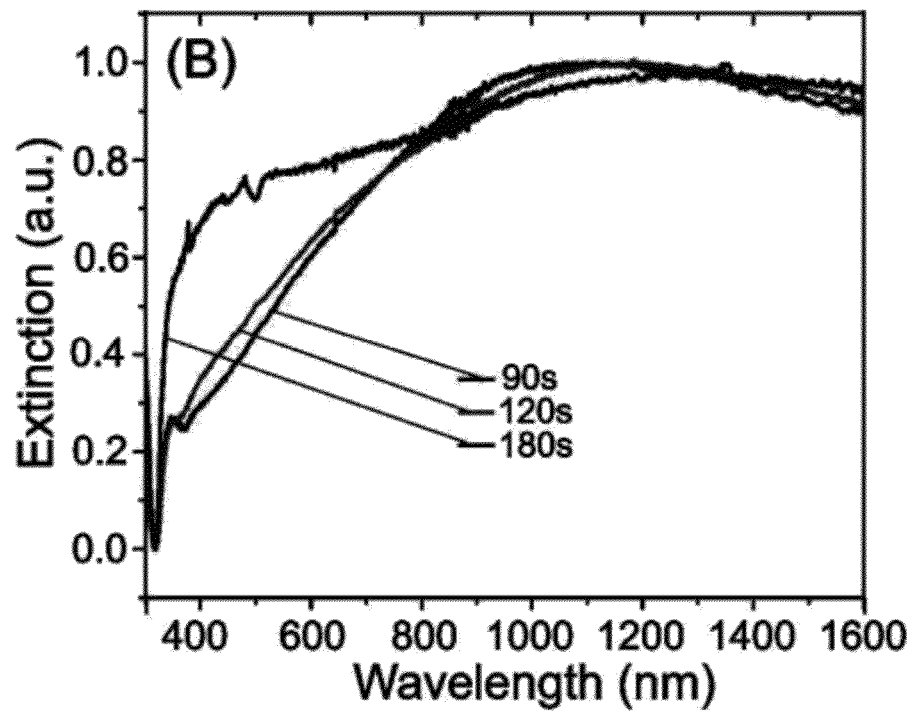
Figure 24C:
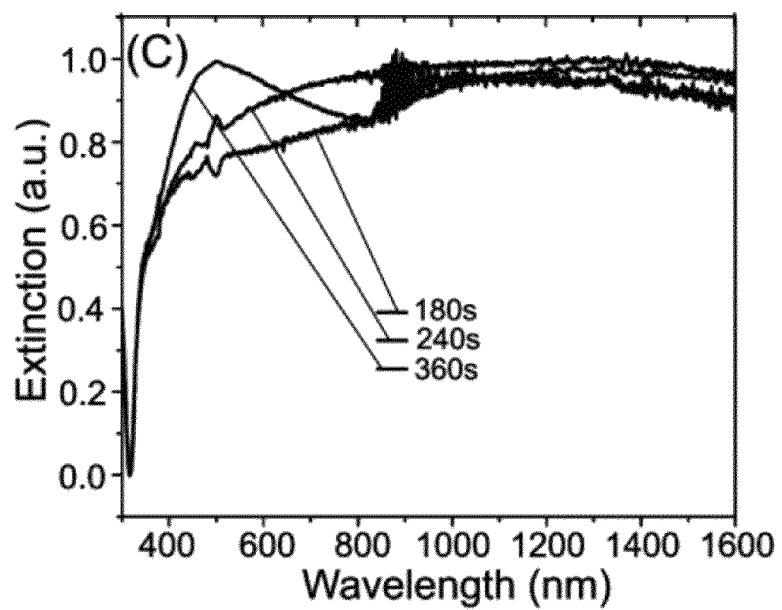

The Ag nanoplates grown with 2 M $AgNO_3$ solution for different times also show tunable SPR bands in the UV-visible-NIR regimes. FIG. 24A compares the extinction spectra of the samples formed at times before adjacent nanoplates start to polymerize into oligomers. Each sample exhibits a weak shoulder peak at about 350 nm, originated from the out-of-plane quadrupole resonance, and a strong peak located at longer wavelengths. The strong peak corresponds to the in-plane dipole resonance of the Ag nanoplates and the position continuously shifts to the red with increasing growth time. The major in-plane dipole peaks are much wider than those of the samples shown in FIG. 23. The widening of the peaks is ascribed to the broader distribution of the sizes of the nanoplates formed with 2 M $AgNO_3$ than those formed with 8 M $AgNO_3$. FIG. 24B shows multiple sharp peaks start to appear in the range of about 350 to about 550 nm due to the strong coupling between nanoplates when the growth time is 180 seconds. Continuous growth leads the nanoplates to be more crowded, and thus SPR coupling between the nanoplates becomes much stronger. The enhanced crowding leads to a loss of the fine structures in the extinction spectra, resulting in a broad peak around 500 nm in FIG. 24C. In comparison to the spectra of FIG. 23, the in-plane quadrupole resonance peak is not clearly observed during the reaction with 2 M $AgNO_3$. The strong interaction of the Ag nanoplates with light irradiations in the visible and the NIR regimes could significantly affect photochemistry, photocatalysis, etc. induced by the Ag/GaAs hybrid systems.

Example 11

The influence of the dopant type and the dopant concentration has been evaluated by reacting an aqueous 0.1 M $AgNO_3$ solution with undoped semi-insulating GaAs (100) (SI-GaAs) and p-type GaAs (100) doped with Zn at a concentration of about $1 \times 10^{19}$ $cm^{-3}$. FIG. 5A shows an SEM image of the sample formed on a SI-GaAs wafer. The density of the Ag structures is lower than that of the samples formed on n-doped wafers. FIG. 5D shows the sample generated on a p-type wafer has an even lower density of Ag structures. This variation in density of the resultant Ag structures is determined by the number of Ag nuclei formed at the early stage of the reaction. In general, the formation of Ag nuclei is dependent on the fast reduction of $Ag^+$ ions by surface electrons and/or surface states of the GaAs wafers. The sum of the surface electron concentration ($C_e$) and the surface state concentration ($C_{surf}$) for different types of wafers is in the order: n-GaAs>SI-GaAs>p-GaAs. Low values of $C_e$ and $C_{surf}$ lead to low reducing rates of $Ag^+$ ions, and thus a low density of nuclei for the growth of Ag structures.

Thick multiple-layered structures, compared with monolayered plates on n-GaAs wafers, are formed in the side regions of SI-GaAs wafers. FIG. 5B shows an SEM image of the Ag structures formed in the region indicated by the top box of FIG. 5A, showing their multiple-layered features and rough surfaces. FIG. 5C shows the formation of some wire-like structures are formed in the central region, as indicated by the bottom box of FIG. 5A, along with the formation of multiple-layered structures. FIG. 5E shows the formation of quasi-spherical structures and FIG. 5F shows the formation of oval structures with multiple-layered constructions formed in the side and central regions on the p-GaAs wafers, respectively. The type of dopant in the GaAs wafers significantly affects the reducing ability of $Ag^+$ ions, and thus the formation of nuclei and the growth of Ag structures. Thus, the dopant dependence can provide a possible route to control the morphology of Ag structures.

Example 12

Deposited Ag atoms form different structures with different morphologies when the GaAs substrate reacts with $AgNO_3$ solutions of various pH values. Oxides of GaAs can be dissolved in either acidic or basic media through the reactions:

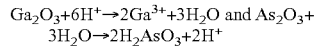
$Ga_2O_3 + 6H^+ \rightarrow 2Ga^{3+} + 3H_2O$ and $As_2O_3 + 3H_2O \rightarrow 2H_3AsO_3 + 2H^+$

Figure 25:
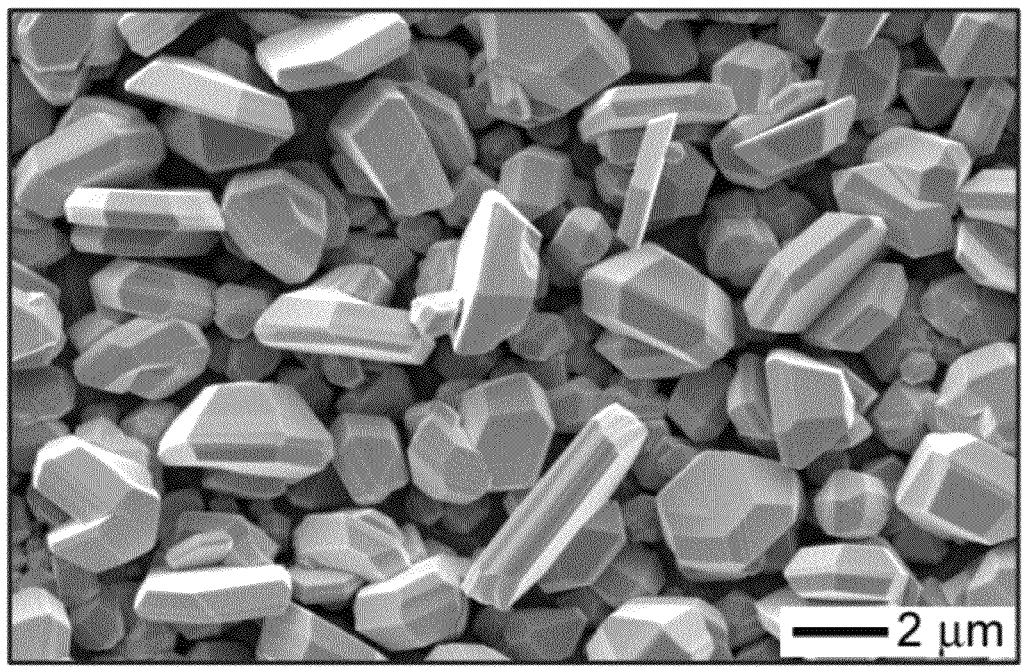
FIG. 25 shows an SEM image of Ag structures that are formed on an n-GaAs (100) wafer through reaction with an aqueous solution of 0.1 M $AgNO_3$ and 1% (v/v) hydrofluoric acid for 5 minutes.

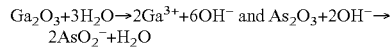
$Ga_2O_3 + 3H_2O \rightarrow 2Ga^{3+} + 6OH^-$ and $As_2O_3 + 2OH^- \rightarrow 2AsO_2^- + H_2O$ When the oxides formed from GaAs are absent from the GaAs wafers during the reactions, the growth process of the Ag structures is affected in various aspects, including the nucleation steps, growth steps, and charge-transfer channels between GaAs and $Ag^+$. For instance, the GaAs substrates constantly expose their fresh pure GaAs lattices to the $Ag^+$ ions, leading to forming nuclei progressively, when the oxides are dissolved simultaneously during the reactions. FIG. 25 shows an SEM image of Ag structures that are formed on an n-GaAs (100) wafer through reaction with an aqueous solution of 0.1 M $AgNO_3$ and 1% (v/v) hydrofluoric acid for 5 minutes. The resulting Ag structures exhibit high crystallinity and apparent crystalline facets that are different from the previously shown structures formed with a substantially pure $AgNO_3$ solution with a pH value of about 7. The GaAs wafer is fully covered with Ag crystals with multiple modal sizes and irregular shapes. The wide size distribution indicates that the growth of Ag crystals in the reactions between acidic $AgNO_3$ solutions and GaAs wafers is dominated by multiple steps of nucleation and growth. The average sizes of the Ag crystals also increases with reaction time. Due to the simultaneous dissolution of oxide layers by hydrofluoric acid, silver ions in the acidic $AgNO_3$ solutions always contact fresh GaAs lattices and directly react with GaAs, which results in more and more particles being formed over increasing reaction time. This mechanism is essentially different from the hole-injection process involved in the reaction between substantially pure $AgNO_3$ solutions and GaAs wafers, where the as-grown oxide layers prevent the direct contact and reaction between Ag ions and GaAs lattices. These differences indicate that the formation of the insoluble thin oxide (i.e., $Ga_2O_3$ and $As_2O_3$) layers on the GaAs substrate plays a significant role in determining the generation of anisotropic Ag nanoplates that stand out of the surface plane of the GaAs substrate.

Example 13

Ag nanoplates were grown on a semiconductor substrate by delivering a droplet (~20 μL) of $AgNO_3$ solution to the central area of the flat surfaces of cleaned GaAs substrates with a micropipettor through the aforementioned process. The substrates were covered with a black cap to eliminate the effect of light illumination and evaporation of water during reaction. The nanoplates were then coated with self-assembled monolayers (SAMs) of 1-hexadecanethiol (HDT) molecules in order to decrease the surface energy of the Ag. The SAMs were formed by soaking the samples in a 5 mmol/L ethanolic solution of 1-hexadecanethiol for 1 hour followed by rinsing with ethanol and drying with a gentle $N_2$ flow. The resulting thiol-modified samples were used for hydrophobic measurements.

Unexpectedly, wettability of the resulting Ag nanoplate/GaAs composite surfaces can be tuned between the Wenzel wetting state, the Cassie nonwetting state, and the Cassie impregnating wetting state by controlling the dimensions and nanoscale surface roughness of the individual nanoplates. The necessary tuning can be achieved by choosing appropriate reaction conditions as described, for example, in Examples 1-12.

Figure 26A:
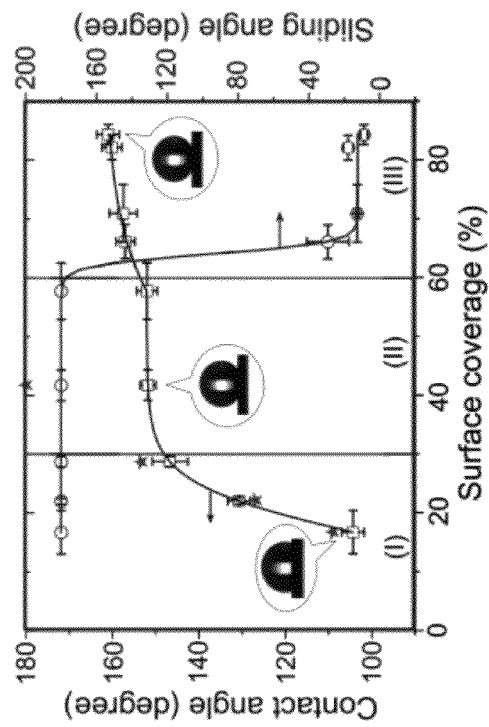
FIG. 26A shows a plot of the surface coverage of n-GaAs substrates reacted with 2 M $AgNO_3$ for various times.

As described with respect to the above experiments, the majority of the Ag plates protrude from the surface of the substrate. The orientation of the Ag nanoplate thus increases the macroscopic roughness of the substrates. In other words, the micrometer scale roughness of the substrate is increased by the protruding Ag nanoplates. As described above, the $AgNO_3$ concentration decreases for longer growth times (greater than about 3 minutes), resulting in the formation of nanograins on the basal surfaces of the nanoplates. Decoration of the nanoplates with nanograins increases the microscopic roughness on the nanometer scale of individual Ag nanoplates. Further, the macroscopic roughness of the substrate also increases with increasing surface coverage of the substrate with the nanoplates as well as the sizes of the Ag nanoplates. Surface coverage generally increases with growth time as shown in FIG. 26A for the samples obtained through reacting n-GaAs wafers with a 2 M $AgNO_3$ solution for varying times. The surface coverage is estimated by integrating the bright areas (corresponding to the Ag nanoplates) of an SEM image and calculating integrated bright area as a percentage of the whole area of the SEM image. FIG. 26A shows that the size of Ag nanoplates increases rapidly in the early stages (i.e., growth times less than about 3 minutes), resulting in a fast increase in the surface coverage. At growth times longer than 3 minutes, the surface coverage only slightly increases with growth time because further reaction only mildly increases the sizes of the nanoplates. However, the microscopic roughness of individual nanoplates increases significantly with longer growth times.

All the measurements of contact angles and sliding angles were carried out on a First Ten Ångstroms system (Portmouth, Va.). In a typical measurement, a drop (about 4 mg) of deionized water was delivered on an Ag nanoplate/GaAs composite substrate horizontally sitting on a stage by slowly pushing the plug of a syringe located close to the top surface of the substrate. After the water droplet stabilized on the composite surface, a photograph was taken by the camera and the contact angles were determined by drawing the tangent of the water/air interface and the line that represents the nominal surface of the composite substrate. The sliding angle was measured by slowly tilting the substrate to a certain angle at which the water droplet started to slide off the composite surface.

Figure 26B:
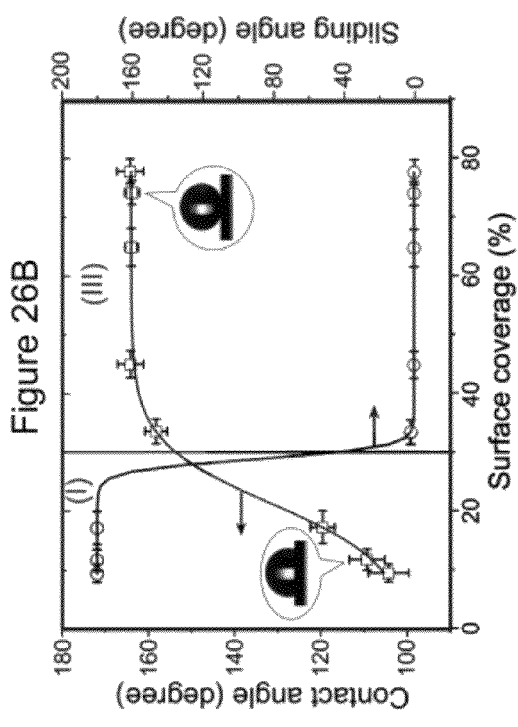
FIG. 26B shows a plot of the relationship of the apparent contact angle and the sliding angles of a water droplet on the surfaces of FIG. 26A.

The Ag nanoplate/GaAs composite surfaces exhibit interesting wetting behavior after modification with SAMs of HDT molecules. FIG. 26B plots the apparent static contact angles (contact angle) and sliding angles as a function of surface coverage of the Ag nanoplates as shown in FIG. 26A. Here, the sliding angle is defined as the critical angle at which a water droplet with a mass of about 4 mg begins to slide down an inclined surface. FIG. 26B shows that the samples formed at longer growth time (greater surface coverage) are more hydrophobic than the samples formed at shorter time. The contact angle increases dramatically from about 105° to about 150° when the surface coverage increases from about 16% to about 30% (i.e., the growth time increases from about 15 seconds to about 60 seconds). This configuration is designated as Zone I in FIG. 26B.

The contact angle of a water droplet on the substrate formed at 15 seconds is close to that of a water droplet on a flat GaAs wafer or a flat Ag film modified with SAMs of HDT molecules. This similarity indicates that the wettability of Ag nanoplate/GaAs composite surfaces with low surface coverage, less than about 15%, is dominated by the GaAs surfaces because the roughness created by deposition of the small Ag nanoplates is negligible. As the surface coverage increases in the range of about 30% to about 60%, the macroscopic roughness significantly increases due to the increased size of the Ag nanoplates, resulting in an increase in the contact angle as expected from the Wenzel equation. The Wenzel equation is defined as $\cos(\theta^*)=r\times\cos(\theta)$, where $\theta^*$ is the apparent static contact angle; $\theta$ represents the Young's contact angle of SAMs of HDT molecules on a flat surface; and r is the surface roughness, which is defined as the ratio of the actual surface area of the solid to its planar projection. The value of $\theta$ is determined to be 102.6°. This trend stops at a contact angle of about 152° when the surface coverage is in the range of about 30% to about 60%. This configuration is designated as Zone II in FIG. 26B. In both Zone I and Zone II, the water droplets do not detach from the substrates even when the substrates are turned upside down. As the sliding angle for the measurements in Zone I and Zone II is ill-defined, a sliding angle of 180° is assigned for convenient comparison with measurements in Zone III.

In contrast, water droplets on the substrates with surface coverage greater than about 60% can easily slide down the surfaces with sliding angles less than about 30° while the static contact angles only increase by several degrees. This configuration is designated as Zone III in FIG. 26B. When the growth times are longer than 3 minutes, the basal surfaces of individual Ag nanoplates become rough, while the sizes of the nanoplates and the surface coverage both increase by very small percentages. Therefore, the ease with which water droplets slide down the surfaces depends on the microscopic roughness of the individual nanoplates. The Ag nanoplate/GaAs composite surfaces with both macroscopic (on the micrometer and/or submicrometer scale) and microscopic (on the nanometer scale) roughness are an analog of the surfaces of lotus leaves, on which water droplets usually exhibit high contact angles and low sliding angles.

Figure 26C:
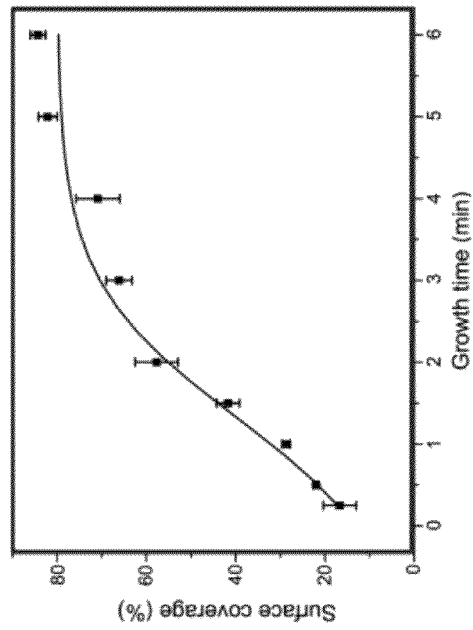
FIG. 26C shows a plot of the surface coverage of n-GaAs substrates reacted with a 0.1 M $AgNO_3$ for various times.
Figure 26D:
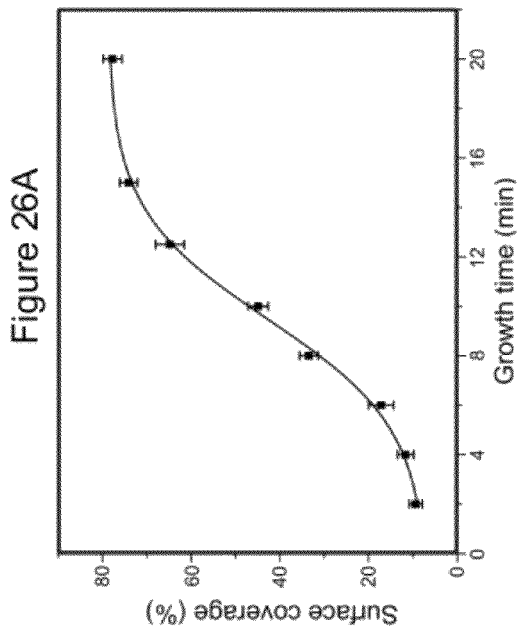
FIG. 26D shows a plot of the relationship of the apparent contact angle and the sliding angles of a water droplet on the surfaces of FIG. 26C.

Substrates with Ag nanoplates with highly rough surfaces were grown through reaction with $AgNO_3$ solution with a low concentration of 0.1 M, as described above. The surface coverage in relation to reaction time for the reaction with a solution of 0.1 M $AgNO_3$ is presented in FIG. 26C. The hydrophobic properties of the GaAs substrates covered with the rough Ag nanoplates, is shown in FIG. 26D, plotting the dependence of the contact angle and sliding angle of water droplets on surface coverage as defined in FIG. 26C. The use of surface coverage of Ag nanoplates, rather than growth time, allows for direct comparison of the effects of varying the dimensions and densities of different Ag nanoplates on the hydrophobicity because reactions with $AgNO_3$ solutions having different concentrations occur on different time scales.

The results depicted in FIG. 26D are similar to those of FIG. 26B, the contact angles of water droplets on the substrates covered with rough Ag nanoplates increase continuously up to about 160° with the increase in surface coverage from 0 to about 30%, designated as Zone I. The water droplets do not detach from the substrates even when the substrates are turned upside down. Once the surface coverage is greater than a critical value, about 30%, the water droplets can easily slide off the substrates with very small sliding angles of less than about 2°, while the contact angles of the water droplets remain essentially constant at about 164° regardless of the surface coverage, designated as Zone III. The absence of a transition state with a high contact angle and a high sliding angle analogous to Zone II of FIG. 26B indicates that the microscopic roughness of individual Ag nanoplates significantly lowers the adhesion between water droplets and the as-fabricated substrates when the sizes of the Ag nanoplates are sufficiently large.

A comparison of the results shown in FIGS. 26B and 26D shows that three different hydrophobic states can be achieved by controlling the growth time and the concentration of $AgNO_3$ solution during the preparation of the Ag nanoplate/GaAs composite surfaces. Namely, Zone I comprises a relatively low contact angle (100°-150°) and high adhesion between water droplets and substrates; Zone II comprises a high contact angle (greater than 150°) and high adhesion; Zone III comprises a high contact angle (greater than 150°) and low adhesion (small sliding angle).

FIGS. 27A-27D illustrate the various microscopic configurations of water/composite surface interfaces obtainable through tuning of the Ag-nanoplate/substrate system. In Zone I, where the surface coverage is less than about 30%, the wettability is dominated by the Wenzel wetting state, FIGS. 27A and 27B, for the substrates with both flat and rough Ag nanoplates. In this case, water easily penetrates into the gaps between Ag nanoplates to wet both the GaAs wafer and the Ag nanoplates because of the small sizes of the Ag nanoplates. The complete contact with the solid surfaces leads to strong adhesion between water droplets and the substrates. In addition, the apparent contact angles of water droplets on substrates in Zone I are consistent with the values calculated according to the Wenzel equation (stars in FIG. 26B). For the substrates covered with rough Ag nanoplates, r and $\theta^*$ may be difficult to calculate precisely because of the wide size distribution of the Ag nanoplates. The similarity in macroscopic hydrophobic behavior of the GaAs substrates when covered with either smooth or rough Ag nanoplates in Zone I indicates that the secondary nanometer scale roughness of the basal surfaces of individual Ag nanoplates does not significantly influence the macroscopic wetting behavior of water droplets when the sizes of the Ag nanoplates are smaller than a critical value. This critical size corresponds to a surface coverage of about 30%. The macroscopic surface roughness is low in Zone I.

Figure 27A:
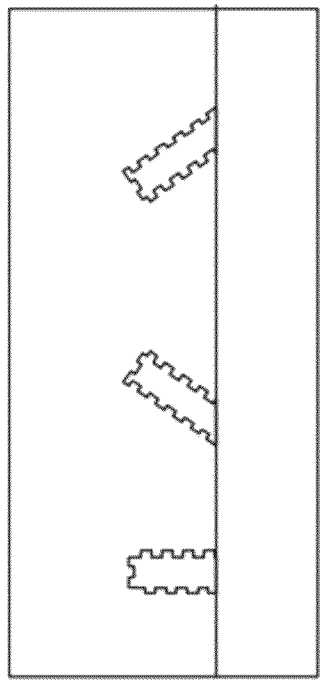
FIGS. 27A-27D show schematics of the contacts between water droplets and the composite Ag nanoplate/GaAs substrate surfaces on a microscopic scale.
Figure 27B:
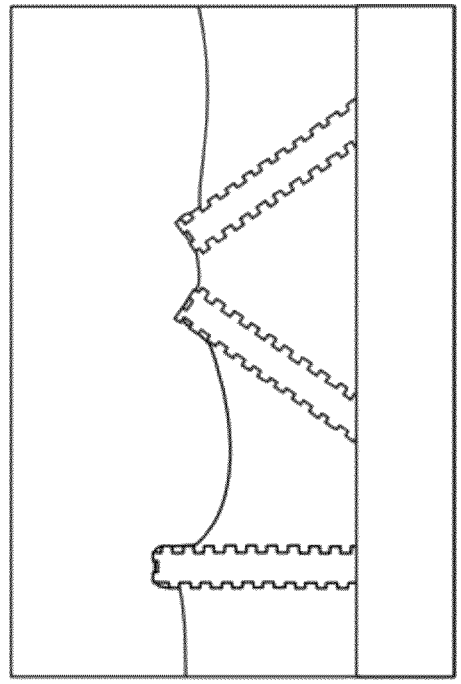
Figure 27C:
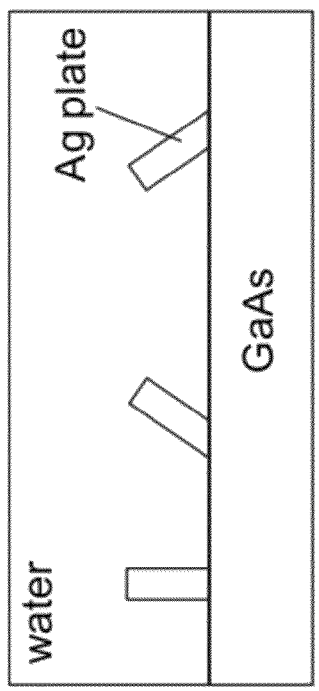
Figure 27D:
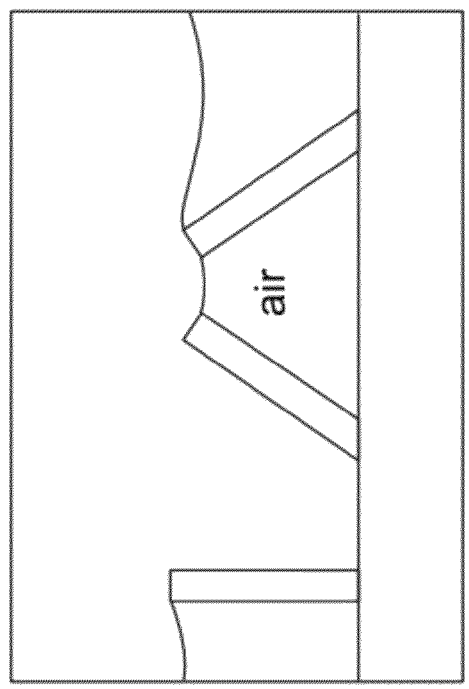

The contact angles computed by Wenzel equation deviate dramatically from the measured values for surface coverage higher than 30%. This discrepancy indicates that the hydrophobic behaviors in Zone II and Zone III do not obey the Wenzel equation. Instead, they are dominated by the Cassie composite state, i.e., some air pockets are trapped underneath water droplets as illustrated in FIGS. 27C and 27D. Sitting on air pockets leads to water droplets on the surface exhibiting superhydrophobicity with apparent contact angles higher than 150° according to the Cassie Baxter equation:

$$\cos(\theta^*) = -1 + \phi_S \times [1 + \cos(\theta)]$$

where the fraction of solid in contact with liquid, $\phi_S$, can be estimated as about 15% for the water droplets in Zone II for the substrates covered with smooth Ag nanoplates by substituting $\theta^*$ and $\theta$ with 152° and 102.6° (see above), respectively. That this number is less than unity indicates that the surfaces of only some nanoplates are fully wetted by water when the sizes of the nanoplates are larger than a critical value (for example, about 290 nm for the samples of FIGS. 26A and 26B) and the surface coverage is higher than about 30%. FIG. 27C shows a schematic drawing of a so-called Cassie impregnating wetting state, which usually generates high contact angles and strong adhesion as reflected by the measurements in Zone II. The pinning of water droplets in some of the grooves formed between large flat Ag nanoplates ensures that the droplets remain on the Ag nanoplate/GaAs surface even when the substrate is tilted or inverted.

When the basal surfaces of the large Ag nanoplates become rough, the Ag nanoplate/GaAs composite surfaces have roughness at both macroscopic and microscopic levels and behave in a similar way to lotus leaves, on which water droplets exhibits very high contact angles and very small sliding angles. This superhydrophobic behavior is a special Cassie state, i.e., the Cassie nonwetting state, which is consistent with the measurements in Zone III shown in FIGS. 26B and 26C. FIG. 27D illustrates the microscopic contact between water droplets and the composite surface, which differs from the Cassie impregnating wetting state of FIG. 27C. In this case, substantially no water penetrates into the gaps between the rough Ag nanoplates so that the adhesion is too small to retain water droplets when the substrate is tilted.

Figure 27E:
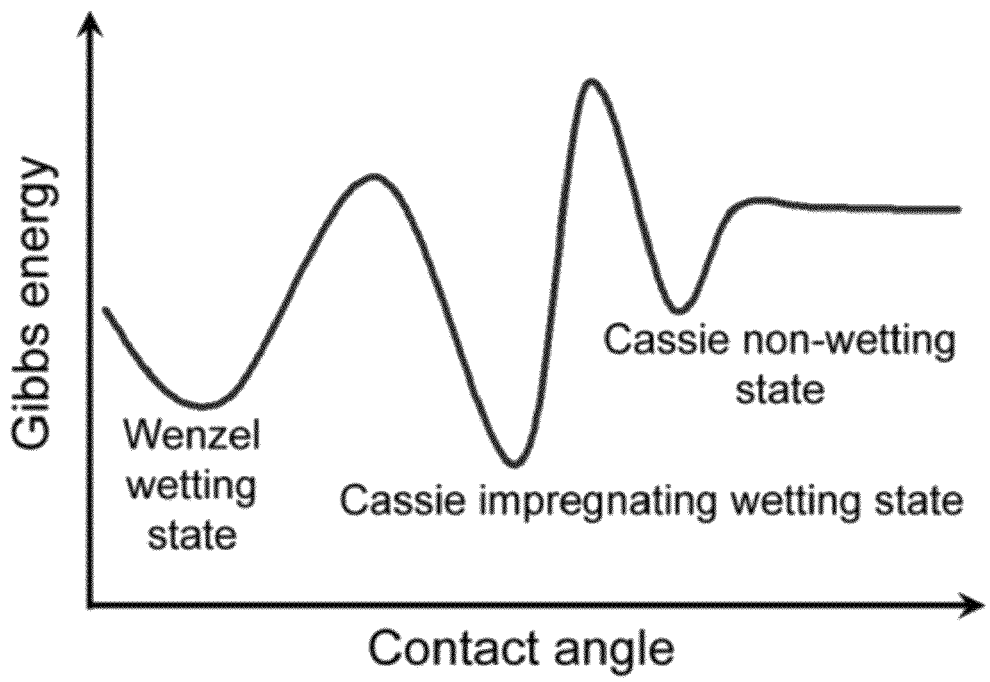
FIG. 27E shows the dependence of the Gibbs energy on the apparent contact angle for water droplets on the Ag nanoplate/GaAs composite surfaces.

Additionally, the diversity of hydrophobic states can also be understood when the Gibbs energy curve for a water droplet on a Ag nanoplate/GaAs composite surface is characterized by multiple minima, as shown in FIG. 27E. The three local minima correspond to the three wetting states observed in this work, i.e., Wenzel wetting state for Zone I, Cassie impregnating wetting state for Zone II, and Cassie nonwetting state for Zone III as illustrated in FIGS. 26B and 26D. For a particular GaAs substrate covered with Ag nanoplates, a water droplet on the substrate can spontaneously minimizes its Gibbs energy to one of the three local minima, resulting in a stable apparent contact angle. The measured contact angles for the samples shown in the present embodiment are approximated in the chart shown in FIG. 27F. When the surface coverage of Ag nanoplates is less than 30%, the thin nanoplates (thickness of about 22 nm for flat nanoplates and thickness of about 50 nm for rough nanoplates) have small sizes (for example, less than 290 nm for the flat plates). Water can easily penetrate into the gaps between nanoplates and completely wet both the surfaces of the Ag nanoplates and the GaAs substrates regardless of the roughness of individual nanoplates, resulting in the Wenzel wetting state. When the sizes of the Ag nanoplates are sufficiently large, i.e., the surface coverage is greater than 30%, air in some of the grooves formed between the Ag nanoplates can be trapped underneath water droplets, leading to superhydrophobicity with apparent contact angles greater than 150°. For the samples with high surface coverage, both Cassie impregnating wetting state and Cassie nonwetting state are possible, depending on the nanoscale surface roughness of individual nanoplates. Water droplets on the samples with flat Ag nanoplates exhibit the Cassie impregnating wetting state, while water droplets on the samples with rough Ag nanoplates follow the behavior of the Cassie nonwetting state.

Figure 27F:
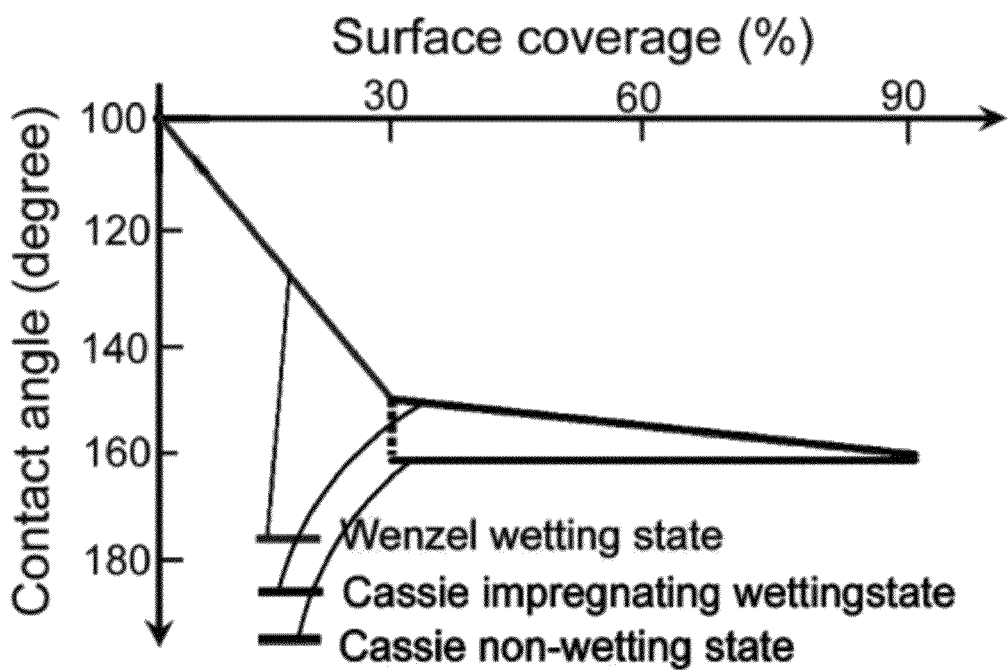
FIG. 27 F shows the relationship between the hydrophobic states of a water droplet and contact angle and surface coverage of the Ag nanoplate/GaAs composite surfaces as shown in FIGS. 26A-26D.

Therefore, the parameters of the Ag nanoplates required to fabricate substrates with the desired hydrophobic behavior can be conveniently determined from the chart in FIG. 27F. By carefully controlling the growth conditions, for example, the growth time and the concentration of AgNO$_3$ solution, Ag nanoplates with predetermined parameters can be efficiently grown. Additionally, high aspect ratios of the Ag nanoplates are also important to achieve Cassie composite states. For example, thicker Ag nanoplates can be grown by reacting with AgNO$_3$ solutions with concentration of about 8 mol/L. This reaction generates Ag nanoplates with aspect ratios less than 3, although surface coverage can be up to almost 100%. The contact angles of water droplets on these substrates are always less than about 140°. Conversely, surfaces formed with assemblies of low aspect ratio Ag nanoplates do not readily exhibit superhydrophobicity.

Example 14

Figure 28A:
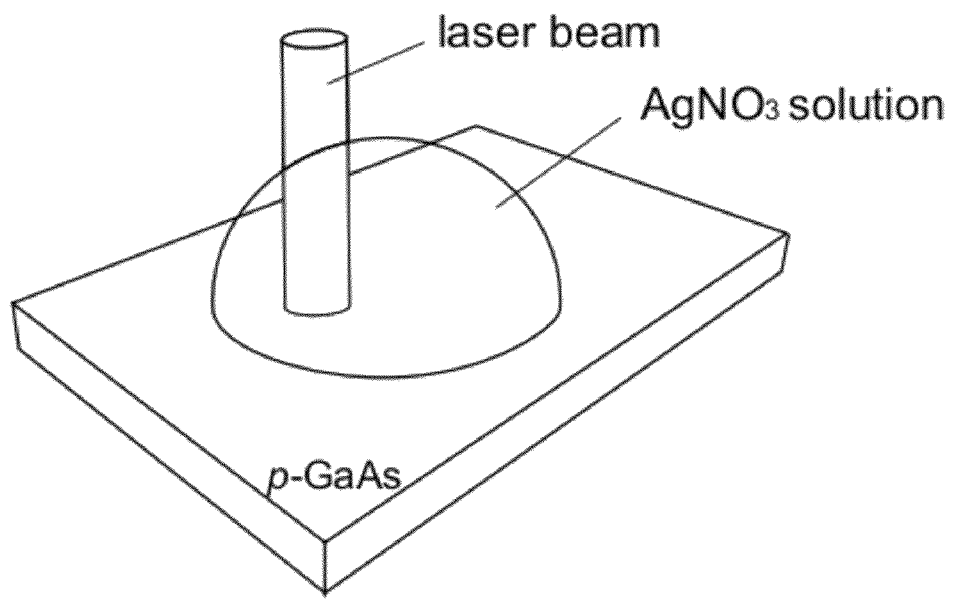
FIG. 28A shows a schematic of a technique for growing metal nanoparticles on a p-type semiconductor using laser illumination to increase the density of surface electrons on the semiconductor substrate.
Figure 28B:
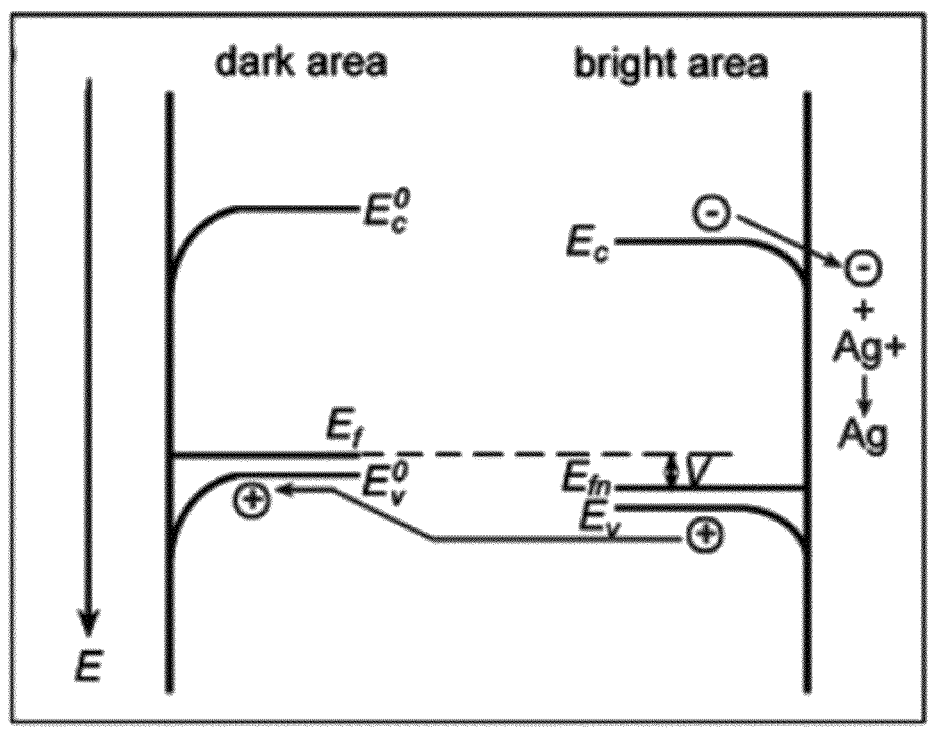
FIG. 28B shows an illustration of the charge separation and charge migration in the substrate resulting in a shift of the band energy levels due to a photovoltage, V.
Figure 31A:
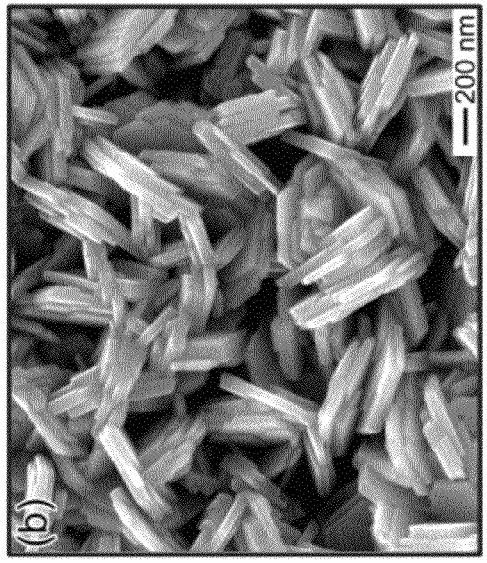
FIGS. 31A-31D show a series SEM images of Ag nanoplates grown on p-GaAs wafers through a 2 minute reaction of a 2 M $AgNO_3$ with the substrates with the assistance of laser irradiation of various power densities.
Figure 31B:
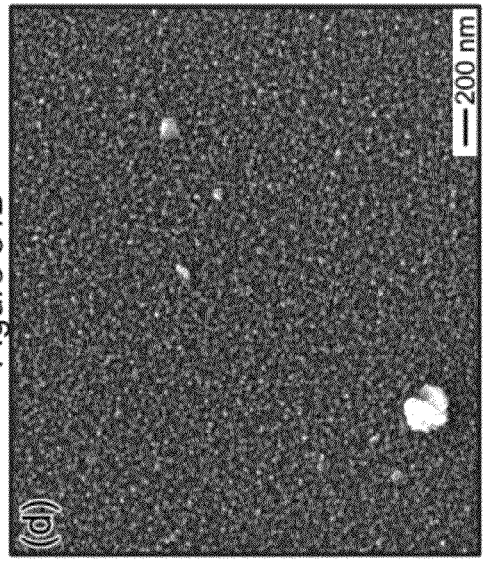
Figure 31C:
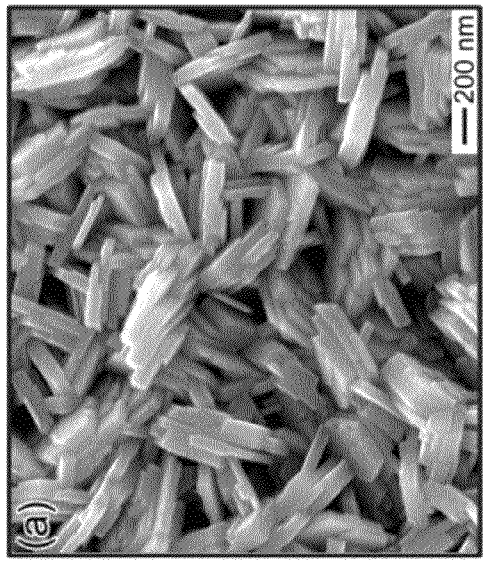
Figure 31D:
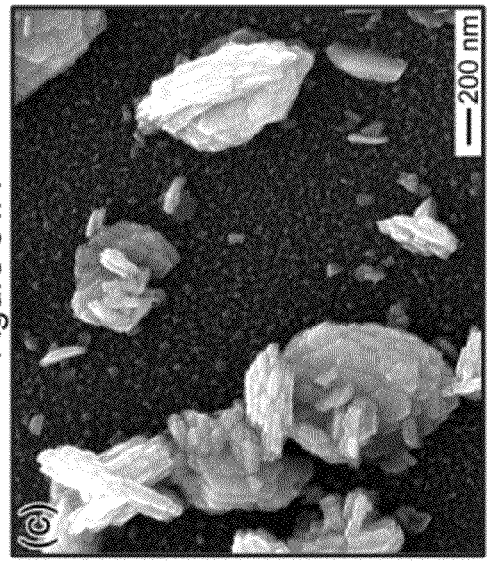

Ag nanoplates were grown on a p-GaAs substrates by using an illumination source to increase the electron concentration on the surface of the substrate. A red laser beam with wavelength of about 650 nm (i.e., 1.9 eV) was used to increase the density of surface electrons of the p-GaAs substrates (with bandgap of 1.42 eV) and to trigger the growth of Ag nanoplates on the illuminated surfaces. FIG. 28A shows a schematic of the experimental strategy. In a typical synthesis, a droplet (about 100 μL) of aqueous solution of AgNO$_3$ with concentration of 2 M is transferred to the surface of a p-type GaAs substrate (doped with Zn in concentration of about $1 \times 10^{19}$ cm$^{-3}$). The GaAs substrate is cleaned by immersing in a 2% hydrofluoric acid solution for 5 minutes to remove the native oxide layer. The red laser is then turned on to illuminate a partial reaction area. The illumination induces charge separation in the GaAs lattice to pump electrons to the conduction band in the bright area, resulting in a shift of the band energy levels due to photovoltage, V (FIG. 28B). The accumulated electrons in the conduction band flow to the illuminated surface because of the downward bending of energy bands of p-GaAs in the space charge region. The leftover holes in the valance band flow to the dark region through bulk GaAs lattice due to the difference in the band energies of different regions. The accumulated surface electrons in the illuminated surface area react with Ag$^+$ ions to generate Ag nuclei and further grow them into large particles through either the hole injection process or the reducing reaction with more surface electrons continuously supplied by photoillumination. Ag$^+$ ions, on the other hand, are difficult to be reduced to Ag atoms for the formation of Ag nanoparticles in the dark regions due to absence of surface electrons.

FIGS. 29A-29D show a series of scanning electron microscopy (SEM) images of a sample prepared by a 2-minute reaction of a 2 M AgNO$_3$ solution with a p-GaAs substrate with the assistance of laser irradiation, as shown in FIG. 28A. The low magnification image shown in FIG. 29A shows clear contrast between the illuminated and dark areas, indicating that photoillumination significantly enhances the deposition of silver particles. Closer observation over the interface, for example, boxed area labeled with (b) in FIG. 29A, is presented in FIG. 29B revealing that the density of Ag particles at the edge of the laser beam decreases gradually. The variation of the density of Ag particles is ascribed to the Gaussian distribution of power density of the laser beam, indicating that power density of laser beam can influence density of Ag nanoparticles.

High-magnification images, FIG. 29C, reveal that the Ag particles densely deposited in the illuminated area have plate-like geometries and thicknesses ranging from about 30 nm to about 60 nm and sizes (i.e., edge lengths) up to about 500 nm. The plate geometries of the Ag particles on the p-GaAs substrate are similar to that of the Ag structures grown on n-GaAs wafers (with dopant (Si) concentration of about $1 \times 10^{18}$ cm$^{-3}$) through reaction with a 1 M AgNO$_3$ solution in a dark environment, as shown in FIGS. 2A and 2B. However, the density and thickness of the Ag nanoplates on the p-GaAs substrate are much higher than those grown on n-GaAs wafers. The comparison confirms the importance of surface electrons for the formation of Ag nuclei, which are crucial to the growth of Ag nanoplates. The higher density of Ag nanoplates shown in FIG. 29C implies that the laser beam used in the experiment is strong enough to generate a higher concentration of surface electrons over the illuminated surface area of the p-GaAs wafer than that of n-GaAs wafers. In contrast, only a sub-monolayer of particles with sizes less than 20 nm are deposited in the dark surface areas, FIG. 29D. The reluctance of these particles to grow into large nanoplates indicates the Ag clusters formed in the dark regions on the p-GaAs substrates may be lack of appropriate crystalline structures to support growth into nanoplates.

Figure 35A:
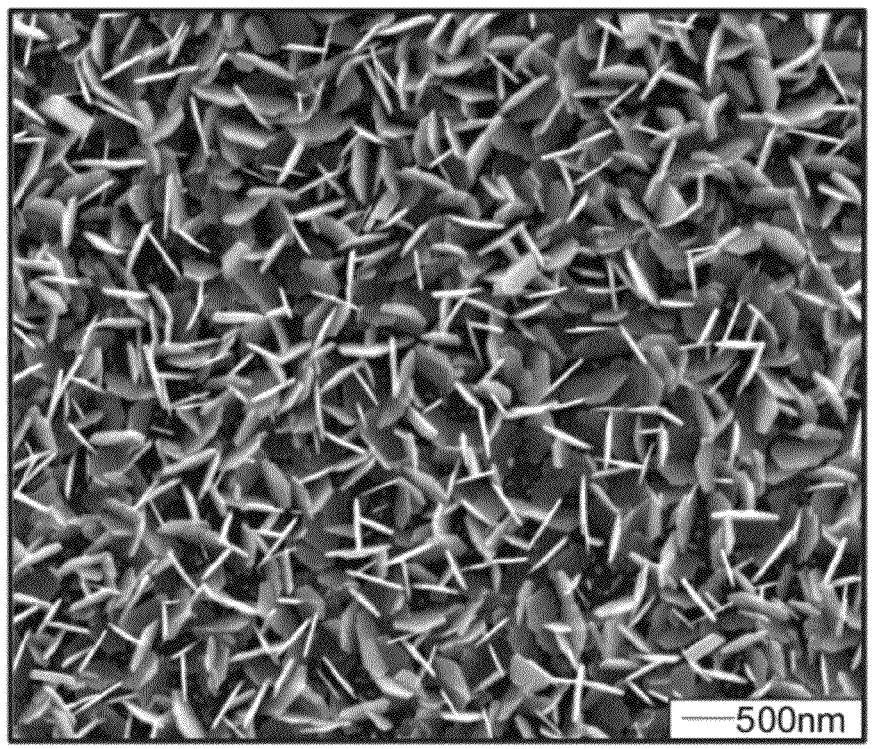
FIGS. 35A-35B show SEM images of Ag nanoplates grown at 22° C. on n-GaAs substrates through reactions with a 2 M AgNO$_3$ solution for 4 min and a 1 mM NaAuCl$_4$ solution for 10 min, respectively.

The laser illumination can be removed after the nuclei are formed. Further growth of the nuclei, which are formed under illumination under dark environment leads to the formation of Ag nanoplates similar to those grown under continuous illumination. For instance, FIG. 35A shows an SEM image of Ag nanoplates grown on a p-GaAs substrate after reaction with a 2 M AgNO$_3$ solution under laser illumination of 15 seconds followed by 105 seconds continuous reaction under dark environment. The density, dimensions, and morphologies of the Ag nanoplates shown in FIG. 35A are similar to those grown through 120 seconds continuous reaction under constant laser illumination, as shown in FIG. 29C. The independence of laser illumination at the growth step after the nuclei are generated confirms that the hole injection process is the dominative driving force to grow the Ag nuclei into Ag nanoplates, which is consistent with the growth mechanism illustrated in FIGS. 1B and 12. This invented approach can grow metal nanoplates on p-type semiconductor substrates with high quality as those grown on n-type semiconductor substrates and the short-time laser illumination can significantly reduce the energy cost for supporting laser illumination.

The sizes and thicknesses of the Ag nanoplates grown on p-GaAs substrates can be tuned by controlling the reaction time. FIGS. 30A-30D and 29C compare the Ag nanoplates formed at different reaction times. The Figures show that the sizes of the nanoplates gradually increase at short reaction times (i.e., less than 60 seconds). When the reaction times are longer than 60 seconds, the adjacent nanoplates start to polymerize and fuse into thicker nanoplates, FIG. 29C and FIG. 30D. In particular, the sample shown in FIG. 30D shows the multiple-layered structures of the thick nanoplates, confirming the polymerization and fusion process.

As indicated by the gradual decrease in density of Ag nanoplates at the interface of the illuminated/dark region as shown in FIG. 29B, the power density of the laser illumination affects the growth of the Ag nanoplates. FIGS. 31A-31D and 30C compare the Ag nanostructures grown on p-GaAs substrates after the reactions with 2 M AgNO$_3$ for 2 minutes under laser illumination of different power density. The results indicate that Ag nanoplates with similar density and dimensions can be synthesized regardless of the power density of laser illumination when the power density is higher than 16 mW/cm$^2$, FIGS. 30C, 31A and 31B. When the power density is low enough, e.g., less than about 15 mW/cm$^2$, almost no Ag nanoplates can be grown, FIGS. 31C and 31D.

In addition to laser illumination, white light from fluorescent bulbs can also facilitate the growth of Ag nanoplates on p-GaAs substrates. Similar results have been obtained to the nanoplates grown under laser illumination, as shown in FIGS. 29A-29D, 30A-30D, and 31A-31D.

Example 15

Figure 32A:
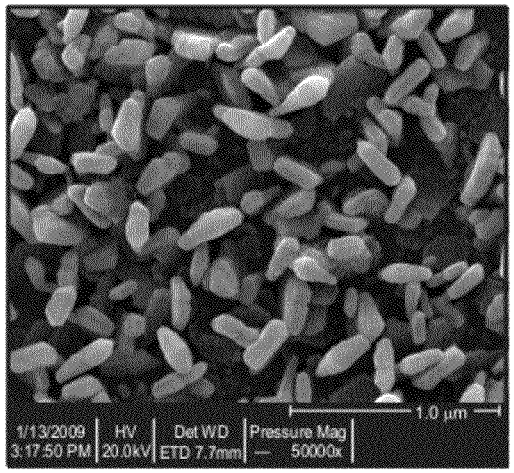
FIG. 32A-32C show SEM images of alloy nanoplates made of gold/silver in FIG. 32A, platinum/silver in FIG. 32B, and palladium/silver in FIG. 32C. These alloy nanoplates were prepared by reacting the Ag nanoplates, which were grown through a reaction between 2 M $AgNO_3$ solution and n-GaAs substrates for 2 minutes at room temperature with different aqueous solutions: (32A) 1 mM NaAuCl$_4$, (32B) 1 mM Na$_2$PtCl$_4$ and (32C) 1 mM Na$_2$PdCl$_4$ for 1 minute at 85° C.

FIG. 32A shows an SEM image of gold/silver (Au/Ag) alloy nanoplates on a GaAs substrate after the as-grown silver nanoplates reacted with aqueous solution of NaAuCl$_4$ with a concentration of 1 mM for 1 minute. The Ag nanoplates were grown through reaction between 2 M AgNO$_3$ solution and an n-GaAs wafer for 2 minutes. Ag reacts with salts of more moble metals through galvanic displacement reactions, leading to convert Ag into other noble metals or alloys. For example, the Ag nanoplates can be transformed into Au/Ag alloyed nanoplates through reactions:

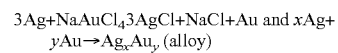

Similar reactions can also be applied to produce Pd/Ag and Pt/Ag alloyed nanoplates through the reactions:

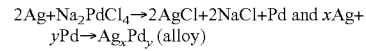

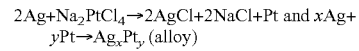

Figure 32B:
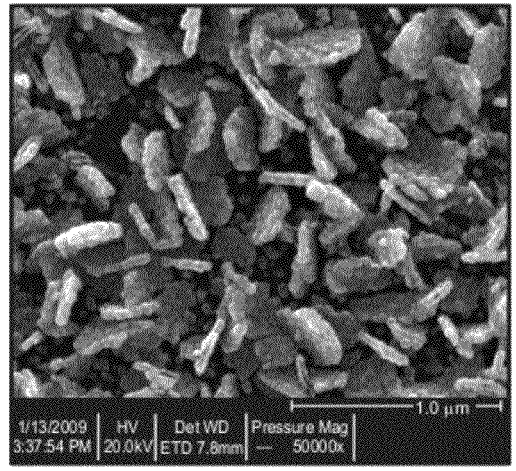
Figure 32C:
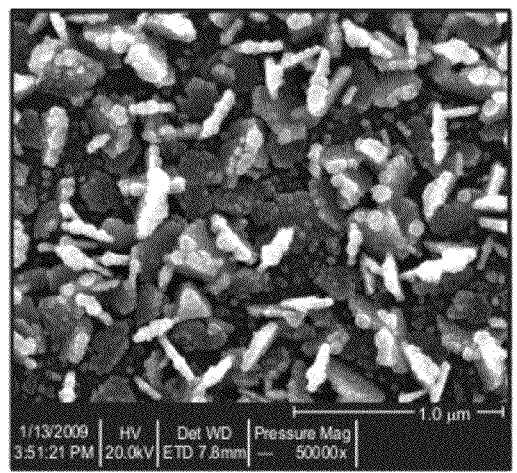

The as-grown Pt/Ag and Pd/Ag alloy nanoplates are shown in FIG. 32B and FIG. 32C, respectively. All of these alloy nanoplates derived from the Ag nanoplates inherit the out-of-substrate orientations, causing them to expose their surface to the surrounding environment.

Example 16

Figure 33:
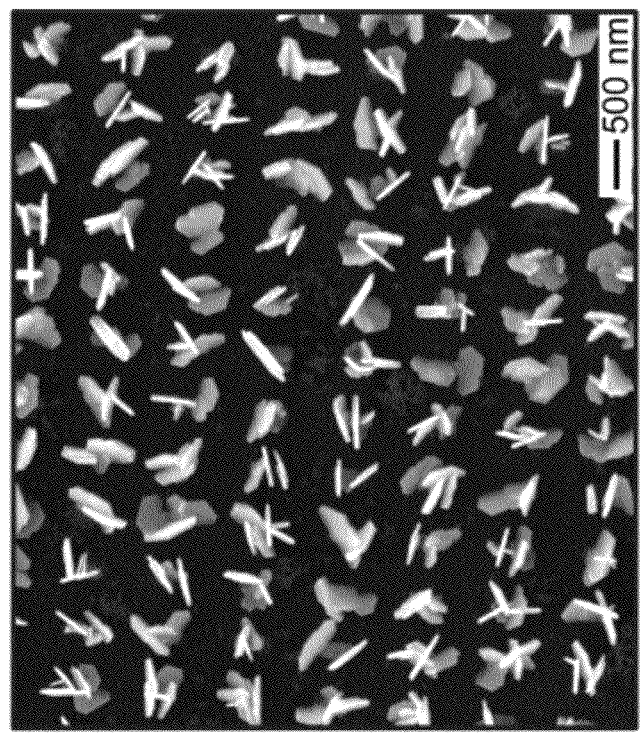
FIG. 33 shows an SEM image of Ag nanoplates grown on an n-GaAs substrate that was covered with a patterned layer of SiO$_2$ with periodic openings for reaction after reaction with 2 M AgNO$_3$ for 2 minutes.

FIG. 33 shows an SEM image of Ag nanoplates grown on an n-GaAs substrate that was covered with a SiO$_2$ layer patterned with periodic openings for reaction, after reaction with 2 M AgNO$_3$ for 2 minutes. This image shows that the semi-conductor substrate with its surface partially covered with inert oxide layers can also react with solutions of metal precursors to deposit metal nanoplates on the semiconductor surfaces. By covering the semiconductor surfaces with appropriate patterns, clusters of metal nanoplates in the patterns of corresponding layouts can be synthesized. In the particular case shown in FIG. 33 clusters consisting of 3-5 Ag nanoplates are grown on an n-GaAs substrates in a periodic pattern.

Example 17

Figure 34:
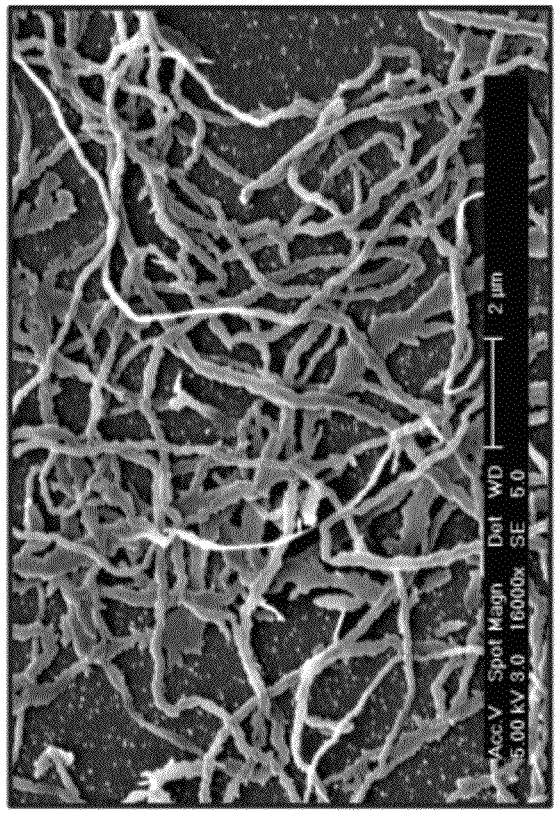
FIG. 34 shows an SEM image of Ag nanoribbons grown on an n-GaAs substrates doped with Si with a concentration of about 5×10$^{16}$ cm$^{-3}$ through reaction with a 1×10$^{-3}$ M AgNO$_3$ solution for 30 minutes at room temperature.

FIG. 34 shows an SEM image of Ag nanoribbons grown on an n-GaAs substrate doped with Si with a concentration of about $5 \times 10^{16}$ cm$^{-3}$ through reaction with a $1 \times 10^{-3}$ M AgNO$_3$ solution for 30 minutes at room temperature. The nanoribbons shown in this SEM image can be classified as special nanoplates, i.e., nanoplates with high aspect ratios. In comparison with the results shown in FIGS. 1-23, the formation of Ag nanoribbons is mainly ascribed to the low concentration of surface electrons of the lightly doped GaAs wafer. Ag nuclei are formed with low density. The low concentration of the AgNO$_3$ solution leads to the growth of the nuclei with low rate. Both effects are beneficial to the formation of high aspect ratio Ag nanoribbons because the nanoribbons have smaller surface areas in comparison with the Ag nanoplates with the same volume of Ag. The twisted ribbons highlighted by the arrows show the relative thin thicknesses of the nanoribbons. Because Ag has high thermal and electrical conductivities, the as-grown Ag nanoribbons may serve as interconnections for high-performance electronic circuits.

Example 18

Figure 35B:
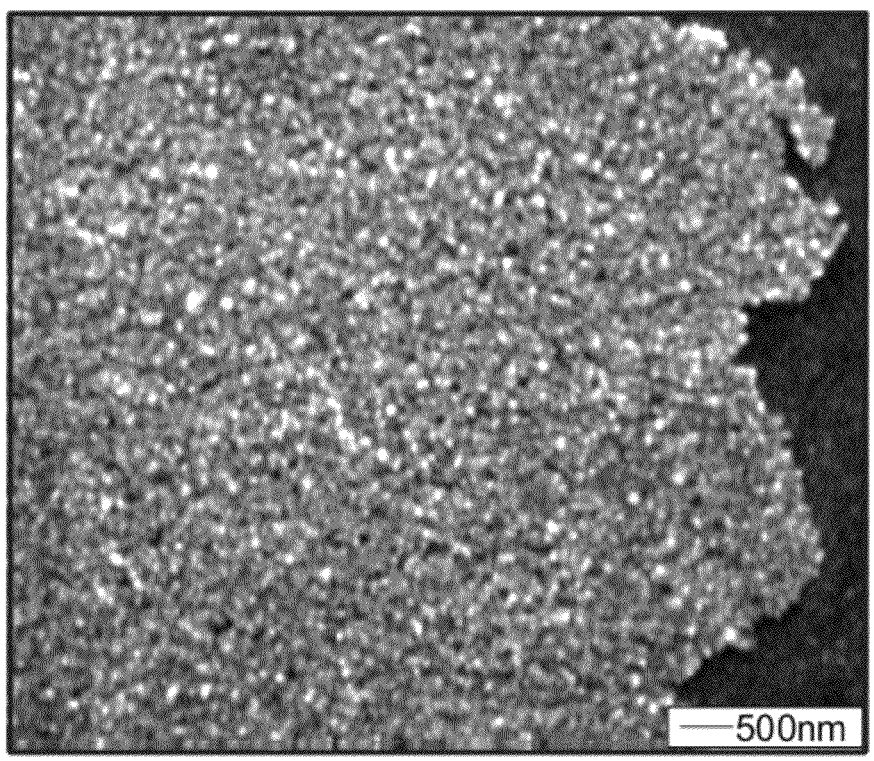

Synthesis of Metal Nanoplates: Ag nanoplates on n-type GaAs wafers doped with Si at a concentration of ~1×10$^{18}$ cm$^{-3}$ (AXT, Fremont, Calif.) were grown by following the procedure described elsewhere. In a typical process, a droplet (~20 μL) of 2 M AgNO$_3$ (Aldrich) aqueous solution was delivered to a ~0.7×0.7 cm$^2$ clean GaAs wafer. The reaction proceeded for 4 minutes in the dark and under ambient environment produced Ag nanoplates as shown in FIG. 35$a$. The GaAs wafer covered with Ag nanoplates was then immersed into a 10 mL of 1 mM NaAuCl$_4$ (Aldrich) solution heated at different temperatures to convert the Ag nanoplates into Au/Ag alloy ones. The reaction was terminated by taking out the sample from the solution and rinsing with DI water.

Characterization: SEM images were taken on a Quanta 400F (FEI) microscope operated at 20 kV under high vacuum mode. STEM images and EDS analysis were performed on a JEOL 2010F transmission electron microscope (TEM) equipped with EDS detector (Oxford). The TEM was operated at 200 kV for all of the characterizations.

Catalytic reduction of 4-nitrophenol: In a typical reaction, aqueous solutions of 4-NP (0.01 mL, 0.01 M) and NaBH$_4$ (0.20 mL, 0.1 M) and 1 mL DI water were mixed in a cuvette. A piece of GaAs wafer covered with metal nanoplates was then immersed in the solution. Changes of the absorption spectra of the solution were monitored with a spectrometer (Perkin-Elmer). The solution was shaken throughout the reaction. After each reaction was completed, the GaAs substrate was taken out from the solution and dried with N$_2$ blow before it was stored. The dried nanoplates can be used to catalyze additional reactions.

Further details regarding the resulting Ag and Au/Ag alloy nanoplates prepared by this method and evaluation of catalysis performance are described in Example 19 hereinafter.

Example 19

FIG. 35A shows an SEM image of a typical sample of Ag nanoplates prepared by the method of Example 18 with average edge length of 485 nm and thickness of 40 nm. Structural characterization indicates that the two basal surfaces of each nanoplate are bounded by {111} facets. All of the Ag nanoplates protrude from the substrate to preferentially expose their {111} surfaces to surrounding environments. However, Ag is easily oxidized in ambient environments, resulting in limitation of their potential applications. As a result, synthesis of nanoplates made of other noble metals (or alloys) which are more resistive against oxidation is important for improving their performance.

The methodology used for growing Ag nanoplates fail to grow nanoplates of other noble metals, such as Au. Instead, only small nanocrystals of Au are deposited with sizes less than 20 nm on GaAs substrates (see FIG. 35B). Systemic studies reveal that the inter-diffusion coefficient between Au and GaAs is much higher than that between Ag and GaAs. The fast inter-diffusion is beneficial to the progressive nucleation process of Au nanocrystals during the reactions between Au precursors (e.g., NaAuCl$_4$) and GaAs, making it difficult to anisotropically grow the Au nanocrystals into nanoplates. On the other hand, the as-synthesized Ag nanoplates on GaAs substrate (see FIG. 35A) can be chemically converted into Au/Ag alloy ones to significantly enhance their stability in applications, such as catalysis. The success of compositional conversion is determined by the unique configuration of the Ag nanoplates/GaAs composite samples, i.e., thin layers of oxides (derived from the oxidation of GaAs) cover the surfaces of the GaAs substrates (as shown in the process flow diagram of FIG. 36). In a typical sample, the oxide layer can prevent the inter-diffusion process between Au and GaAs, eliminating the nucleation and growth of new Au nanocrystals on the GaAs substrate, when the Ag nanoplates/GaAs sample is in contact with the Au precursor (i.e., aqueous NaAuCl$_4$ solution). On the other hand, the AuCl$_4^-$ ions can spontaneously oxidize the GaAs substrate and AG nanoplates through a hole injection process and galvanic displacement reaction, respectively, at elevated temperatures because the standard reduction potential of redox pair AuCl$_4^-$/Au (0.994 V versus Standard Hydrogen Electrode, SHE) is higher than that of Ag$^+$/Ag (0.7996 V versus SHE) and those of oxides/GaAs (less than 0.3 V versus SHE).

Figure 36:
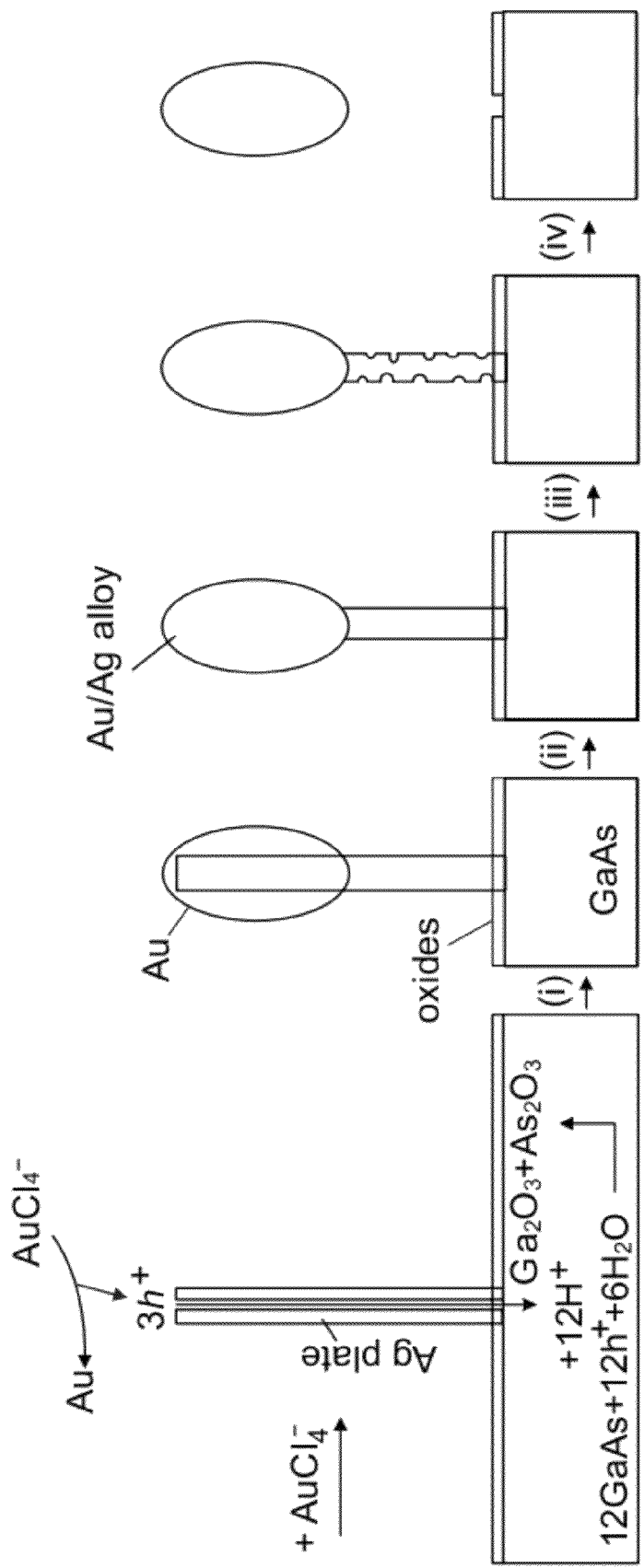
FIG. 36 is a schematic illustration of the major steps involved in the conversion of the Ag nanoplates into Au/Ag alloy ones wherein the cross-sectional projection of a nanoplate perpendicular to the basal surfaces of a nanoplate is highlighted in the drawings.

FIG. 36 illustrates the growth of Au/Ag alloy nanoplates by immersing a sample of Ag nanoplates shown in FIG. 35A in an aqueous NaAuCl$_4$ solution at elevated temperatures. Details of this method are described in Example 18. The early stage of reaction is dominated by oxidation of GaAs with AuCl$_4^-$ ions through the hole injection process because GaAs exhibits stronger reducing capability than Ag. When a AuCl$_4^-$ ion contacts a Ag nanoplate, it is reduced to a Au atom by releasing three holes, which are injected into the lattice of the GaAs substrate via the Ag nanoplate. The Au atom moves on the surface of the Ag nanoplate to eventually crystallize at a position with the highest surface energy. The continuous hole injection process leads to the deposition of a Au cap on and around the lateral surfaces (bounded by high-index facets) of the Ag nanoplate, which have higher surface energy than the basal flat {111} surfaces (step i in FIG. 36). The Au coating prevents the underneath silver from directly reacting with AuCl$_4^-$ through galvanic displacement reaction. As a matter of fact, silver and gold tend to form a nearly ideal solid solution because the homogeneous Au/Ag alloy is more thermodynamically stable than either pure Au or Ag. As a result, the overgrown Au cap quickly alloys with the underlying silver because the inter-diffusion rates between silver and gold are relatively high at high temperatures (step ii in FIG. 36). When the Au cap is thick enough, continuous reaction is dominated by galvanic displacement reaction between AuCl$_4^-$ ions and the Ag nanoplate over the uncovered stable {111} basal surfaces followed by alloying and dealloying processes. These sequential processes lead to the formation of rough Au/Ag alloy wall (step iii in FIG. 36). Further reaction leads to the collapse of the thin wall to release a Au/Ag alloy particle from the GaAs substrate (step iv in FIG. 36).

Figure 37A:
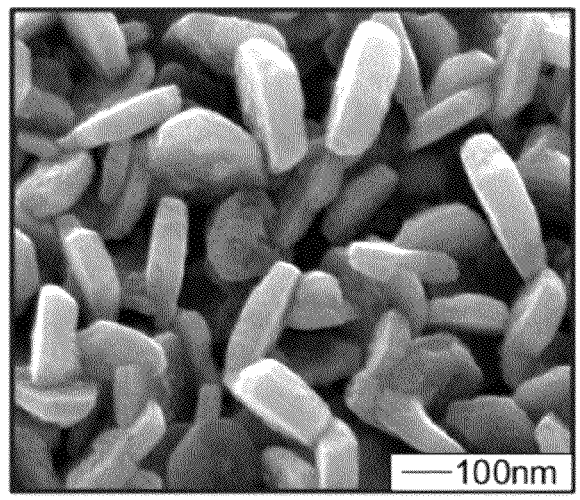
FIG. 37A-37C are SEM images of the samples obtained through reaction between the Ag nanoplates shown in FIG. 35A and 1 mM NaAuCl$_4$ solution at 90° C. for different times.
Figure 37B:
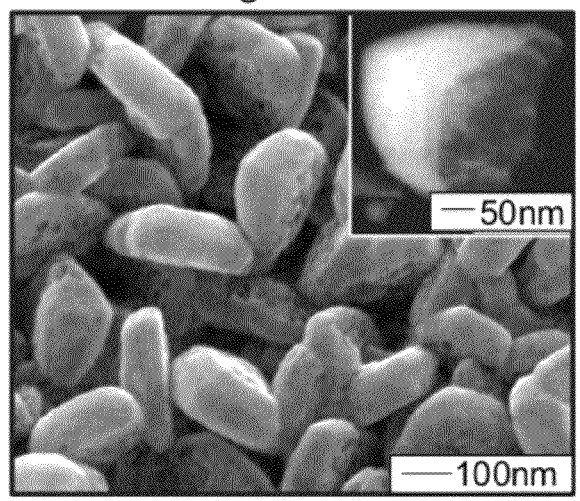
Figure 37C:
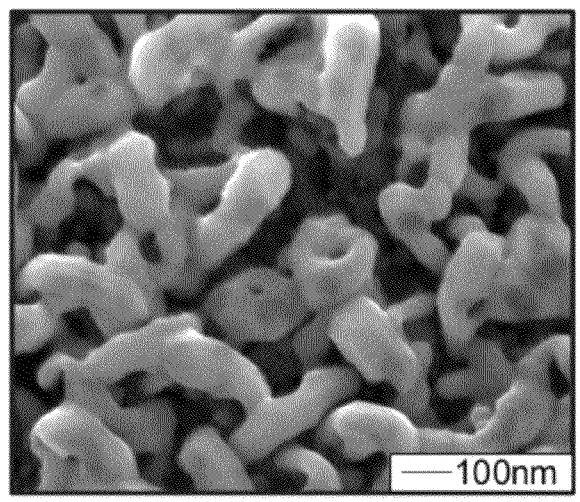

FIGS. 37A-37C show a series of SEM images of the samples synthesized through reactions between the Ag nanoplates shown in FIG. 35A and 1 mM NaAuCl$_4$ aqueous solution at ~90° C. for different times. At the beginning of the reaction, the nanoplates become thicker around their lateral edges to form tapered structures. For instance, the thickness of the nanoplates near the edges increases from 40 nm to 90 nm when the reaction lasts 30 s (see FIG. 37A). The surfaces of the nanoplates are still smooth, indicating that the AuCl$_4^-$ ions do not etch the Ag nanoplates through galvanic displacement reaction. Therefore, the gold layers are deposited through the hole injection process, in which the holes are injected into the lattices of the GaAs substrate, followed by alloying process. When the reaction continues, the central regions (bounded by {111} facets) of the tapered nanoplates become rough with appearance of many small pores (see FIG. 37B). This roughening process is ascribed to the galvanic reaction between $AuCl_4^-$ ions and Ag followed by alloying and dealloying processes. The thickness of the rough areas of the nanoplates can be further decreased to eventually collapse, resulting in the release of the thick Au/Ag alloy particles with crescent-shaped morphologies from the GaAs substrate, once the reaction lasts long enough. The sample shown in FIG. 37C is synthesized with reaction time of 90 s. The Au/Ag nanoplates shown in FIG. 37B are interesting because of their out-of-substrate orientations and alloy compositions, which are more resistive against oxidation than pure Ag. The inset of FIG. 37b presents the scanning transmission electron microscopy (STEM) image of an individual nanoplate on a Cu grid coated with a carbon film. The spatial contrast distribution confirms the tapered profile of the nanoplate. Electron dispersive X-ray spectroscopic (EDS) analysis shows that the nanoplate is composed of only Au and Ag. The absence of signals of Ga and As indicates that the inter-diffusion between GaAs and Ag/Au is prevented due to the existence of the oxide layers. Quantitative analysis over multiple spots along a line across the nanoplate shows that the compositions at these spots are similar with average values of 24.6% for Ag and 75.4% for Au. The compositions of the nanoplates can be tuned by controlling the reaction temperature and reaction time.

Figure 38A:
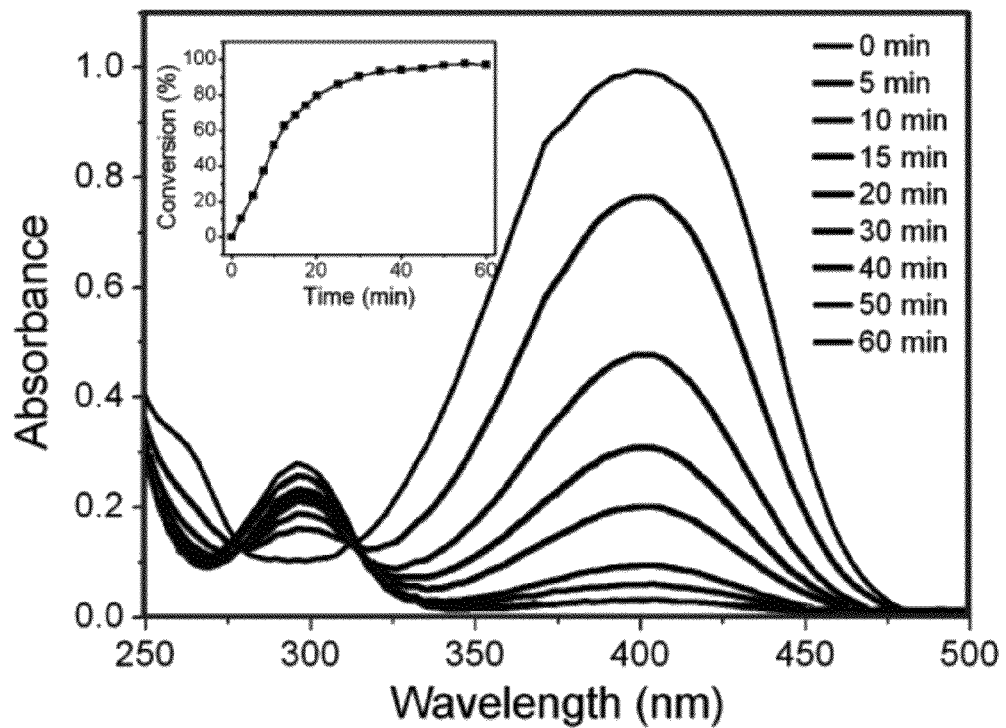
FIG. 38A shows UV-vis spectra of nitrophenol measured at different times during its reduction by NaBH$_4$ catalyzed with the Au/Ag alloy nanoplates shown in FIG. 37B; the inset shows the dependence of conversion yield of 4-nitrophenol to 4-amniophenol on the reaction time.
Figure 38B:
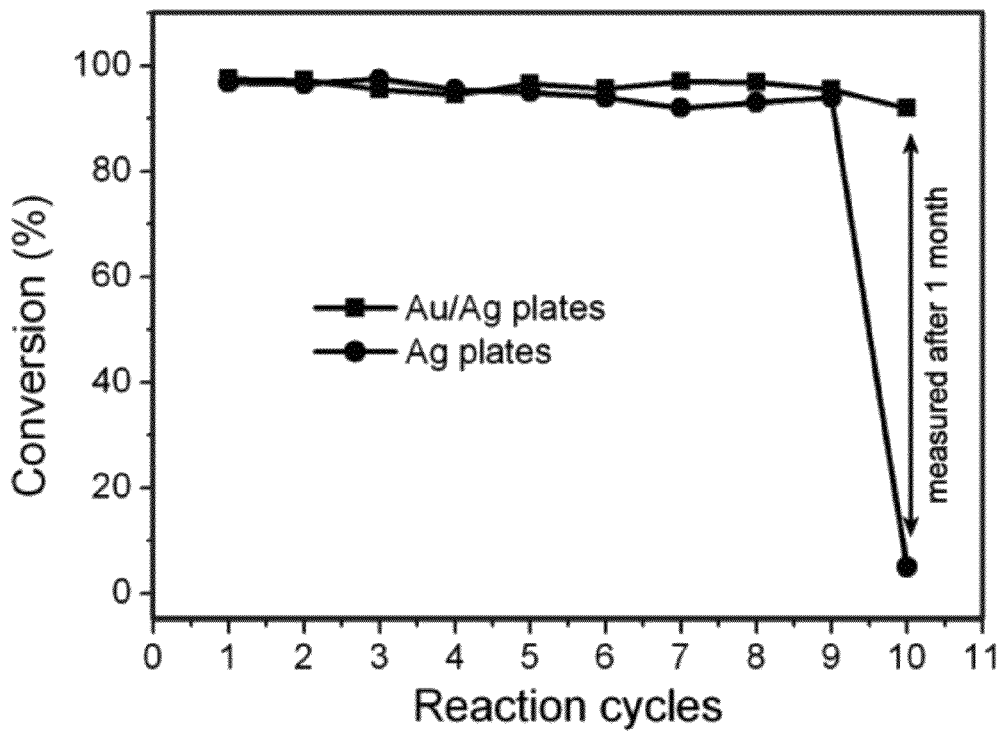
FIG. 38B shows maximum conversion yield of 4-nitrophenol in 9 successive cycles of reduction with different catalysts: (■) Au/Ag alloy nanoplates and (●) Ag nanoplates; the tenth cycle was measured after the nanoplates were stored for 1 month in ambient environment.

The as-synthesized Au/Ag alloy nanoplates inherit the out-of-substrate orientations of the original Ag nanoplates to expose their surfaces preferentially the most to the surrounding environment. The compositional change from pure Ag to Au/Ag alloy significantly enhances the chemical stability of the nanoplates when they are used in applications such as catalysis. For example, freshly synthesized Ag nanoplates on GaAs substrates exhibit good catalytic capability to accelerate the reduction of 4-nitrophenol (4-NP) with $NaBH_4$. The derived Au/Ag alloy nanoplates show the similar catalytic performance (FIG. 38A). The absorption peak at 400 nm in FIG. 38A (corresponding to the characteristic feature of 4-NP) constantly decreases and the peak at 295 nm increases with reaction time, indicating the reduction of 4-NP to 4-aminophenol (4-AP). The reduction does not occur without assistance of the metal nanoplates under the same reaction conditions. Since these nanoplates are fixed on the substrates, they can be easily recovered to catalyze additional reactions. As shown in FIG. 38B, both freshly prepared Ag nanoplates and Au/Ag alloy nanoplates can catalyze the reduction of 4-NP for many successive cycles with similar conversion yield near 100%. After the samples are stored in ambient environment for 1 month, the pure Ag nanoplates essentially lose catalytic capability due to the oxidation to silver oxide. In contrast, the Au/Ag alloy nanoplates with high concentration of Au (e.g., ~75% Au and ~25% Ag as shown in FIG. 37B) can still efficiently catalyze the reduction of 4-NP although the conversion yield slightly decreases by several percent. This obvious difference indicates that converting the Ag nanoplates into Au/Ag alloy ones significantly increases their resistance towards oxidation in ambient environment. It is found that the nanoplates made of Au/Ag alloys with Au concentrations higher than ~60% could withstand oxidation in air to remain their catalytic capability.

In conclusion, Ag nanoplates grown on GaAs substrates have been successfully converted into chemically stable nanoplates made of Au/Ag alloys. These alloy nanoplates retain the out-of-substrate orientations to expose their surfaces at the most to surrounding solutions for efficient catalysis. This synthetic strategy can be extended to prepare Pd/Ag and Pt/Ag alloy nanoplates by using appropriate precursors (e.g., $Na_2PtCl_4$ for $Pt/Ag_4$ and $Na_2PdCl_4$ for Pd/Ag) (see t FIGS. 32B and 32C). The alloy nanoplates derived from the high-quality Ag nanoplates can serve as reusable catalysts with enhanced stability and efficiency.

Example 20

Figure 39A:
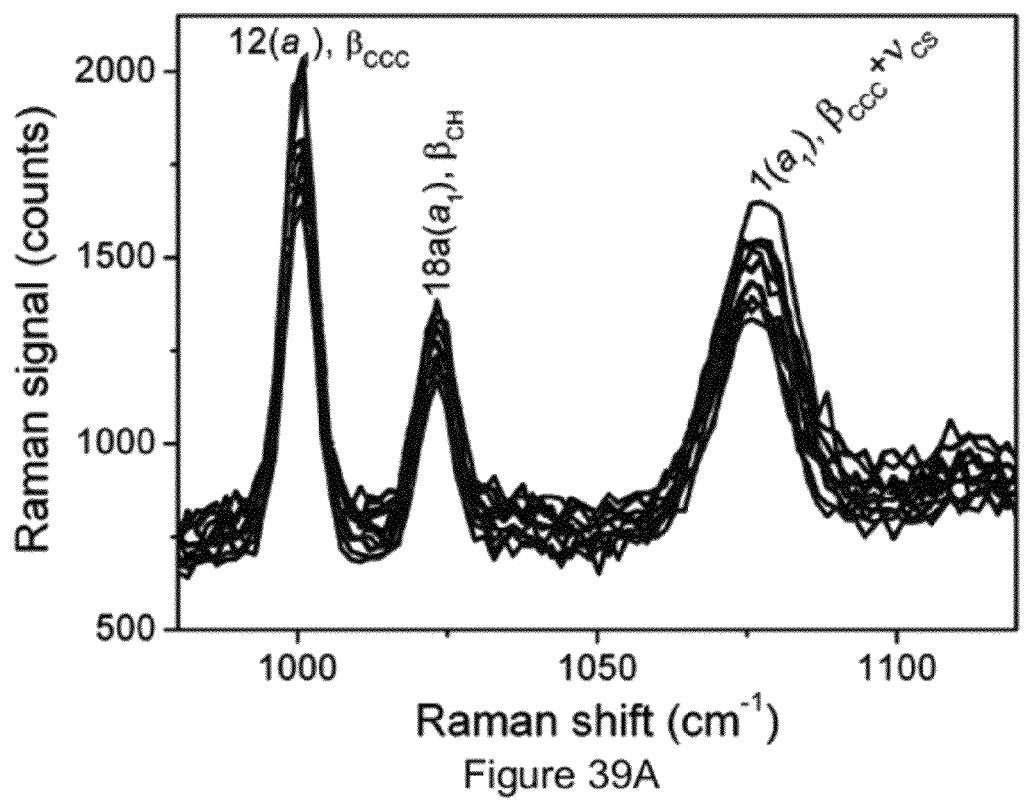
FIG. 39*a* shows Raman spectra of thiophenyl molecules self assembled on the surfaces of the Ag nanoplates shown in FIG. 33 where each spectrum was taken from a cluster of the Ag nanoplates and vibrational assignments for peaks are shown and letters are for vibrational symmetry, the γ, β and ν are out of plane, in plane and in plane stretching modes.
Figure 39B:
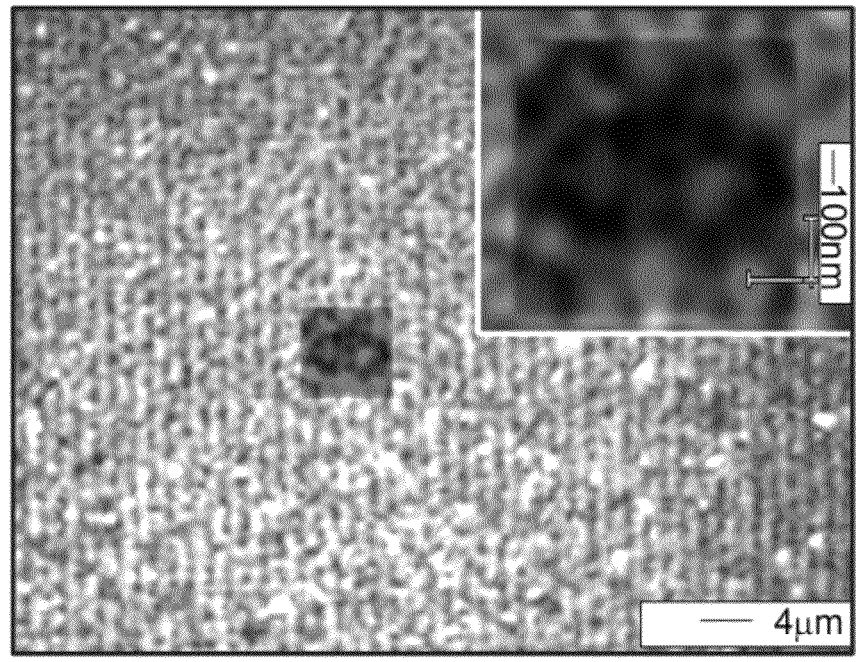
FIG. 39*b* shows an overlap of a Raman mapping image (inset figure) obtained by integrating peak area at 1000 cm$^{-1}$ on an optical image of the SERS substrate of FIG. 33 with Raman signal excited with a 514 nm laser and power density of about 1.2 nW/cm$^2$.

Nanostructures made of precious metals have very interesting optical properties because of their strong SPR. For example, the Ag nanoplates exhibit strong extinction peaks which are tunable from the visible to the near infrared (NIR) regime by controlling their dimensions. Ag nanostructures are usually a class of promising substrates for surface enhanced Raman scattering (SERS), in particular, when they have sharp edges and/or rough surfaces. Clusters of several Ag nanoplates are even better for SERS because strong coupling between individual nanoplates can produce more 'hot spots' for enhancing Raman scattering of molecules adjacent to their surfaces. FIG. 33 shows an SEM image of Ag nanoplates grown on an n-GaAs substrate coated with a patterned resist-layer. The Ag nanoplates are only deposited in the areas directly open to the $AgNO_3$ solution. Each cluster includes 3-54 Ag nanoplates, which touch each other to create more "hot spots" for SERS. FIG. 39A compares the Raman spectra (taken from different clusters of Ag nanoplates) of thiophenol molecules self-assembled on the surfaces of the Ag nanoplates shown in FIG. 33. The spectral peaks are consistent with the fingerprint bands of thiophenol molecules. Variation of Raman intensity recorded from different spots is less than 20%, indicating good uniformity of the Ag nanoplates over the substrate. By integrating the area of the peak at 1000 $cm^{-1}$ and collecting spectra over the substrate (with stage moving step of 0.4 μm), a Raman mapping is obtained as shown in FIG. 39B. The blowup image clearly shows a good match between the Raman image and the optical image (inset image). Spots with bright contrast in the optical image are covered with the Ag nanoplates, resulting in stronger Raman signals (darker gray). Areas with dark contrast in the optical image is absence of Ag nanoplates, leading to weak (or essentially no) Raman signals (dark). In addition, thiophenol molecules can also spontaneously form self-assembled monolayers on the surfaces of clean GaAs substrate when the samples are dipped into an ethanol solution of thiophenol at room temperature. Measurements at the same condition used for FIG. 39B do not show observable signals for thiophenol molecules on GaAs, further confirming the enhancement effect of the Ag nanoplates.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described to explain the principles of the present invention and its practical application to enable one skilled in the art to utilize the present invention in various embodiments and with various modifications as are suited to the particular use contemplated. The features of the embodiments described herein may be combined in all possible combinations of methods, apparatus, modules and systems.

What is claimed is:

1. A method for growing noble metal nanoplates on a semiconductor substrate to form a metal nanostructure-semiconductor composite, comprising:
   providing a semiconductor substrate having an associated semiconductor valence energy band level;
   providing a volume of an aqueous noble metal salt solution, the aqueous noble metal salt solution consisting of noble metal precursor ions in water;
   reacting the aqueous noble metal salt solution by direct contact with the semiconductor substrate to form noble metal nuclei on the semiconductor substrate and an oxide layer on the semiconductor substrate where there are not the noble metal nuclei; and
   increasing the concentration of the noble metal salt solution, and the noble metal precursor injecting holes into the semiconductor substrate via the noble metal nuclei to form a second oxide layer on the semiconductor substrate thereby thickening the oxide layer on the substrate and to reduce the noble metal precursor ions to form a plurality of noble metal nanoparticles protruding from the surface of the semiconductor substrate;
   wherein a reduction potential of a metal ion/metal pair of the noble metal precursors ions is greater than the valence band energy of the semiconductor; and
   wherein the oxide layer formed while forming the noble metal nuclei prevent further direct interaction between the noble metal precursor ions and the semiconductor substrate, which prevents forming more of the noble metal nuclei and enables controlled growth of the noble metal nuclei from the noble metal precursor ions, and thereby control formation of the nanoplates.

2. The method of claim 1 further comprising controlling a reaction time between the aqueous solution and the semiconductor by substantially stopping the reaction to obtain a desired morphology and/or size for the plurality of the nanoplates.

3. The method of claim 1 further comprising illuminating at least a portion of the semiconductor substrate with electromagnetic radiation to control the growth of the nanoplates on the substrate.

4. The method of claim 1 further including the step of causing hole carrier injection in which noble metal ions inject positive charge into the semiconductor substrate and are converted into noble metal atoms for growing noble metal nanoplates.

5. The method of claim 1 wherein the noble metal precursor is selected from the group of $AgNO_3$, $NaAuCl_4$, $HAuCl_4$, $KAuCl_4$, and a salt of a group IB element and a VIII B element.

6. The method of claim 1, further comprising a semiconductor substrate having a high-concentration of surface electrons, thereby facilitating growth of the noble metal nanoplates on the semiconductor substrate.

7. The method of claim 6, further comprises a p-type semiconductor substrate with a step of illuminating with electromagnetic energy to provide a high concentration of surface electrons, thereby facilitating growth of the noble metal nanoplates on the semiconductor substrate.

8. The method of claim 1, wherein the metal precursor is selected from the group of a Pd and Pt salt.

9. The method as defined in claim 8, wherein the metal precursor is selected from the group of $Na_2PtCl_4$ and $Na_2PdCl_4$.

10. The method of claim 9, wherein the morphology comprises one or more of a typical length of each of the plurality of nanoplates, a typical thickness of each of the plurality of nanoplates, a relative surface roughness of each of the plurality of nanoplates.

11. The method of claim 1, further comprising the step of selecting a concentration of the aqueous noble metal salt solution to obtain a desired morphology of the plurality of the nanoplates, wherein the concentration is 1 M-10M/L.

12. The method of claim 1, further including the step of performing a reaction on the semiconductor substrate with a low-concentration of surface electrons for a selected time and using a concentration of the noble metal precursor to achieve an anisotropically extended form of the nanoplates.

13. The method of claim 1, wherein the plurality of substantially pure metal nanoplates are substantially free of surfactants.

14. The method of claim 1, wherein the reaction occurs using at least one of a selected time, concentration and illuminating the semiconductor surface with electromagnetic radiation to achieve a desired morphology of the plurality of the nanoplates.

15. The method of claim 1, wherein the metal nanoplates contain both nanometer and micrometer level roughness and are superhydrophobic.

16. The method of claim 1, further comprising placing the noble metal nanoplates on the semiconductor in a photoelectrochemical cell.

17. The method of claim 1, wherein the surface is partially covered with oxides or other materials substantially nonreactive with the metal precursor, thereby forming a patterned assembly of the noble metal nanoplates in selected areas.

18. The method of claim 1 further including the step of at least one of controlling a concentration of the noble metal precursor to obtain a desired thickness in the range of 20 nm to 200 nm and controlling a concentration of the noble metal precursor to obtain a desired surface roughness of the noble metal nanoplates.

19. The method of claim 18 wherein the noble metal precursor concentration is selected from the group of less than 0.3 mol/L of the aqueous solution, thereby obtaining a rough surface and the noble metal precursor concentration is higher than 0.3 mol/L, thereby obtaining a smooth surface.

20. The method of claim 1 further including the step of controlling concentration of the noble metal precursor to obtain an anisotropically extended morphology of the noble metal nanoplates.

* * * * *